(12) United States Patent
Brailove et al.

(10) Patent No.: US 8,329,557 B2
(45) Date of Patent: Dec. 11, 2012

(54) TECHNIQUES FOR FORMING THIN FILMS BY IMPLANTATION WITH REDUCED CHANNELING

(75) Inventors: Adam Brailove, San Jose, CA (US);
Zuqin Liu, Palo Alto, CA (US);
Francois J. Henley, Aptos, CA (US);
Albert J. Lamm, Suisun City, CA (US)

(73) Assignee: Silicon Genesis Corporation, San Jose, CA (US)

( * ) Notice: Subject to any disclaimer, the term of this patent is extended or adjusted under 35 U.S.C. 154(b) by 252 days.

(21) Appl. No.: 12/778,989

(22) Filed: May 12, 2010

(65) Prior Publication Data

US 2010/0317140 A1 Dec. 16, 2010

Related U.S. Application Data

(60) Provisional application No. 61/177,953, filed on May 13, 2009.

(51) Int. Cl.
*H01L 21/30* (2006.01)
(52) U.S. Cl. .......... 438/458; 438/528; 257/E21.345
(58) Field of Classification Search .......... 438/515, 438/525, 528
See application file for complete search history.

(56) References Cited

U.S. PATENT DOCUMENTS

| | | | |
|---|---|---|---|
| 2,614,055 A | 10/1952 | Senarelens | |
| 3,117,002 A | 1/1964 | Bronson et al. | |
| 3,225,820 A | 12/1965 | Riordan | |
| 3,390,033 A | 6/1968 | Brown | |
| 3,392,069 A | 7/1968 | Merkel et al. | |
| 3,551,213 A | 12/1970 | Boyle | |
| 3,770,499 A | 11/1973 | Crowe et al. | |
| 3,786,359 A | 1/1974 | King | |
| 3,806,380 A | 4/1974 | Kitada et al. | |
| 3,832,219 A | 8/1974 | Nelson et al. | |

(Continued)

FOREIGN PATENT DOCUMENTS

DE 834363 3/1952

(Continued)

OTHER PUBLICATIONS

Adan et al., SOI as a mainstream IC technology Proceedings 1998 IEEE International SOI conference, Oct. 1998, pp. 9-12.

(Continued)

*Primary Examiner* — Chandra Chaudhari
(74) *Attorney, Agent, or Firm* — Kilpatrick Townsend & Stockton LLP

(57) ABSTRACT

Embodiments of the present invention relate to the use of a particle accelerator beam to form thin films of material from a bulk substrate. In particular embodiments, a bulk substrate having a top surface is exposed to a beam of accelerated particles. Then, a thin film of material is separated from the bulk substrate by performing a controlled cleaving process along a cleave region formed by particles implanted from the beam. To improve uniformity of depth of implantation, channeling effects are reduced by one or more techniques. In one technique, a miscut bulk substrate is subjected to the implantation, such that the lattice of the substrate is offset at an angle relative to the impinging particle beam. According to another technique, the substrate is tilted at an angle relative to the impinging particle beam. In still another technique, the substrate is subjected to a dithering motion during the implantation. These techniques may be employed alone or in combination.

27 Claims, 51 Drawing Sheets

U.S. PATENT DOCUMENTS

| | | |
|---|---|---|
| 3,900,636 A | 8/1975 | Curry et al. |
| 3,901,423 A | 8/1975 | Hillberry et al. |
| 3,915,757 A | 10/1975 | Engel |
| 3,946,334 A | 3/1976 | Yonezu |
| 3,957,107 A | 5/1976 | Altoz et al. |
| 3,964,957 A | 6/1976 | Walsk |
| 3,993,909 A | 11/1976 | Drews et al. |
| 4,006,340 A | 2/1977 | Gorinas |
| 4,039,416 A | 8/1977 | White |
| 4,053,335 A | 10/1977 | Hu |
| 4,074,139 A | 2/1978 | Pankove |
| 4,107,350 A | 8/1978 | Berg et al. |
| 4,108,751 A | 8/1978 | King |
| 4,116,751 A | 9/1978 | Zaromb |
| 4,121,334 A | 10/1978 | Wallis |
| 4,139,858 A | 2/1979 | Pankove |
| 4,170,662 A | 10/1979 | Weiss et al. |
| 4,216,906 A | 8/1980 | Olsen et al. |
| 4,237,601 A | 12/1980 | Woolhouse et al. |
| 4,244,348 A | 1/1981 | Wilkes |
| 4,252,837 A | 2/1981 | Auton |
| 4,255,208 A | 3/1981 | Deutscher et al. |
| 4,274,004 A | 6/1981 | Kanai |
| 4,342,631 A | 8/1982 | White et al. |
| 4,346,123 A | 8/1982 | Kaufmann |
| 4,361,600 A | 11/1982 | Brown |
| 4,368,083 A | 1/1983 | Bruel et al. |
| 4,375,125 A | 3/1983 | Byatt |
| 4,412,868 A | 11/1983 | Brown et al. |
| 4,452,644 A | 6/1984 | Bruel et al. |
| 4,468,309 A | 8/1984 | White |
| 4,471,003 A | 9/1984 | Cann |
| 4,486,247 A | 12/1984 | Ecer et al. |
| 4,490,190 A | 12/1984 | Speri |
| 4,495,219 A | 1/1985 | Kato et al. |
| 4,500,563 A | 2/1985 | Ellenberger et al. |
| 4,508,056 A | 4/1985 | Bruel et al. |
| 4,530,149 A | 7/1985 | Jastrzebski et al. |
| 4,536,657 A | 8/1985 | Bruel |
| 4,539,050 A | 9/1985 | Kramler et al. |
| 4,566,403 A | 1/1986 | Fournier |
| 4,567,505 A | 1/1986 | Pease et al. |
| 4,568,563 A | 2/1986 | Jackson et al. |
| 4,585,945 A | 4/1986 | Bruel et al. |
| 4,645,546 A | 2/1987 | Matsushita |
| 4,684,535 A | 8/1987 | Heinecke et al. |
| 4,704,302 A | 11/1987 | Bruel et al. |
| 4,706,377 A | 11/1987 | Shuskus |
| 4,717,683 A | 1/1988 | Parillo |
| 4,727,047 A | 2/1988 | Bozler et al. |
| 4,764,394 A | 8/1988 | Conrad |
| 4,766,086 A | 8/1988 | Ohshima et al. |
| 4,837,172 A | 6/1989 | Mizuno et al. |
| 4,846,928 A | 7/1989 | Dolins et al. |
| 4,847,792 A | 7/1989 | Barna et al. |
| 4,853,250 A | 8/1989 | Boulos et al. |
| 4,883,561 A | 11/1989 | Gmitter et al. |
| 4,887,005 A | 12/1989 | Rough et al. |
| 4,891,329 A | 1/1990 | Reismann et al. |
| 4,894,709 A | 1/1990 | Phillips et al. |
| 4,906,594 A | 3/1990 | Yoneda |
| 4,931,405 A | 6/1990 | Kamijo et al. |
| 4,948,458 A | 8/1990 | Ogle |
| 4,952,273 A | 8/1990 | Popov |
| 4,956,693 A | 9/1990 | Sawahata et al. |
| 4,960,073 A | 10/1990 | Suzuki et al. |
| 4,982,090 A | 1/1991 | Wittmaack |
| 4,983,251 A | 1/1991 | Haisma et al. |
| 4,996,077 A | 2/1991 | Moslehi et al. |
| 5,015,353 A | 5/1991 | Hubler et al. |
| 5,034,343 A | 7/1991 | Rouse et al. |
| 5,070,040 A | 12/1991 | Pankove |
| 5,082,793 A | 1/1992 | Li |
| 5,102,821 A | 4/1992 | Moslehi |
| 5,110,748 A | 5/1992 | Sarma |
| 5,133,826 A | 7/1992 | Dandl |
| 5,141,878 A | 8/1992 | Benton et al. |
| 5,162,241 A | 11/1992 | Mori et al. |
| 5,196,355 A | 3/1993 | Wittkower |
| 5,198,071 A | 3/1993 | Scudder et al. |
| 5,198,371 A | 3/1993 | Li |
| 5,202,095 A | 4/1993 | Houchin et al. |
| 5,203,960 A | 4/1993 | Dandl |
| 5,206,749 A | 4/1993 | Zavracky et al. |
| 5,213,451 A | 5/1993 | Frank |
| 5,213,986 A | 5/1993 | Pinker et al. |
| 5,234,529 A | 8/1993 | Johnson |
| 5,234,535 A | 8/1993 | Beyer et al. |
| 5,242,861 A | 9/1993 | Inaba |
| 5,250,328 A | 10/1993 | Otto |
| 5,252,178 A | 10/1993 | Moslehi |
| 5,256,562 A | 10/1993 | Vu et al. |
| 5,258,320 A | 11/1993 | Zavracky et al. |
| 5,258,325 A | 11/1993 | Spitzer et al. |
| 5,269,880 A | 12/1993 | Jolly et al. |
| 5,273,610 A | 12/1993 | Thomas, III et al. |
| 5,277,748 A | 1/1994 | Sakaguchi et al. |
| 5,303,574 A | 4/1994 | Matossian et al. |
| 5,304,509 A | 4/1994 | Sopori |
| 5,308,776 A | 5/1994 | Gotou |
| 5,317,236 A | 5/1994 | Zavracky et al. |
| 5,342,472 A | 8/1994 | Imahashi et al. |
| 5,344,524 A | 9/1994 | Sharma et al. |
| 5,354,381 A | 10/1994 | Sheng |
| 5,362,671 A | 11/1994 | Zavracky et al. |
| 5,363,603 A | 11/1994 | Miller et al. |
| 5,368,710 A | 11/1994 | Chen et al. |
| 5,370,765 A | 12/1994 | Dandl |
| 5,374,564 A | 12/1994 | Bruel |
| 5,376,560 A | 12/1994 | Aronowitz et al. |
| 5,377,031 A | 12/1994 | Vu et al. |
| 5,403,434 A | 4/1995 | Moslehi |
| 5,404,079 A | 4/1995 | Ohkuni et al. |
| 5,405,480 A | 4/1995 | Benzing et al. |
| 5,409,563 A | 4/1995 | Cathey |
| 5,411,592 A | 5/1995 | Ovshinsky et al. |
| 5,413,679 A | 5/1995 | Godbey |
| 5,424,269 A | 6/1995 | Chang et al. |
| 5,427,052 A | 6/1995 | Ohta et al. |
| 5,435,880 A | 7/1995 | Minato et al. |
| 5,438,241 A | 8/1995 | Zavracky et al. |
| 5,443,661 A | 8/1995 | Oguro et al. |
| 5,444,557 A | 8/1995 | Spitzer et al. |
| 5,459,016 A | 10/1995 | Debe et al. |
| 5,475,514 A | 12/1995 | Salerno et al. |
| 5,476,691 A | 12/1995 | Komvopoulos et al. |
| 5,480,842 A | 1/1996 | Clifton et al. |
| 5,487,785 A | 1/1996 | Horiike et al. |
| 5,494,835 A | 2/1996 | Bruel |
| 5,504,328 A | 4/1996 | Bonser |
| 5,506,176 A | 4/1996 | Takizawa |
| 5,508,207 A | 4/1996 | Horai et al. |
| 5,514,235 A | 5/1996 | Mitani et al. |
| 5,518,965 A | 5/1996 | Menigaux |
| 5,528,397 A | 6/1996 | Zavracky et al. |
| 5,539,245 A | 7/1996 | Imura et al. |
| 5,558,718 A | 9/1996 | Leung |
| 5,559,043 A | 9/1996 | Bruel |
| 5,569,620 A | 10/1996 | Linn et al. |
| 5,581,385 A | 12/1996 | Spitzer et al. |
| 5,585,304 A | 12/1996 | Hayashi et al. |
| 5,611,855 A | 3/1997 | Wijaranakula |
| 5,643,834 A | 7/1997 | Harada et al. |
| 5,653,811 A | 8/1997 | Chan |
| 5,686,980 A | 11/1997 | Hirayama et al. |
| 5,700,333 A | 12/1997 | Yamazaki et al. |
| 5,705,421 A | 1/1998 | Matsushita et al. |
| 5,710,057 A | 1/1998 | Kenney |
| 5,714,395 A | 2/1998 | Bruel |
| 5,744,852 A | 4/1998 | Linn et al. |
| 5,753,560 A | 5/1998 | Hong et al. |
| 5,755,914 A | 5/1998 | Yonehara |
| 5,763,319 A | 6/1998 | Ling et al. |
| 5,783,022 A | 7/1998 | Cha et al. |
| 5,785,039 A | 7/1998 | Kobayashi et al. |
| 5,793,913 A | 8/1998 | Kovacic |
| 5,796,140 A | 8/1998 | Tomioka |

| | | | | | | |
|---|---|---|---|---|---|---|
| 5,804,086 | A | 9/1998 | Bruel | 6,809,009 B2 | 10/2004 | Aspar et al. |
| 5,811,348 | A | 9/1998 | Matsushita et al. | 6,858,107 B2 | 2/2005 | Ghyselen et al. |
| 5,821,158 | A | 10/1998 | Shishiguchi | 6,911,376 B2 | 6/2005 | Yoo |
| 5,824,595 | A | 10/1998 | Igel et al. | 6,969,668 B1 | 11/2005 | Kang et al. |
| 5,827,751 | A | 10/1998 | Nuyen | 7,019,339 B2 | 3/2006 | Atwater |
| 5,840,590 | A | 11/1998 | Myers, Jr. et al. | 7,176,108 B2 * | 2/2007 | Cayrefourcq et al. ........ 438/458 |
| 5,841,931 | A | 11/1998 | Foresi | 7,354,815 B2 | 4/2008 | Henley |
| 5,854,123 | A | 12/1998 | Sato et al. | 2001/0019371 A1 | 9/2001 | Zavracky et al. |
| 5,863,830 | A | 1/1999 | Bruel et al. | 2001/0039095 A1 | 11/2001 | Marty |
| 5,869,387 | A | 2/1999 | Sato et al. | 2002/0174828 A1 | 11/2002 | Vasat et al. |
| 5,869,405 | A | 2/1999 | Gonzalez et al. | 2003/0077885 A1 | 4/2003 | Aspar et al. |
| 5,877,070 | A | 3/1999 | Goesele et al. | 2003/0096098 A1 | 5/2003 | Ovshinsky et al. |
| 5,882,987 | A | 3/1999 | Srikrishnan | 2003/0140844 A1 | 7/2003 | Maa et al. |
| 5,897,743 | A | 4/1999 | Fujimoto et al. | 2003/0186493 A1 | 10/2003 | Iwasaki et al. |
| 5,906,951 | A | 5/1999 | Chu et al. | 2004/0253794 A1 | 12/2004 | Faris |
| 5,909,627 | A | 6/1999 | Egloff | 2005/0118754 A1 | 6/2005 | Henley |
| 5,920,764 | A | 7/1999 | Hanson et al. | 2005/0189013 A1 | 9/2005 | Hartley |
| 5,942,050 | A | 8/1999 | Green et al. | 2006/0014366 A1 | 1/2006 | Currie |
| 5,953,622 | A | 9/1999 | Lee et al. | 2006/0030122 A1 | 2/2006 | Shimoda et al. |
| 5,966,620 | A | 10/1999 | Sakaguchi et al. | 2006/0038182 A1 | 2/2006 | Rogers et al. |
| 5,966,625 | A | 10/1999 | Zhong et al. | 2008/0092948 A1 | 4/2008 | Chan et al. |
| 5,968,279 | A | 10/1999 | MacLeish et al. | 2008/0092949 A1 | 4/2008 | Cheung et al. |
| 5,976,297 | A | 11/1999 | Oka et al. | 2008/0105301 A1 | 5/2008 | Chan et al. |
| 5,985,742 | A | 11/1999 | Henley et al. | 2009/0014069 A1 | 1/2009 | Chan |
| 5,993,677 | A | 11/1999 | Biasse et al. | 2009/0071530 A1 | 3/2009 | Chan et al. |
| 5,994,207 | A | 11/1999 | Henley et al. | 2009/0071536 A1 | 3/2009 | Chan et al. |
| 6,004,868 | A | 12/1999 | Rolfson et al. | 2009/0197367 A1 | 8/2009 | Sivaram et al. |
| 6,008,128 | A | 12/1999 | Habuka et al. | 2009/0242010 A1 | 10/2009 | Herner |
| 6,010,579 | A | 1/2000 | Henley et al. | 2009/0242031 A1 | 10/2009 | Herner et al. |
| 6,013,563 | A | 1/2000 | Henley et al. | 2009/0283669 A1 | 11/2009 | Parrill et al. |
| 6,013,567 | A | 1/2000 | Henley et al. | 2009/0293931 A1 | 12/2009 | Petti |

FOREIGN PATENT DOCUMENTS

| | | | | | | |
|---|---|---|---|---|---|---|
| 6,020,252 | A | 2/2000 | Aspar et al. | | | |
| 6,027,988 | A | 2/2000 | Cheung et al. | DE | 19753494 | 10/1998 |
| 6,033,974 | A | 3/2000 | Henley et al. | EP | 084287 | 7/1983 |
| 6,048,411 | A | 4/2000 | Henley et al. | EP | 099778 | 2/1984 |
| 6,066,915 | A | 5/2000 | Pepi | EP | 155875 | 2/1984 |
| 6,077,383 | A | 6/2000 | Laporte | EP | 112238 | 6/1984 |
| 6,083,324 | A | 7/2000 | Henley et al. | EP | 181249 | 5/1986 |
| 6,100,166 | A | 8/2000 | Sakaguchi et al. | EP | 112230 | 4/1987 |
| 6,103,599 | A | 8/2000 | Henley et al. | EP | 0296804 | 12/1988 |
| 6,107,213 | A | 8/2000 | Tayanaka | EP | 164281 | 2/1989 |
| 6,107,653 | A | 8/2000 | Fitzgerald | EP | 355913 | 2/1990 |
| 6,120,597 | A | 9/2000 | Levy et al. | EP | 379828 | 8/1990 |
| 6,143,628 | A | 11/2000 | Sato et al. | EP | 397237 | 11/1990 |
| 6,150,239 | A | 11/2000 | Goesele et al. | EP | 459177 | 12/1991 |
| 6,159,824 | A | 12/2000 | Henley et al. | EP | 504714 | 9/1992 |
| 6,162,705 | A | 12/2000 | Henley et al. | EP | 533551 | 3/1993 |
| 6,171,965 | B1 | 1/2001 | Kang | EP | 0553852 | 8/1993 |
| 6,171,982 | B1 | 1/2001 | Sato | EP | 0660140 | 6/1995 |
| 6,177,322 | B1 | 1/2001 | Derhacobian et al. | EP | 0665587 | 8/1995 |
| 6,184,111 | B1 | 2/2001 | Henley et al. | EP | 0665588 | 8/1995 |
| 6,190,998 | B1 | 2/2001 | Bruel et al. | EP | 703609 | 3/1996 |
| 6,191,007 | B1 | 2/2001 | Matsui et al. | EP | 763849 | 3/1997 |
| 6,194,327 | B1 | 2/2001 | Gonzalez et al. | EP | 793263 | 9/1997 |
| 6,204,151 | B1 | 3/2001 | Malik et al. | EP | 0807970 | 11/1997 |
| 6,214,701 | B1 | 4/2001 | Matsushita et al. | EP | 0843344 | 5/1998 |
| 6,225,192 | B1 | 5/2001 | Aspar et al. | EP | 867917 | 9/1998 |
| 6,251,754 | B1 | 6/2001 | Ohshima et al. | EP | 867921 | 9/1998 |
| 6,263,941 | B1 | 7/2001 | Bryan et al. | EP | 0905767 | 3/1999 |
| 6,274,464 | B2 | 8/2001 | Drobny et al. | EP | 961312 | 12/1999 |
| 6,284,631 | B1 | 9/2001 | Henley et al. | EP | 0971395 | 1/2000 |
| 6,287,941 | B1 | 9/2001 | Kang et al. | EP | 1085562 | 3/2001 |
| 6,290,804 | B1 | 9/2001 | Henley et al. | FR | 1558881 | 2/1969 |
| 6,291,321 | B1 | 9/2001 | Fitzgerald | FR | 2235474 | 1/1975 |
| 6,294,478 | B1 | 9/2001 | Sakaguchi et al. | FR | 2261802 | 9/1975 |
| 6,335,269 | B1 | 1/2002 | Sato | FR | 2266304 | 10/1975 |
| 6,342,436 | B1 | 1/2002 | Takizawa | FR | 2298880 | 8/1976 |
| 6,376,806 | B2 | 4/2002 | Yoo | FR | 2519437 | 7/1983 |
| 6,452,091 | B1 | 9/2002 | Nakagawa et al. | FR | 2529383 | 12/1983 |
| 6,455,397 | B1 | 9/2002 | Belford | FR | 2575601 | 7/1984 |
| 6,455,399 | B2 | 9/2002 | Malik et al. | FR | 2537768 | 8/1985 |
| 6,503,773 | B2 | 1/2003 | Fitzgerald | FR | 2560426 | 8/1985 |
| 6,513,564 | B2 | 2/2003 | Bryan et al. | FR | 2563377 | 10/1985 |
| 6,514,836 | B2 | 2/2003 | Belford | FR | 2537777 | 4/1986 |
| 6,534,381 | B2 | 3/2003 | Cheung et al. | FR | 2681472 | 3/1993 |
| 6,544,862 | B1 * | 4/2003 | Bryan ........... 438/455 | FR | 2714524 | 6/1995 |
| 6,563,152 | B2 | 5/2003 | Roberts et al. | FR | 2715501 | 7/1995 |
| 6,621,131 | B2 | 9/2003 | Murthy et al. | FR | 2715502 | 7/1995 |
| 6,723,661 | B2 | 4/2004 | Fitzgerald | | | |

| | | |
|---|---|---|
| FR | 2715503 | 7/1995 |
| FR | 2720189 | 11/1995 |
| FR | 2725074 | 3/1996 |
| GB | 2211991 | 7/1989 |
| GB | 2231197 | 11/1990 |
| JP | 53-104156 | 9/1978 |
| JP | 58-030145 | 2/1983 |
| JP | 58-144475 | 8/1983 |
| JP | 59-046750 | 3/1984 |
| JP | 59-054217 | 3/1984 |
| JP | 59-114744 | 7/1984 |
| JP | 59-139539 | 8/1984 |
| JP | 59-193904 | 11/1984 |
| JP | 60-207237 | 10/1985 |
| JP | 60-235434 | 11/1985 |
| JP | 61-125012 | 6/1986 |
| JP | 3-109731 | 5/1991 |
| JP | 3-132055 | 6/1991 |
| JP | 3-265156 | 11/1991 |
| JP | 4-076503 | 3/1992 |
| JP | 4-246594 | 9/1992 |
| JP | 4-298023 | 10/1992 |
| JP | 5-211128 | 8/1993 |
| JP | 5-218053 | 8/1993 |
| JP | 7-164728 | 6/1995 |
| JP | 7-215800 | 8/1995 |
| JP | 7-254690 | 10/1995 |
| JP | 7-263291 | 10/1995 |
| JP | 8-097389 | 4/1996 |
| JP | 10-200080 | 7/1998 |
| JP | 10-275905 | 10/1998 |
| JP | 11-045840 | 2/1999 |
| JP | 2901031 | 6/1999 |
| JP | 2910001 | 6/1999 |
| JP | 2000-94317 | 4/2000 |
| SU | 3719121/31-25 | 12/1983 |
| WO | WO 9510718 | 4/1995 |
| WO | WO 9520824 | 8/1995 |
| WO | WO 9531825 | 11/1995 |
| WO | WO 9935674 | 7/1999 |
| WO | WO 0063965 | 10/2000 |
| WO | WO 0154175 | 7/2001 |

OTHER PUBLICATIONS

Alles et al., Thin Film Silicon on Insulator: An Enabling Technology, Semiconductor International, pp. 67-72 (1997).
Auberton-Herve, "Sol: Materials to Systems", International Electron Devices Meeting, 1996, San Francisco, CA USA, Dec. 8-11, 1996, New York, NY, USA, IEEE, US, Dec. 8, 1996, pp. 3-10.
Basta, Ion-eam Implantation, High Technology (1985).
Belford et al., Perfermance-Augmented CMOS using Back-end Uni Axial Strain 2002 Device Research Conference, Santa Barbara, CA.
Brendel, A novel Process for Ultrathin Monocrystalline Silicon Solar Cells on Glass, 14th European Photovoltaic Solar Energy Conference Barcelona, Spain, Jun. 30-Jul. 4, 1997.
Burggraff, Advanced Plasma Source: What's Working?, Semiconductor Inernational, pp. 56-59 (May 1994).
Carter et al., "The Collection of IONS Implanted in Semiconductors III. Range distributions Derived from Collection and Sputter-Etch Curves,"Radiation Effects, vol. 16, pp. 107-114 (1972).
Cassidy, Ion Implanatation Process Toughens Metalworking Tools, Modern Metals, pp. 65-67 (1984).
Centura EPI Epitaxial Deposition Chamber Specifications Brochure, Applied Materials, Mar. 1994.
Cheung, Plasma Immersion Ion Implantation for Semiconductor Processing, Material Chemistry and Physics, 46(2-3): 132-139 (1996).
Cho et al., "Vapor Etching of Silicon Substrates with HCl Gas" Journal of the Korea Institute of Electronic Engineering, Apr. 25, 1984, pp. 41-45, vol. 21, No. 5.
Choyke et al., A Comparative Study of Near-Surface effects Due to Very High Fluence H+ Implantation in Single Crystal FZ, CZ, and Web SI, Mat. Res. Soc. Symp. Proc., 27:359-364 (1984).
Choyke et al., Implanted Hydrogen effects at High Concentrations in Model Low Z Shielding Materials, J. Nuc. Mtrls., 122-23:1585-86 (1984).

Choyke et al., Mechanical Response of Single Crystal Si to Very High Fluence H+ Implantation, Nuc., Instr. Metho., 209-210:407-412 (1983).
Chuang et al., Desgin Considerations of soi Digital CMOS VLSI, Proceedings 1998 IEEE International SOI Conference, Oct. 1998, pp. 5-8.
Chu et al., Plasma Immersion Ion Implantation—A Fledgling Technique for Semiconductor Processing, Materials Science and Engineering Reports: A Review Journal, R17(6-7): 207-280 (1996).
Chu et al., Recent Applications of Plasma Immersion Ion Implantation, Semiconductor International, pp. 165-172 (1996).
Chu, Synthesis of SOI Materials Using Plasma Immersion Ion Implantation, 1997 Mat. Res. Soc. Symp. Proc.,438:333-343 (1997).
Comita et al., Low Temperature SI and SIGe Epitaxy for sub 01.μm Technology, AMAT Conference Paper, Mar. 10, 2003.
Communication pursuant to Article 96(2) EPC of EP Application No. 98924756.4-1528, date of mailing Sep. 21, 2007, 7 pages total.
Corbett et al., Embrittlement of Materials: Si(H) as a Model System, J. Nuc. Mtrls., 169: 179-184.
Deegan et al., Wavy and rough cracks in silicon. Center for Nonlinear Dynamics and Department of Physics, The University of Texas at Austin, Austin, Texas 78712, USA, Phys. Rev. E 67, 066209 (2003) [7 pages].
Diop et al., Reducing Yield Impact at Ion Implant Process due to Particles using In Situ Particle Measurement at Sub 0.13u Geometries, ISSM 2005, IEEE International Symposium on Semiconductor Manufacturing, Sep. 13-15, 2005, pp. 381-385.
English Translation of Japanese Office Action for Application No. 10-549371, date of mailing Apr. 22, 2009, 3 pages total.
EPI Centura, Systems Specifications Brochure, Applied Materials, Oct. 1996.
European Patent Search Report for European Application No. 07016247.4, dated Apr. 24, 2008, 8 pages total.
European Patent Search Report for European Application No. 08153348.1, dated Jun. 3, 2008, 8 pages total.
Feijo et al., Pre stressing of Bonded Wafers, Proceedings of the First International Symposium on Semiconductor Wafer Bonding Science, Technology and Applications (Electrochemical Society, New York, 1992, v. pp. 230-238.
GE et al., Process-Strained Si (PSS) CMOS Technology Featuring 3D Strain Engineering, IEEE International Electron Devices Meeting, Washington, DC, Dec. 2003.
Grovernor, C.R.M., Microelectric Maerials (1989), pp. 73-75.
Habuka et al., Change in Microroughness of a Silicon Surface during in Situ Cleaning Using HF and HCL Gases, Journal of the Electrochemical Society, Electrochemical Society, Manchester, NY, v. 145, No. 12, Dec. 1998, pp. 4264-4271.
Hobart et al., Fabrication of SOI Substrates with Ultra-Thin Si Layers Electronics Letters, IEE Stevenage, GB, vol. 34, No. 12, Jun. 11, 1998, pp. 1265-1267.
Hobart et al., "Ultra-Cut: A Simple Technique for the Fabrication of SOI Substrates with Ultra-Thin (>5 nm) Silicon Films," IEEE International SOI Conference, 1998. Proceedings, Stuart, FL., USA, Oct. 5-8, 1998, New York, NY, USA, IEEE, US, Oct. 5, 1998, pp. 145-146.
Hulett et al., Ion Nitriding and Ion Implantation: A Comparison, Metal Progress, pp. 18-21 (1985).
I.B.M., Technical Disclosure Belletin, vol. 29: No. 3, p. 1416 (Aug. 1986).
International Preliminary Examination Report (Notification of Transmittal) of PCT Application No. PCT/US98/09567, date of mailing Mar. 16, 1999, 4 pages total.
International Search Report of PCT Application No. PCT/US98/09567, date of mailing Sep. 29, 1998, 4 pages total.
International Search Report and Written Opinion of PCT Application No. PCT/US07/780233, date of mailing Jul. 25, 2008, 13 pages total.
IQE'S Smooth Approach Increases Carrier Mobilities, News, www.compoundsemiconductor.net, Dec. 2004.
Johnson et al., Hydrogen-Induced Platelets in Silicon: Separation of Nucleation and Growth, Mtrls. Sci. Forum, 83-87:33-38 (1992).
Krivokapic et al., "Strain Relaxation in Narrow Width Strained Silicon Devices with Poly and Metal Gates", Electrochemical Society Proceedings vol. 2004-07, pp. 459-469, Pennington, New Jersey USA (2004).

Lawn, Fracture of Brittle Solids, Second Edition, NIST Fellow, Cambridge University Press, pp. 1-13.

Lee et al., A Novel Pattern Transfer Process for Bonded SOI Giga-bit DRAMS, 1996 IEEE Int'l. SOI Conference Proceedings, IEEE Electron Devices Society (1996).

Lee et al., Strained Silicon Thin-Film Transistors Fabricated on Glass, Appl. Phys. Lett 86, 103504 (2005).

Li, Novel Semiconductor Substrate Formed by Hydrogen Ion Implantation into Silicon, Appl. Phys. Lett., 55(21):2223-2224 (1989).

Lu et al., SOI Material Technology Using Plaxma Immersion Ion Implantation, Proceedings 1996 IEEE International SOI Conference (Oct. 1996).

Mahajan et al., Principles of Growth and Processing Semiconductors, WCB McGraw-Hill, cahpter 6, pp. 262-269. (1999).

Mantl et al. Enhanced Strain Relaxation of Epitaxial SiGe-Layers on Si(100) Improved by Hydrogen Implantation, Nuclear Instruments and Methods in Physics Research Section B, Jan. 1999, v. 147, Issue 1-4, p. 29-34.

Matsuda et al., Large Diameter Ion Beam Implantation System, Nuclear Instruments and Methods, B21:314-316 (1987).

Merriam Webster's Collegiate Dictionary, 10th Ed., p. 388.

Milnes et al., Peeled Film Technology for Solar Cells, pp. 338-341. (1975).

Moreau, Semiconductor Lithography, Principles, Practices, and Materials, Plenum Press (1988).

Moriceau et al., Hydrogen Annealing Treatment Used to Obtain High Quality SOI Surfaces, Proceedings of 1998 IEEE Int. SOI Conference, pp. 37-38 from conference held Oct. 5-8, 1998.

Morrison et al., Deposition of Micro-Crystalline Silicon using a Graphite Filament in the Hot Wire CVD Technique, J. Vac. Sci. Technol A19 (6), Nov./Dec. 2001, p. 2817.

Mukashev et al., Hydrogen Implantation into Silicon: Infra-Red Absorption Spectra and Electrical Properties, Institute of High Energy Physics, Academiy of Sciences of the Kazakh SSR Alma-Ata 1; 91, 509 (1985).

Onojima et al., Lattice Relaxation Process of AlN Growth on Atomically Flat 6H—SIC Substrate in Melecular Beam Epitaxy, Journal of Crystal Growth, North-Holland Publishing Co., Amsterdam, NL, v. 2370239, Apr. 2002, pp. 1012-1016.

Oshima et al., Defects in Si Irradiated with D-T neutrons, D and He Ions, J. Nuc. Mtrls., 179-181:947-950 (1991).

Picraux et al., Ion Implantation of Surfaces, Scientific American, 252(3):102-113 (1985).

Renier et al., A New Low-Energy Ion Implanter for Bombardment of Cylindrical Surfaces, Vacuum, 35(12):577-578 (1985).

Saenger et al., Amorphization/templated recrystallization Method for Changing the Orientation of Single-Crystal Silicon: An Alternative Approach to Hybrid Orientation Substrates, Appl. Phys. Lett. 87, 221911, 2005.

Sato et al., Suppression of Si Etching During Hydrogen Annealing of Silicon-on-Insulator, Proceedings of 1998 IEEE Int. SOI Conference, pp. 17-18 from conference held Oct. 5-8, 1998.

Sherman et al., Energy Considerations in Crack Deflection Phenomenon in Single Crystal Silicon, International Journal of Fracture, vol. 140, Nos. 1-4, 2006, pp. 125-140(16).

Sioshansi, Ion Beam Modification of Materials for Industry, Thin Solid Film, 118:61-61 (1984).

Smith, Thin film Deposition, McGraw-Hill Inc., pp. 185-196, 278-293. (1995).

Sze, VLSI Technology, 2nd Edition, pp. 9-101, (1988).

Tate et al., Defect Reduction of Bonded SOI Wafers by Post Anneal Process in H/sub 2/Ambient, Proceedings of 1998 IEEE Int. SOI Conference, pp. 141-142 from conference held Oct. 5-8, 1998.

Thompson, Strained Silicon MOSFETs: The Next Material Change to Extend Moore's Law, University of Florida, Spring MRS 2004.

Tong et al., A Smarter-cut approach to low temperature silicon layer transfer, Appl. Phys. Lett., 72(1): 49-51 (1998).

Tong et al., Semiconductor Wafer Bonding: Science and Technology, John Wiley & Sons, Inc., pp. 152-171 (1999).

U.S. Dept. of Energy, The Fusion Connection, Plasma Coating. (1985).

Veldkamp et al., Binary Optics, Scientific American, pp. 50-55 (May 1992).

Weldon et al., on the Mechanism of the Hydrogen-Induced Exfoliation of Silicon, J. Vac. Science Tech. B, 15(4), Jul./Aug. 1997.

Wolf et al., Silicon Processing for the VLSI Era vol. 1—Process Technology, pp. 547-549, 1986 by Lattice Press, Sunset Beach, California, ISBN 0-961672-3-7, Reprinted with corrections Jun. 1987.

Wolf, Silicon Processing for the VLSI Era vol. 2, pp. 66-79, Lattice Press (1990).

Wu et al., From Incident Laser Pulse to Residual Stress: A Complete and Self-closed Model for Laser Shock Peening, Feb. 2007. Journal of Manufacturing Science & Engineering, vol. 129, pp. 117-125.

Wo et al., Two dimensional hydrodynamic simulation of high pressures induced by high power nanosecond laser-matter interactions under water, Journal of Applied Physics, vol. 101, Issue 10, pp. 103514-103514-8 (2007).

Yaguchi et al., Strain Relaxation in MBE-Grown SI1-SGEX/SU (100) Heterostructures by Annealing, Japanese Journal of Applied Physics, Tokyo, JP, v. 30, No. 8B Part 2, Aug. 1991, pp. L1450-L1453.

Yamada et al., Thermal Damage of Silicon Wafer in Thermal Cleaving Process With Pusled Laser and CW Laser, Laser-based Micropackaging, edited by Friedrich G. Bachmann, Willem Hoving, Yongfeng Lu, Kunihiko Washio, Proc. pf SPIE vol. 6107, 61070H, (2006).

Yang et al., High Performance CMOS Fabricated on Hybrid Substrate with Different Crystal Orientations, IEDM Tech. Dig., 2003, pp. 453-456.

Yang et al., On the Integration of CMOS with Hybrid Crystal Orientations, 2004 Symposium on VLSI Technology Digest of Technical Papers, 2004.

Yun et al., Study on the Etching Reaction of Silicon with Carbon Tetrafluoride in Electron Cyclotron Resonance Plasma Etching System, Journal of the Korean Institute of Chemical Engineers, Jun. 1993, pp. 255-262, Hwahak Konghak vol. 32, No. 3.

Zhang et al., Microscale Laser Shock Peening of Thin Films, Part 1: Experiment, Modeling and Simulation, vol. 126, No. 1, Feb. 2004, pp. 10-17.

Zheng et al., Orientation dependence of blistering in H-implanted Si, Department of Electrical and Computer Engineering, University of California, San Diego, La Jolla, California 92093-0407, J. Appl. Phys. 89, 2972 (2001).

\* cited by examiner

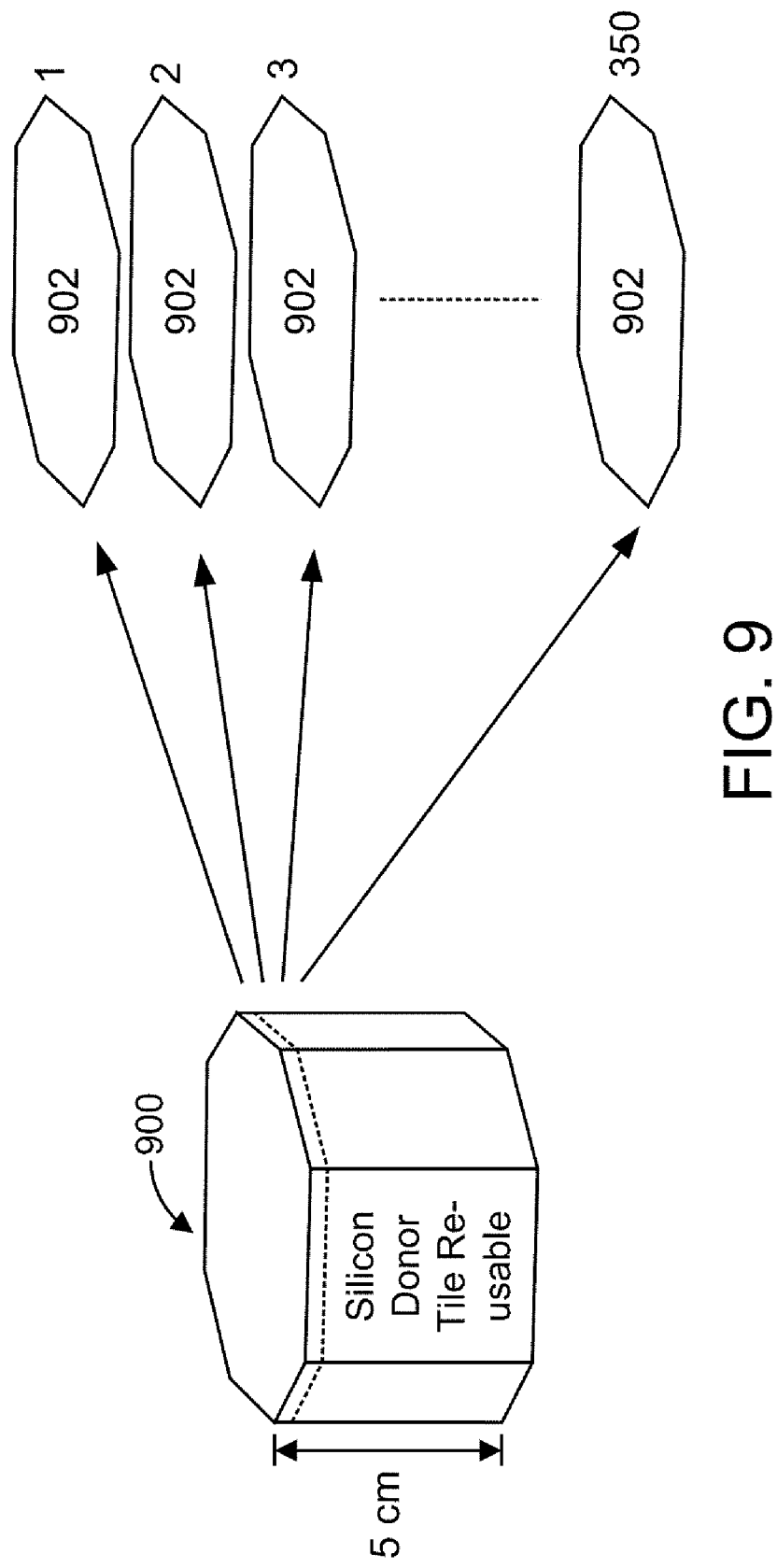

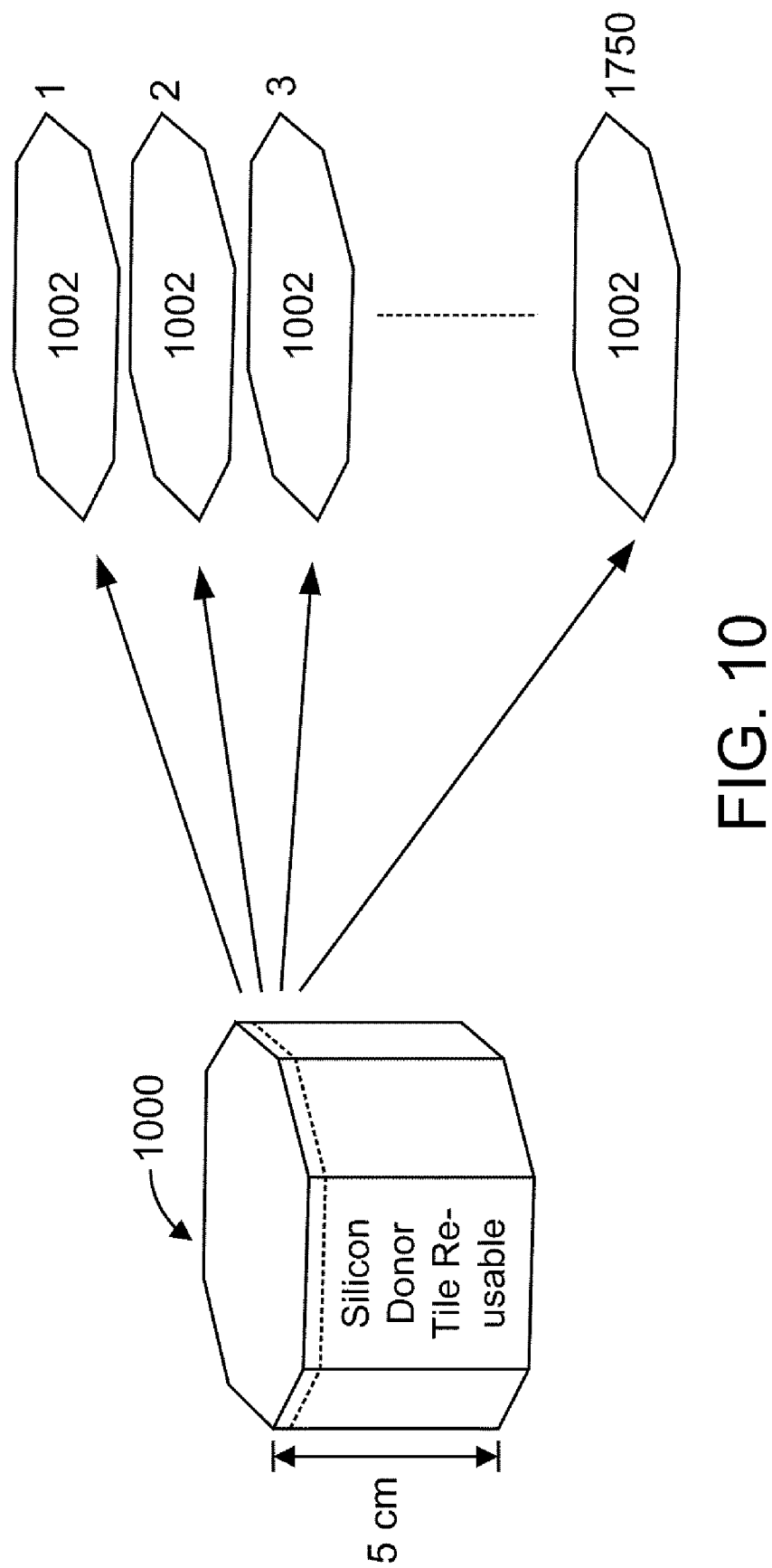

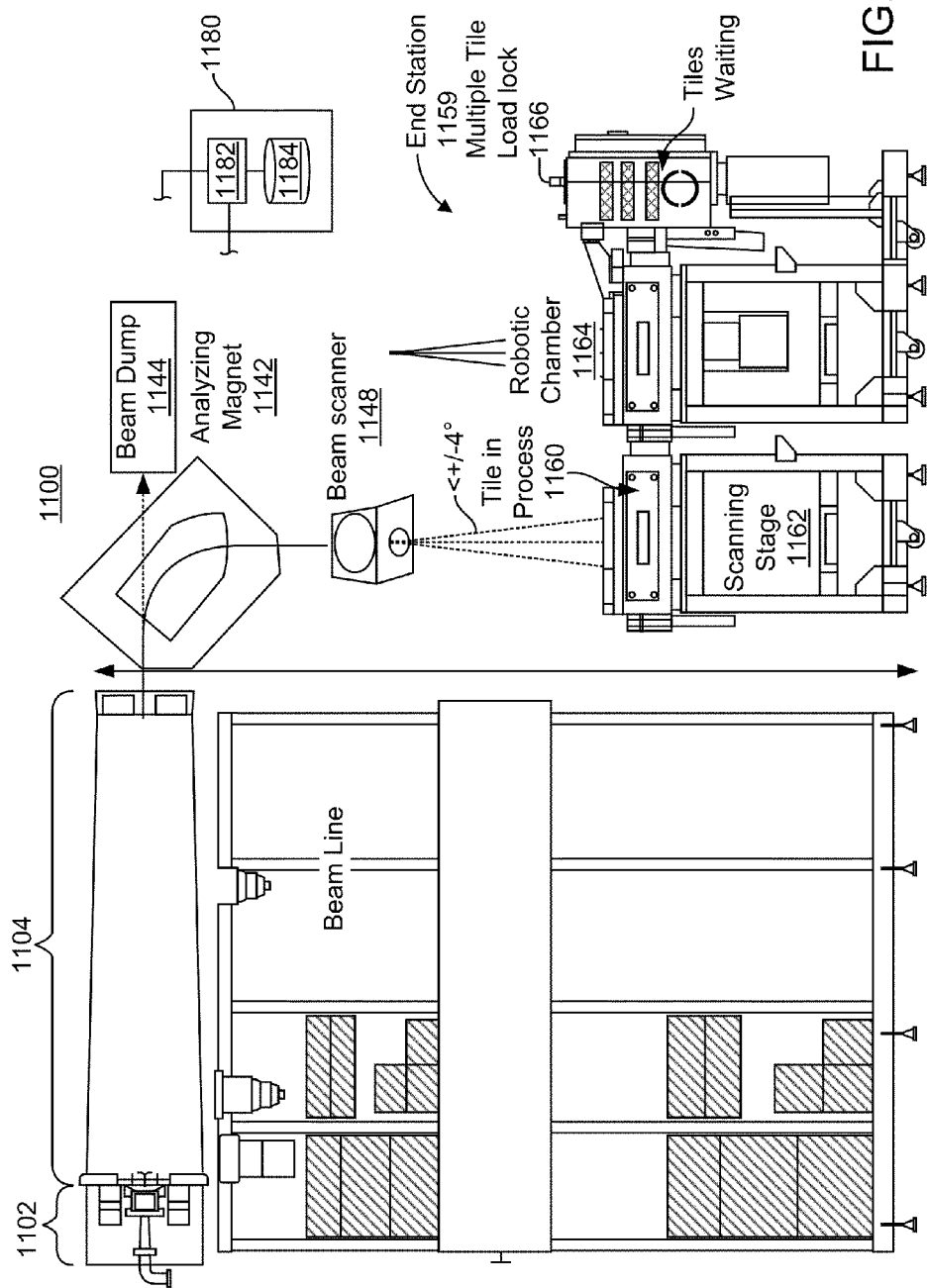

Tile side view

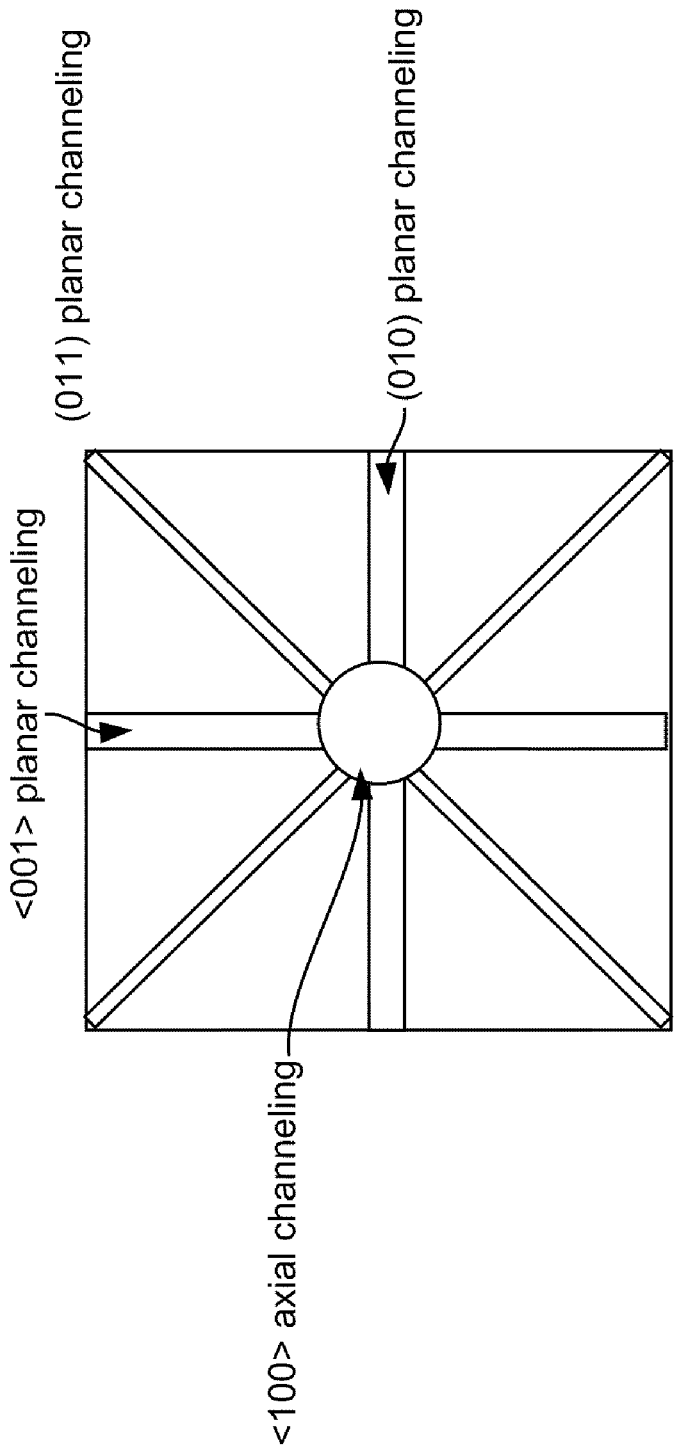

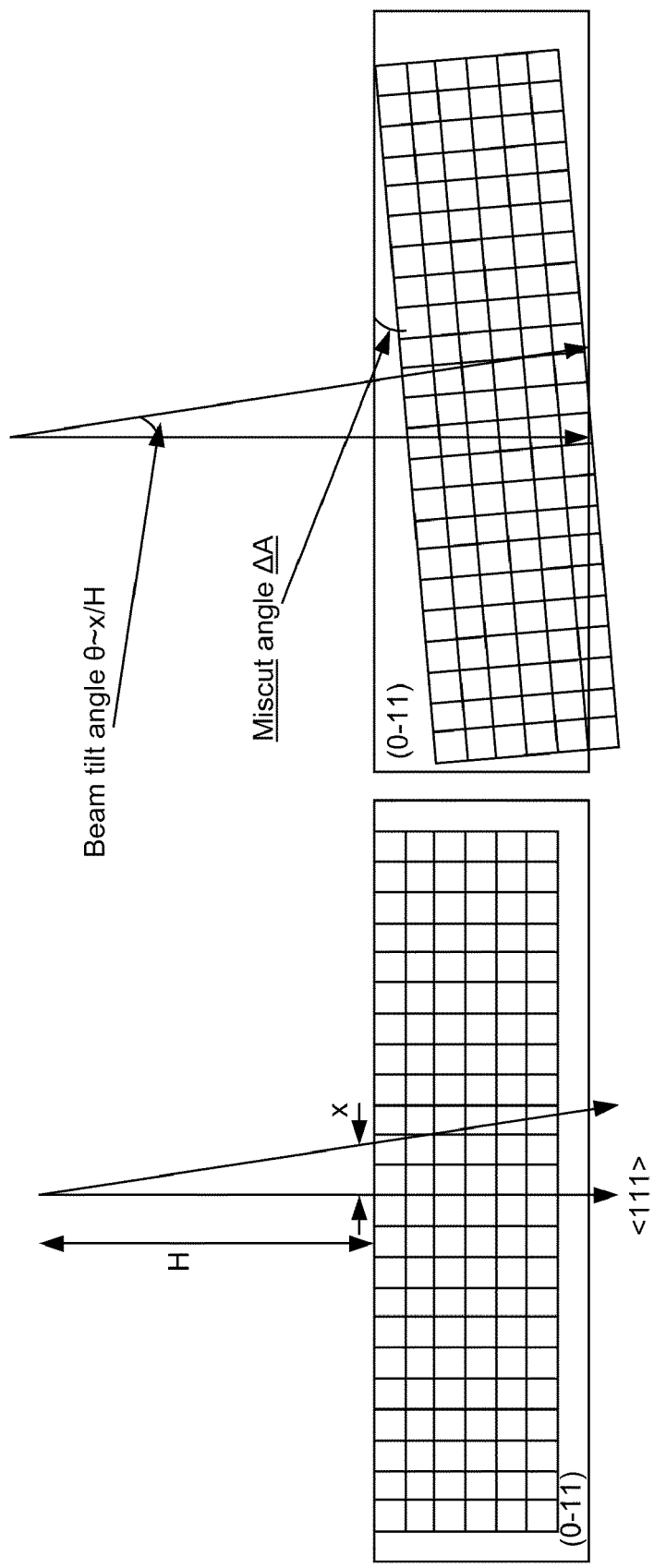

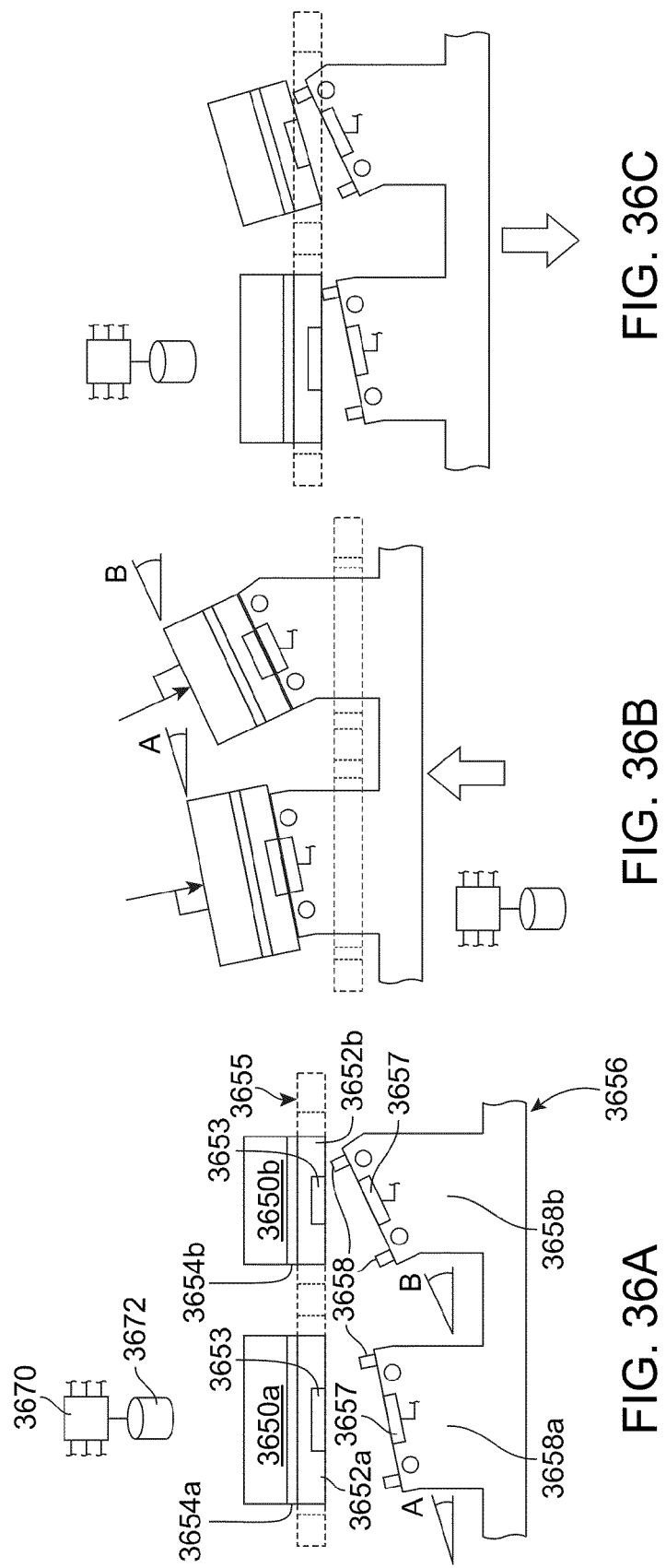

TECHNIQUES FOR FORMING THIN FILMS BY IMPLANTATION WITH REDUCED CHANNELING

CROSS-REFERENCES TO RELATED APPLICATIONS

The instant nonprovisional patent application claims priority to U.S. Provisional Patent Application No. 61/177,953, filed May 13, 2009 and incorporated by reference in its entirety herein for all purposes.

BACKGROUND OF THE INVENTION

The present invention relates generally to technique including a method and a structure for forming substrates using a layer transfer technique. More particularly, the present method and system provides a method and system using a linear accelerator process for the manufacture of thick free standing semiconductor films for a variety of applications including photovoltaic cells. But it will be recognized that the invention has a wider range of applicability; it can also be applied to other types of applications such as for three-dimensional packaging of integrated semiconductor devices, photonic or optoelectronic devices, piezoelectronic devices, flat panel displays, microelectromechanical systems ("MEMS"), nano-technology structures, sensors, actuators, integrated circuits, biological and biomedical devices, and the like.

Alternative embodiments in accordance with the present invention relate generally to techniques including methods and apparatuses for cleaving free standing films from material in bulk form, such as a single crystal silicon ingot. Such free standing films are useful as a photovoltaic material such as a solar cell. But, it will be recognized that embodiments of the invention have a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

From the beginning of time, human beings have relied upon the "sun" to derive almost all useful forms of energy. Such energy comes from petroleum, radiant, wood, and various forms of thermal energy. As merely an example, human beings have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon (i.e. polycrystalline silicon) and/or single crystal silicon materials. These materials are often difficult to manufacture. Polysilicon cells are often formed by manufacturing polysilicon plates. Although these plates may be formed effectively in a cost effective manner, they do not possess optimum properties for highly effective solar cells. In particular, polysilicon plates do not exhibit the highest possible efficiency in capturing solar energy and converting the captured solar energy into usable electrical power.

By contrast, single crystal silicon (c-Si) has suitable properties for high grade solar cells. Such single crystal silicon is, however, expensive to manufacture and is also difficult to use for solar applications in an efficient and cost effective manner.

Generally, thin-film solar cells are less expensive by using less silicon material but their amorphous or polycrystalline structure are less efficient than the more expensive bulk silicon cells made from single-crystal silicon substrates. These and other limitations can be found throughout the present specification and more particularly below.

Additionally, both polysilicon and single-crystal silicon materials suffer from material losses during conventional manufacturing called "kerf loss", where the sawing process eliminates as much as 40% and even up to 60% of the starting material from a cast or grown boule and singulate the material into a wafer form factor. This is a highly inefficient method of preparing thin polysilicon or single-crystal silicon plates for solar cell use.

In particular, conventional techniques for manufacturing single crystal silicon substrates for incorporation into solar cells, typically involves the physical separation of thin single crystal silicon layers from a single crystal silicon ingot originally grown. One example of such a conventional manufacturing technique is inner diameter (ID) sawing.

The ID sawing technique employs a circular saw having a blade located on its inner diameter. The ingot is pushed through the center of the saw until a desired wafer thickness is on the other side of the saw. With the saw rotating, the saw is then raised or lowered to allow the blade to slice through the ingot. The ID sawing method offers a number of possible disadvantages. One is that the saw must be of minimum thickness to be sufficiently strong to withstand the stress of the sawing action. However, an amount of silicon material corresponding to this saw thickness (the kerf) is lost by this cutting. Use of even the thinnest saw blade that can reliably be used to saw the ingot, may result in losses of expensive, pure single crystal silicon to the kerf. For example, a typical saw blade kerf has a width of 300 µm, where an individual sliced wafer may have a width of only 800 µm. Use of the conventional wafer sawing technique can thus result in kerf losses of expensive, pure starting material amounting to as high as 60% of the entire ingot. Another disadvantage of the conventional ID sawing technique is that slices can only be separated one at a time, thus limiting throughput and elevating cost.

Partly in response to the limited throughput of sawing, the alternative conventional technique of wire sawing has been developed. In wire sawing, a network of rapidly moving parallel wires is provided. The side of an ingot is then contacted with the moving wires in an environment including oil and abrasives, resulting in simultaneous slicing of the wafer into a plurality of wafers. The advantages of this technique over ID sawing includes parallel sawing of the boule and producing thinner wafers of 180-250 um with a more modest 190-250 um kerf loss. While effective, conventional wire sawing also offers disadvantages, in particular a still significant kerf loss of about 50% attributable to the thickness of the wire, and possible contamination by exposure of the substrate to the oil and abrasives.

From the above, it is seen that techniques for forming suitable substrate materials of high quality and low cost are highly desired. Cost-effective and efficient techniques for the manufacture of single crystal silicon substrates for incorporation into solar cells, are also desirable.

BRIEF SUMMARY OF THE INVENTION

Embodiments of the present invention relate to the use of a particle accelerator beam to form thin films of material from a bulk substrate. In particular embodiments, a bulk substrate having a top surface is exposed to a beam of accelerated particles. Then, a thin film or wafer of material is separated from the bulk substrate by performing a controlled cleaving process along a cleave region formed by particles implanted from the beam. To improve uniformity of depth of implantation, channeling effects may be reduced by one or more techniques employed alone or in combination. In one technique, a miscut bulk substrate is subjected to the implantation, such that the lattice of the substrate is offset at an angle relative to the impinging particle beam. According to another technique, the substrate is tilted at a fixed angle relative to the impinging particle beam. In still another technique, the substrate is subjected to a dithering motion during the implantation.

Depending upon the embodiment, one or more of benefits may be achieved. These benefits may be described throughout the present specification and more particularly below.

BRIEF DESCRIPTION OF THE DRAWINGS

FIG. 9 shows a simplified schematic view of the formation of a plurality of free standing films of semiconductor material in accordance with an embodiment of the present invention.

FIG. 10 shows a simplified schematic view of the formation of a plurality of free standing films of semiconductor material in accordance with another embodiment of the present invention.

FIG. 11 is a simplified schematic diagram illustrating components of an embodiment of an apparatus for performing implantation according to the present invention.

FIG. 19 shows expected channeling for a wafer having a (100) orientation.

FIG. 20A is a simplified view illustrating the cross-section of the (0-11) plane of (111) substrate without miscut. FIG. 20B is a simplified view illustrating the cross-section of the (0-11) substrate that is miscut.

FIGS. 36A-C show simplified cross sectional views of the kinematic engagement and disengagement between a platen and a plurality of pedestal-supported substrates.

DETAILED DESCRIPTION OF THE INVENTION

Figure 1:
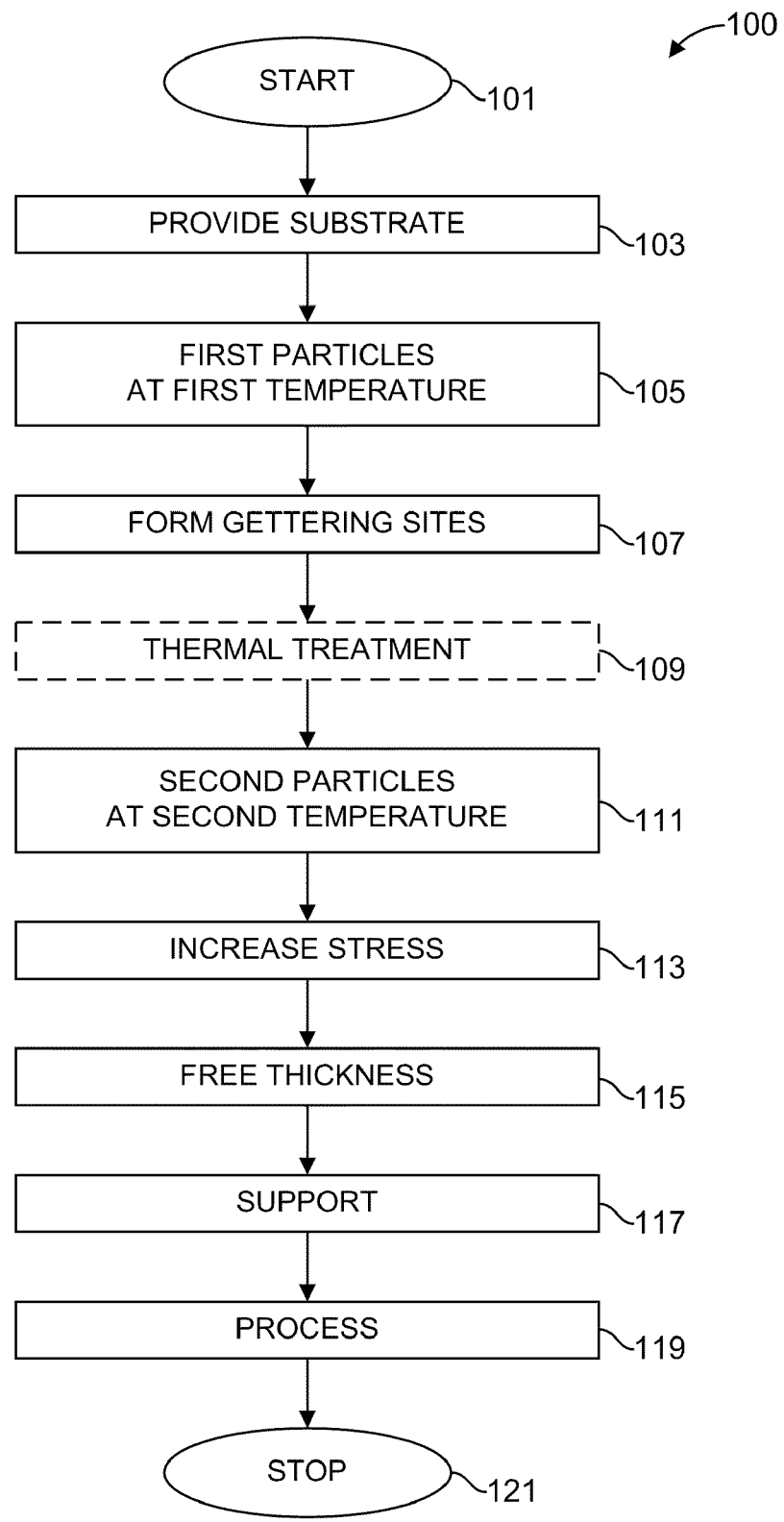
FIG. 1 is a simplified process flow illustrating a method of forming substrates using a thick layer transfer process according to an embodiment of the present invention.

According to embodiments of the present invention, techniques including a method for forming substrates are provided. More particularly, embodiments according to the present invention provide a method to form a free standing layer of material from a semiconductor material. In a specific embodiment, the free standing layer of material is provided using a plurality of high energy particles to cause a formation of a cleave plane in the semiconductor substrate. The method according to present invent invention can be used in a variety of application, including but not limited to semiconductor device packaging, photovoltaic cells, MEMS devices, and others.

According to embodiments of the present invention, a free standing film may be separated from a bulk material. In one embodiment, a free standing layer of semiconductor material such as single crystal silicon, having a thickness of 10 μm or greater, may be cleaved from a bulk ingot utilizing high energy implantation. Cleaving the ingot in this manner substantially reduces the amount of semiconductor material that is otherwise lost to the kerf in a conventional blade cutting process. In addition to enhancing the efficiency of the cleave action, managing parameters such as ion dose and temperature profile is also important to limit and control the radiation damage to the material that is separated. The resulting cleaved free standing film may be particularly suited for use in the collection of solar energy.

For purposes of the following disclosure, a "free standing film" or "free standing layer" is defined as a film of material that can maintain its structural integrity (i.e. not crumble or break apart), without being in contact with a supporting member such as a handle or transfer substrate. Typically, very thin films (for example silicon films thinner than about 5-10 μm) are unable to be handled without breaking. Conventionally, such thin films are manipulated using a supporting structure, which may also be needed to create the thin film in the first place. Handling of thicker films (i.e. silicon films having a thickness of between 20-50 μm) may be facilitated by the use of a support, but such a support is not mandatory. Accordingly embodiments of the present invention relate the fabrication of free standing films of silicon having a thickness of greater than 20 μm. Also for purposes of the following disclosure, the terms "substrate" and "tile" are employed interchangeably.

Embodiments in accordance with the present invention are not limited to forming free standing films. Alternative embodiments may involve the formation of films supported by a substrate. Moreover, irrespective of whether the films used in solar photovoltaic applications are truly free-standing or supported with handling or transfer substrates during photovoltaic cell processing, processed cells are usually mounted onto a mechanical surface such as glass or plastic for the final application as an integral part of a photovoltaic module.

Also for purposes of the following disclosure, "bulk material" refers to a material present in bulk form. Examples of such bulk material include a substantially circular ingot or boule of single crystal silicon as grown, or a grown single crystal silicon ingot having sides shaved to exhibit other than a substantially circular cross-sectional profile. Other examples of bulk materials include polycrystalline silicon plates or substrates exhibiting a square, rectangular, or trapezoidal profile. Still other examples of bulk materials are described below.

In a specific embodiment, the present method may be applied successively to cleave multiple slices of free standing layers from a single ingot, e.g., silicon boule. That is, the method can be repeated to successively cleave slices (similar to cutting slices of bread from a baked loaf) according to a specific embodiment. Of course, there can be other variations, modifications, and alternatives.

In a specific embodiment of a process flow 100 shown in FIG. 1, a method for fabricating free standing thickness of materials using one or more semiconductor substrates is provided as follows:

1. Provide (103) a semiconductor substrate having a surface region and a thickness;
2. Subject (105) the surface region of the semiconductor substrate to a first plurality of high velocity particles generated using a linear accelerator;
3. Form (107) a region of a plurality of gettering sites within a cleave region, which is provided beneath the surface region to defined a thickness of material to be detached, while the cleave region is maintained at a first temperature;
4. Optionally, perform (109) a thermal treatment process on the semiconductor substrate to further form the plurality of gettering sites within the cleave region;
5. Subject (111) the surface region of the semiconductor substrate to a second plurality of high energy particles generated using the linear accelerator;
6. Increase (113) a stress level of the cleave region from a first stress level to a second stress level from the second plurality of high energy particles, while the semiconductor substrate is maintained at a second temperature;
7. Free (115) the thickness of detachable material, which is free standing, using a cleaving process, while the detachable material is free from an overlying support member or the like;
8. Place (117) the thickness of detached material on a support member;
9. Perform (119) one or more processes on the thickness of detached material;
10. Optionally, perform one or more processes on the semiconductor substrate before subjecting the surface region with the first plurality of high energy particles in step (2); and
11. Perform other steps as desired.

The above sequence of steps provide a method of forming substrates using a linear accelerator process according to an embodiment of the present invention. As shown, the method includes using a co-implant process to remove a film of material. Other alternatives can also be provided where steps may be added, one or more steps may be removed, or one or more steps may be provided in a different sequence without departing from the scope of the claims herein.

Figure 1A:
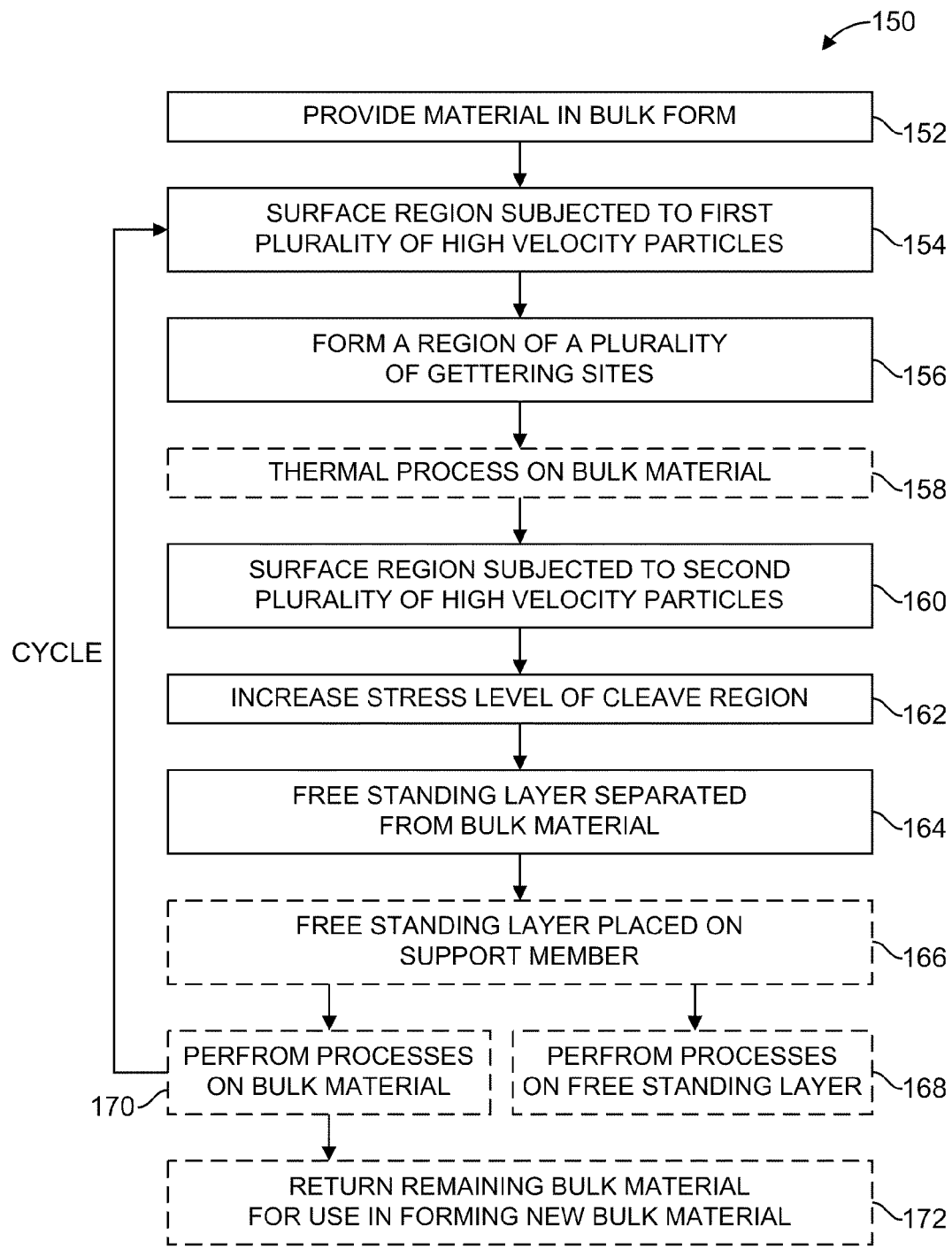
FIG. 1A is a simplified process flow illustrating a method of forming substrates using a thick layer transfer process according to an embodiment of the present invention.
Figure 2:
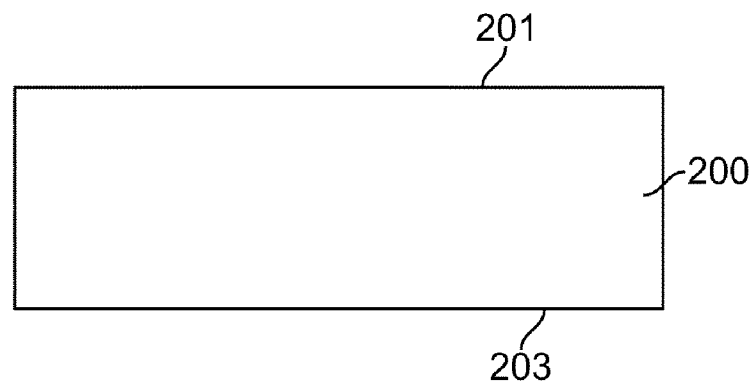
FIG. 2-8 are simplified diagrams illustrating a method of forming substrates using a thick layer transfer process according to an embodiment of the present invention.

In a specific embodiment, a method for fabricating a free standing layer from a bulk material shown in the simplified flow diagram of FIG. 1A as follows.

1. In a first step 152 of process flow 150, a material is provided in bulk form (i.e. ingot, tile, plate, boule) having a surface region and a thickness;
2. In a second step 154, the surface region is subjected to a first plurality of high energy particles;
3. In a third step 156, a region of a plurality of gettering sites is formed within a cleave region, which is provided beneath the surface region to define a thickness of the free standing layer that is to be detached, while the cleave region is maintained at a first temperature;
4. In a fourth step 158, an optional thermal treatment process is performed on the bulk material to further form the plurality of gettering sites within the cleave region;
5. In a fifth step 160, the surface region of the bulk material is subjected to a second plurality of high energy particles;
6. In a sixth step 162, a stress level of the cleave region is increased from a first stress level to a second stress level from the second plurality of high energy particles, while the bulk material is maintained at a second temperature;
7. In a seventh step 164, the free standing layer is freed from the bulk material using a cleaving process, while the free standing layer is free from an overlying support member or the like;
8. In an optional eighth step 166, the free standing layer is placed on a support member;
9. In an optional ninth step 168, one or more processes are performed on the free standing layer;
10. In an optional tenth step 170, one or more processes are performed on the bulk material before returning to step 152 to subject the surface region with the first plurality of high energy particles;
11. Once the free standing layers have been separated from the parent bulk material, in step 172 the remaining bulk material may be used as raw material for the formation of additional bulk material, for example by returning unused single crystal silicon to the melt for formation of additional ingots; and
12. Perform other steps as desired.

The above sequence of steps provide a method of forming free standing layers of material according to embodiments of the present invention. As shown, the method includes using an implant process to remove a free standing layer from a bulk material. Other alternatives can also be provided where steps may be added, one or more steps may be removed, or one or more steps may be provided in a different sequence without departing from the scope of the claims herein. For example, each step including the implantation steps may include a thermal process sequence, defined as a constant temperature or a program of varying temperatures. In addition, the cycles of implant/thermal processing steps 154-162 may be further split into more cycles of smaller dose implants in order to improve the cleave process and/or the film lifetime. Further details of the present method can be found throughout the present specific and more particularly below.

FIG. 2-8 are simplified diagrams illustrating a method of forming substrates or free standing layers using a thick layer transfer process according to an embodiment of the present invention. These diagrams are merely examples, which should not unduly limit the scope of the claims recited herein. One of ordinary skill in the art would recognize many variations, modifications, and alternatives.

As shown, the method begins by providing a semiconductor substrate or semiconductor material in bulk form 200 having a surface region 201, a backside 203 and a thickness 204. Such thickness can be an entirety of an ingot or sliced from a larger ingot or the like. Specifically, the thickness 204 may represent that of an entirety of the bulk material in its original form (e.g. as an entire ingot, boule, tile, or plate), or may represent a thickness of the bulk material previously separated from its original form (e.g. by sawing or slicing an original ingot, boule, tile, or plate). In a specific embodiment, the semiconductor substrate or bulk material can be a single crystal silicon wafer or ingot, a polysilicon cast wafer, tile, or substrate, a silicon germanium wafer, a germanium wafer, a substrate of group III/V materials, group II/VI materials, gallium nitride, or the like. In a preferred embodiment, the substrate or bulk material can be a photosensitive material. Of course there can be other variations, modifications, and alternatives.

Figure 3:
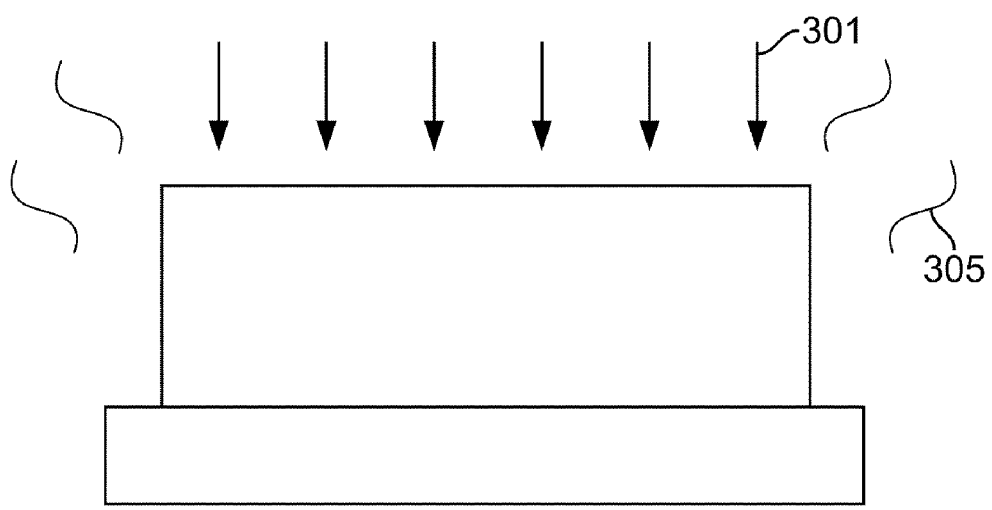

Referring to FIG. 3, the method includes subjecting the surface region of the semiconductor substrate or bulk material to a first plurality of high energy particles 301. In accordance with particular embodiments, the high energy particles 301 can be generated using a linear accelerator.

Figure 4:
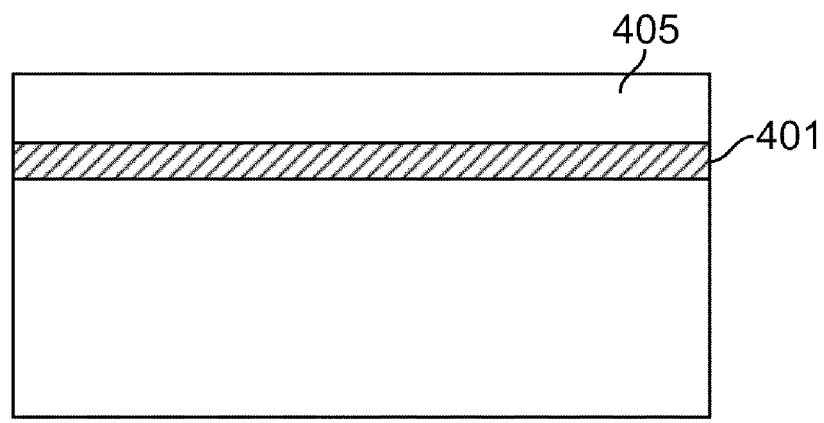

In a specific embodiment, the particles cause formation of a plurality of gettering sites or an accumulation region within a cleave region 401, which is provided beneath the surface region to define a thickness of the bulk material 405 that is to be detached (in some embodiments as a free standing layer), as shown in the simplified diagram of FIG. 4. Preferably, the first plurality of high energy particles provide an implant profile having a peak concentration and a distribution spatially disposed within a depth of the semiconductor substrate. Preferably, the distribution can have a width of about 2 μm and less, where this depth variation of an implant concentration profile is called the longitudinal straggle. For a 3.5 MeV hydrogen implant in silicon, the implant depth is about 120 μm, and the straggle is about 3 μm.

In one preferred embodiment, the cleave region is maintained at a first temperature 305, which can be provided directly or indirectly. That is, the temperature can be provided by convection, conduction, radiation, or a combination of these techniques according to a specific embodiment. Additionally, the high-energy particle beam may also provide part of the thermal energy and in combination with an external temperature source to achieve the desired implant temperature. In certain embodiments, the high-energy particle beam alone may provide the entire thermal energy desired for implant. That is, the high energy particle beam can be provided that directly causes energy to be converted into thermal energy to increase the temperature of the substrate or bulk material. Of course there can be other variations, modifications, and alternatives.

Depending upon the application, according to particular embodiments smaller mass particles are generally selected to decrease the energy requirement for implantation to a desired depth in a material and to reduce a possibility of damage to the material region according to a preferred embodiment. That is, smaller mass particles more easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral or charged particles including ions such as ion species of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

For example, using hydrogen as the implanted species into the silicon wafer as an example, the implantation process is performed using a specific set of conditions. Implantation dose ranges of hydrogen from about $1 \times 10^{15}$ to about $1 \times 10^{16}$ atoms/cm$^2$, and preferably the dose of implanted hydrogen is less than about $8 \times 10^{16}$ atoms/cm$^2$, and may be less than about $5 \times 10^{16}$ atoms/cm$^2$. Implantation energy ranges from about 1 MeV and greater to about 2 MeV or even 5 MeV and greater, for the formation of thick films useful for photovoltaic applications. In certain embodiments implantation energy may be below 1 MeV, for example 0.5 MeV. Implantation temperature ranges from about −50 to about +50 Degrees Celsius, may between about 100-250 Degree Celsius, and is preferably less than about 400 Degrees Celsius to prevent a possibility of hydrogen ions from diffusing out of the implanted silicon wafer. The hydrogen ions can be selectively introduced into the silicon wafer to the selected depth at an accuracy of about ±0.03 to ±1.5 microns. Of course, the type of ion used and process conditions depend upon the application.

For higher implant energies, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness (which may be free standing) ranges from about 20 or 50 micrometers to about 200 micrometers using proton implant energy ranges from about 2 MeV to about 5 MeV. In other embodiments the silicon film may be a free standing silicon layer having a thickness from about 50 micrometers to about 200 micrometers. In certain embodiments the silicon film may have a thickness from about 10 micrometers to about 200 micrometers. Of course there can be other variations, modifications, and alternatives.

In a specific embodiment, a silicon film thickness ranges from about 50 um to about 200 um may be formed using a proton implant having an energy range of about 2.1 MeV to about 5 MeV. This range of silicon film thickness allows the detachment of a thickness of a single-crystal silicon substrate equivalent that can be used as a free standing silicon substrates. Single crystal silicon substrates or free standing layers in the thickness range of 50 um to 200 um according to embodiments of the present invention may be used to replace conventional methods of using wafer sawing, etching, and/or polishing processes. As opposed to about 50% kerf loss in the conventional technologies (kerf loss as being defined as the ratio of the material lost during the cutting and wafering operations), the implant cleaving technique according to embodiments of the present invention has virtually no kerf loss resulting in substantial cost savings and material utilization efficiency improvements. Energies higher than 5 MeV may be used to make semiconductor processing alternative substrate materials, but in solar cell manufacturing, 200 um or less is desired for silicon solar cell material thickness for bulk silicon solar cell formation. As a result, thicker silicon substrates are not of particular commercial interest for fabricating solar cell according to a specific embodiment.

In accordance with certain embodiments, implantation energies higher than 5 MeV may be used. Such high energies of implantation may be useful to fabricate free standing layers as substrates of alternative materials in the fabrication of semiconductor devices. In the manufacture of solar cells, however, a free standing material thickness of 200 um or less is generally desired.

As an example, MeV range implant conditions have been disclosed by Reutov et al. (V. F. Reutov and Sh. Sh. Ibragimov, "Method for Fabricating Thin Silicon Wafers", USSR's Inventors Certificate No. 1282757, Dec. 30, 1983), which is hereby incorporated by reference. In V. G. Reutov and Sh. Sh. Ibragimov, the use of up to 7 MeV proton implantation with optional heating during implant and post-implant reusable substrate heating was disclosed to yield detached silicon wafer thicknesses up to 350 um. A thermal cleaving of a 16 micron silicon film using a 1 MeV hydrogen implantation was also disclosed by M. K. Weldon & al., "On the Mechanism of Hydrogen-Induced Exfoliation of Silicon", J. Vac. Sci. Technol., B15(4), July/August 1997, which is hereby incorporated by reference. The terms "detached" or "transferred silicon thickness" in this context mean that the silicon film thickness formed by the implanted ion range can be released to a free standing state or released to a permanent substrate or a temporary substrate for eventual use as a free standing substrate, or eventually mounted onto a permanent substrate. In a preferred embodiment, the silicon material is sufficiently thick and is free from a handle substrate, which acts as a supporting member. Of course, the particular process for handling and processing of the film will depend on the specific process and application.

Figure 5:
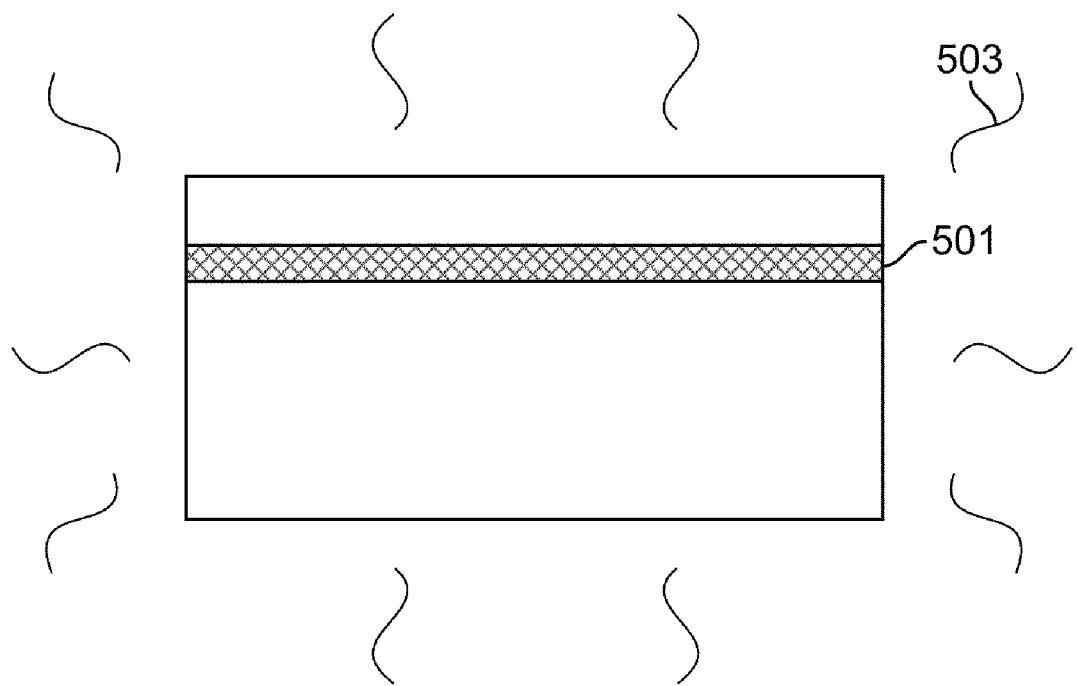

Referring now to FIG. 5, an embodiment in accordance with the present invention may optionally perform a thermal treatment process 503 on the semiconductor substrate or bulk material to further form the plurality of gettering sites within the cleave region. That is, the thermal treatment process anneals out and/or quenches the cleave region to fix 501 the plurality of first particles in place. The thermal treatment provides a fixed network of defects that can act as efficient sites for gettering and accumulating particles in a subsequent implantation or particle accumulation/diffusion process.

Without being tied to a particular theory or mechanism, in a specific embodiment, the increased temperature is believed to precipitate a network of permanent defects, and may also trap a substantial portion of hydrogen from the first plurality of particles. The defect layer, which is substantially permanent, provides a site for efficient collection and trapping of particles from a subsequent implant and/or diffusion process, which will be described in more detail throughout the present specification and more particularly below.

In accordance with one embodiment, the optional thermal treatment can occur using conduction, convection, radiation, or any combination of these techniques. The high-energy particle beam may also provide part of the thermal energy and in combination with a external temperature source to achieve the desired implant temperature. In certain embodiments, the high-energy particle beam alone may provide the entire thermal energy desired for implant. Of course, there can be other variations, modifications, and alternatives.

Figure 6:
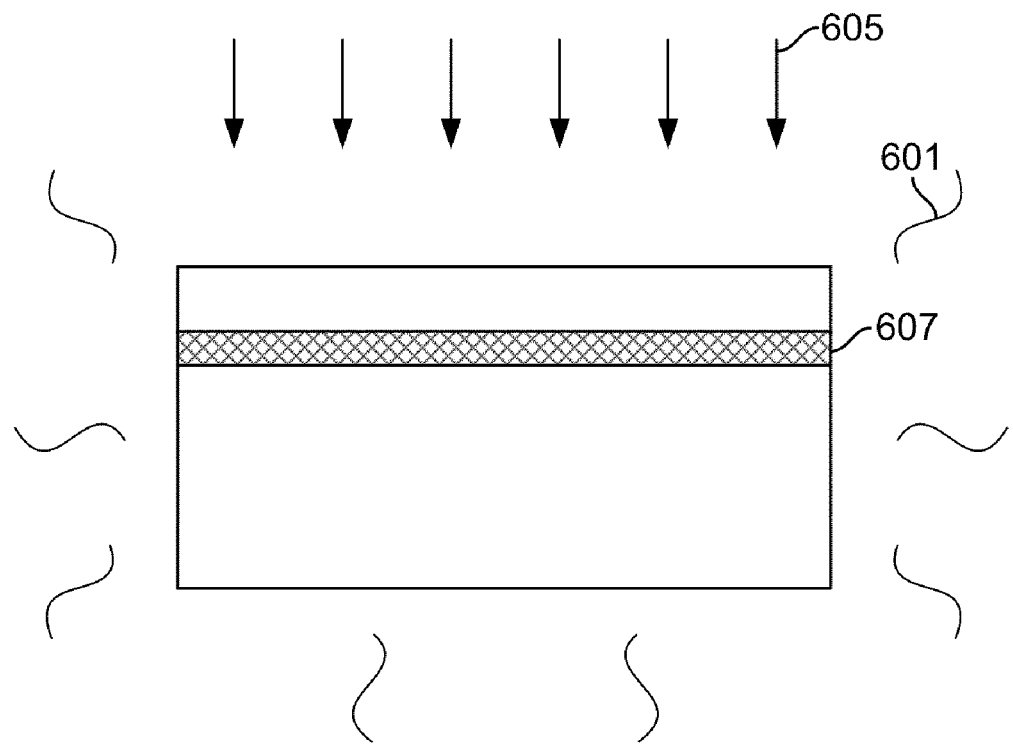
Figure 7:
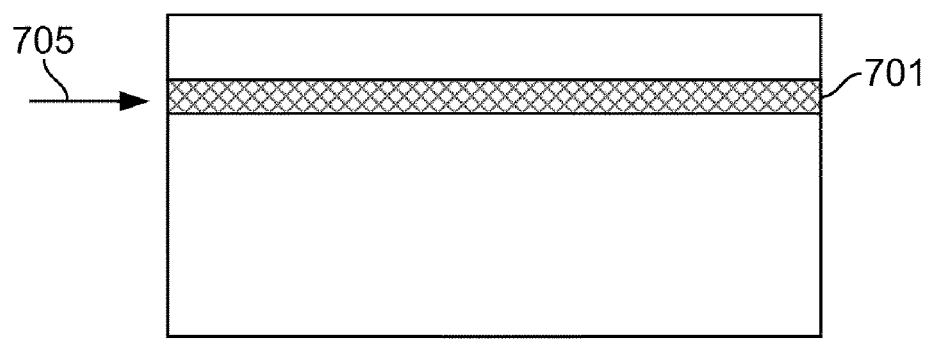

In a specific embodiment, the method includes subjecting the surface region of the semiconductor substrate or bulk material to a second plurality of high energy particles, which may be generated using the linear accelerator, as illustrated in the simplified diagram of FIG. 6. As shown, the method includes the second plurality of high energy particles 605, which are provided in the semiconductor substrate or bulk material. The second particles are introduced into the cleave region 607, which increases a stress level of the cleave region from a first stress level to a second stress level from the second plurality of high velocity particles. In a specific embodiment, the second stress level is suitable for a subsequent cleaving process. In a particular embodiment, the semiconductor substrate or bulk material is maintained at a second temperature 601, which is higher than the first temperature.

Using hydrogen as the species implanted into the bulk single crystal silicon wafer material in the second implantation step as an example, the implantation process is performed using a specific set of conditions. Implantation dose ranges from about $5 \times 10^{15}$ to about $5 \times 10^{16}$ atoms/cm$^2$, and preferably the dose is less than about $1-\times 10^{17}$ atoms/cm$^2$. Implantation energy ranges from about 0.5 MeV and greater to about 2 or 5 MeV and greater for the formation of thick films useful for photovoltaic applications. Implant dose rate can be provided at about 500 microamperes to about 50 milliamperes and a total dose rate can be calculated by integrating an implantation rate over the expanded beam area. Implantation temperature ranges from about −50 Degree Celsius to about 550 Degrees Celsius, and is preferably greater than about 400 Degrees Celsius. The hydrogen ions can be selectively introduced into the silicon wafer to the selected depth at an accuracy of about ±0.03 to ±1.5 microns. In a specific embodiment, the temperature and dose are selected to allow for efficient capture of molecular hydrogen, while there may be some diffusion of mono-atomic hydrogen. Of course, the type of ion used and process conditions depend upon the application.

For higher implant energies as noted above, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness ranges from about 50 micrometers to about 100 micrometers using proton implant energy ranges from about 2 MeV to about 3.25 or 5 MeV. Of course there can be other variations, modifications, and alternatives.

Effectively, the implanted particles add stress or reduce fracture energy along a plane parallel to the top surface of the substrate or bulk material at the selected depth. The energies depend, in part, upon the implantation species and conditions. These particles reduce a fracture energy level of the substrate or bulk material at the selected depth. This allows for a controlled cleave along the implanted plane at the selected depth. Implantation can occur under conditions such that the energy state of the substrate or bulk material at all internal locations is insufficient to initiate a non-reversible fracture (i.e., separation or cleaving) in the substrate or bulk material. It should be noted, however, that implantation does generally cause a certain amount of defects (e.g., micro-detects) in the substrate or bulk material that can typically at least partially be repaired by subsequent heat treatment, e.g., thermal annealing or rapid thermal annealing.

In a specific embodiment, the present method uses a mass-selected high-energy implant approach, which has the appropriate beam intensity. To be cost-effective, the implant beam current should be on the order of a few tens of milliamps of H$^+$ or H$^-$ ion beam current. If the system can implant such sufficiently high energies, H$_2^+$ ions can also be advantageously utilized for achieving higher dose rates. Ion implant apparatuses useful for embodiments of the present invention have been made recently available by the use of DC electrostatic particle accelerators such as the DYNAMITRON proton accelerator available from Ion Beam Applications SA, Belgium). Other forms of DC electrostatic accelerators which may be used include Van de Graaff or Tandem Van de Graaff accelerator types.

Still other forms of particle accelerators suitable for use in accordance with embodiments of the present invention may include radio frequency (RF) particle accelerators such as a cyclotron or a RF linear accelerator (RF Linac). Examples of possible particle accelerator types include radio-frequency quadrupole linear accelerator (RFQ-Linac) or Drift-Tube Linac (DTL), or RF (Radio)-Focused Interdigitated (RFI) technology. These are available from companies such as Accsys Technology Inc. of Pleasanton, Calif., Linac Systems, LLC of Albuquerque, N. Mex. 87109, and others.

In a specific embodiment, these approaches use RF acceleration of an extracted proton beam to increase the total energy of the proton beam from a range of approximately 20-100 keV to 0.5 to 7 MeV or more. The output beam is usually on the order of a few millimeters in diameter and for use in this application would require the use of beam expansion to the order of a few hundred millimeters on a side to a meter or more in order to keep the power flux impinging on the target surface from becoming too large and possibly overheating or damaging the target surface. The proton current available with these technologies can be up to 100 mA or more. As a specific example, assuming 100 kW of beam power, a 3.25 MeV RFQ/RFI-Linac would yield a proton beam current of about 31 mA. Using a dose of approximately $1 \times 10^{16}$ H/cm$^2$ and an expanded beam of about 500 mm×500 mm, the silicon area processed per hour at the target implantation dose is about 7 square meters while the power flux is kept to about 13 Watts/cm$^2$. This combination of parameters makes this approach particularly practical for cost effective solar cell production. Of course, there can be other variations, alternatives, and modifications.

Optionally, specific embodiments of methods in accordance with the present invention include a thermal treatment process after the implanting process. According to a specific embodiment, the present method uses a thermal process ranging from about 450 to about 600 Degrees Celsius for silicon material. In a preferred embodiment, the thermal treatment can occur using conduction, convection, radiation, or any combination of these techniques. The high-energy particle beam may also provide part of the thermal energy and in combination with a external temperature source to achieve the desired implant temperature. In certain embodiment, the high-energy particle beam alone may provide the entire thermal energy desired for implant. In a preferred embodiment, the treatment process occurs to season the cleave region for a subsequent cleave process. Of course, there can be other variations, modifications, and alternatives.

Figure 8:
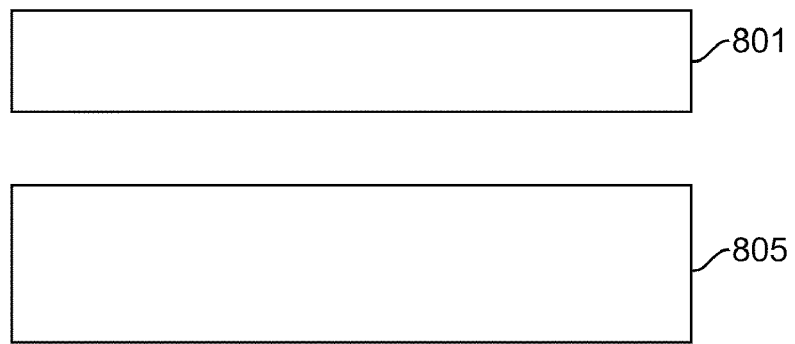

A specific embodiment of a method according to the present invention includes a step of freeing the thickness of detachable material, which is free standing, using a cleaving process, while the detachable material is free from an overlying support member or the like, as illustrated by FIG. 8. As shown, the detachable material 801 is removed from the remaining substrate portion or bulk material 805. In a specific embodiment, the step of freeing can be performed using a controlled cleaving process. The controlled cleaving process provides a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method in accordance with an embodiment of the present invention frees the thickness of material (which may be free standing) from the substrate or bulk material to completely remove the thickness of material. Of course, there can be other variations, alternatives, and modifications.

In one embodiment, the method uses one or more patterned regions to facilitate initiation of a cleaving action. In a specific embodiment, the present method provides a semiconductor substrate having a surface region and a thickness. The method includes subjecting the surface region of the semiconductor substrate to a first plurality of high energy particles generated using a linear accelerator to form a patterned region of a plurality of gettering sites within a cleave region. In a preferred embodiment, the cleave region is provided beneath the surface region to defined a thickness of material to be detached. The semiconductor substrate is maintained at a first temperature. The method also includes subjecting the semiconductor substrate to a treatment process, e.g., thermal treatment. The method includes subjecting the surface region of the semiconductor substrate to a second plurality of high energy particles, which have been provided to increase a stress level of the cleave region from a first stress level to a second stress level. The method includes initiating the cleaving action at a selected region of the patterned region to detach a portion of the thickness of detachable material using a cleaving process and freeing the thickness of detachable material using a cleaving process.

In one embodiment, the patterned implant sequence subjects the surface to a dose variation where the initiation area is usually developed using a higher dose and/or thermal budget sequence. Propagation of the cleaving action to complete the cleaving action can occur using additional dosed regions to guide the propagating cleave front. Alternatively, cleaving propagation can be accomplished by following a depth that is guided using stress-control. Propagation of the cleaving can also be achieved by following a natural crystallographic cleave plane. One or more of these techniques may be applied in conjunction with one another. Some or most of the area may be implanted at a lesser dose or not implanted at all depending on the particular cleaving technique used. Such lower dosed regions can help improve overall productivity of the implantation system by reducing the total dose needed to detach each film from the substrate.

In a specific embodiment, the present method can perform other processes. For example, the method can place the thickness of detached material on a support member, which is later processed. Additionally or optionally, the method in accordance with an embodiment of the present invention performs one or more processes on the semiconductor substrate or bulk material before subjecting the surface region with the first plurality of high energy particles, or between the implanting step(s) and the cleaving step. Depending upon the particular embodiment, the processes can be for the formation of photovoltaic cells, or layers used within a cell process, integrated circuits, optical devices, any combination of these, and the like. Of course, there can be other variations, modifications, and alternatives.

FIG. 9 shows a simplified schematic view of the formation of a plurality of free standing layers of semiconductor material in accordance with one embodiment of the present invention. Single crystal silicon ingot 900 exhibits an original thickness of 5 cm and has lateral dimensions of 15 cm×15 cm. As the density of single crystal silicon is about 2.32 g/cm$^3$, the weight of this bulk single crystal silicon material is 15×15× 5×2.32=2.61 Kg Thus, cleavage of about 70% of the thickness of ingot 900 utilizing techniques according to embodiments of the present invention, produces 350 free standing single crystal silicon films 902, each having a thickness of 100 um. As 1 m$^2$ represents about 45 tile surfaces having an area of 15 cm×15 cm, a total silicon surface area of about 7.8 m$^2$ can be produced from 70% of a 5 cm thick ingot. The remaining 30% of the ingot not cleaved to form single crystal silicon, can be returned to the melt as highly purified starting material to produce a fresh ingot for cleaving. The remaining material is therefore not to be regarded as part of a kerf loss or lost material but rather the recyclable mechanical remnant of the ingot material.

FIG. 10 shows a simplified schematic view of the formation of a plurality of free standing layers of semiconductor material in accordance with another embodiment of the present invention. As shown in the embodiment of FIG. 10, single crystal silicon ingot 1000 exhibits an original thickness of 15 cm and has lateral dimensions of 15 cm×15 cm. Cleavage of about 70% of the thickness of ingot 1000 utilizing techniques according to the present invention, produces 1750 free standing single crystal silicon films 1002 having a thickness of 20 um. As 1 m$^2$ represents about 45 tile surfaces each having an area of 15 cm×15 cm, in this embodiment about 39 m$^2$ of silicon can be produced from 70% of a 5 cm thick ingot.

Experimental Data

The efficiency of the separation method in accordance with embodiments of the present invention is evidenced by the following experimental results. In one experiment, a bulk material weighing 14.2 grams comprising float-zone single-crystal silicon of (111) orientation, with Phosphorous N-type doping of >25 ohm-cm, having a diameter of about 25 mm and a thickness of about 12.5 mm, was subjected to 3 consecutive cycles of slicing under conditions detailed in the following TABLE:

TABLE

| first implant | implanted species: Hydrogen<br>temperature: Estimated to be less than 100 C.<br>dose: 1E16 H+/cm$^2$<br>dose rate: 7.6E12 H+/cm$^2$-secenergy: 3.5 MeV<br>ion source: ECR plasma/RFQ Linac |
|---|---|
| second implant | implanted species: Hydrogen<br>temperature: Estimated to be less than 100 C.<br>but higher than first implant<br>dose: 7E16 H+/cm$^2$ (first cleave), 8E16 H+/cm$^2$ (second/third cleave)<br>dose rate: 1.52E13 H+/cm$^2$-sec<br>energy: 3.5 MeV<br>ion source: ECR plasma/RFQ Linac |
| post-implant treatment | 650 C., 60 minutes |

After 3 cycles, 3 free standing layers of silicon having a thickness of roughly 120 um were successively separated from the bulk material, leaving a residual bulk material with 12.14 mm remaining. To calculate bulk material efficiency, an implant damage layer etch of 5 um per side (10 um total) is assumed to remove the implant straggle, yielding an effective free-standing layer of 110 um. Thus, a thickness of material of 360 um was consumed to produce 3 wafers having a total usable thickness of material of 340 um. This translates to an efficiency of use of bulk material of about 94.4%, where efficiency=(total wt. of free standing layers)/(wt. of bulk material consumed)×100 or (0.386 grams/0.409 grams)× 100%. This is substantially greater than the efficiencies of 50% that would be expected from conventional blade sawing or wire sawing techniques.

Certain benefits may achieved over conventional techniques for separating free standing layers from bulk materials using embodiments of the present invention. For example, particular embodiments may use a cost effective particle accelerator device to provide high energy implantation. Such a particle accelerator device may include, but is not limited to DC electrostatic accelerator, a drift tube technique, a cyclotron, a Radio Frequency Quadrupole, commonly called RFQ, or combinations of these, (for example, a RFQ combined with a Drift Tube Linac or a RFI (RF-Focused Interdigital) Linear Accelerator), and other suitable techniques. In a preferred embodiment, the particle accelerator provides an implantation process that forms a thickness of free standing material defined by a cleave plane in a bulk material.

The thickness of the free standing material may be further processed to provide a high quality semiconductor material for application such as photovoltaic devices, 3D MEMS or integrated circuits, IC packaging, semiconductor devices, any combination of these, and others. One embodiment of the present method provides for single crystal silicon for highly efficient photovoltaic cells among others. Certain embodiments use a low initial dose of energetic particles, which allows the process to be cost effective and efficient.

Certain embodiments in accordance with the present invention allow for fabrication of large area substrates. For example, embodiments of the present invention can be applied to make thin silicon material plates of the desired form factor (for example, 50 μm-200 μm thickness with a area size from 15 cm×15 cm to upwards of 1 m×1 m or more for polysilicon plates).

In accordance with an alternative embodiment of the present invention, a seed layer may further provide for layering of a hetero-structure epitaxial process. The hetero-structure epitaxial process can be used to form thin multi junction photovoltaic cells, among others. Merely as an example, GaAs and GaInP layers may be deposited heteroepitaxially onto a germanium seed layer, which is a free standing layer formed using an implant process according to an embodiment of the present invention.

Embodiments of the present invention relate generally to techniques including an apparatus and a method of introducing charged particles for semiconductor material processing. More particularly, the present apparatus and method provide a system using a particle accelerator to obtain a beam of particles with MeV energy level for manufacturing one or more detachable semiconductor film that is capable of free-standing for device applications including photovoltaic cells. But it will be recognized that the invention has a wider range of applicability; it can also be applied to other types of applications such as for three-dimensional packaging of integrated semiconductor devices, photonic or optoelectronic devices, piezoelectronic devices, flat panel displays, microelectromechanical systems ("MEMS"), nano-technology structures, sensors, actuators, integrated circuits, biological and biomedical devices, and the like.

In a specific embodiment, the apparatus according to embodiments of the present invention provides a charged particle beam at MeV energy level to provide for an implantation process. The implantation process introduces a plurality of impurity particles to a selected depth within a thickness of a semiconductor substrate to define a cleave region within the thickness. Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $1 \times 10^{15}$ to about $1 \times 10^{16}$ atoms/cm$^2$, and preferably the dose is less than about $5 \times 10^{16}$ atoms/cm$^2$. Implantation energy ranges from about 1 MeV and greater to about 5 MeV and greater for the formation of thick films useful for photovoltaic applications. Implantation temperature ranges from about −50 to about 550 Degrees Celsius, and is preferably less than about 400 Degrees Celsius to prevent a possibility of hydrogen ions from diffusing out of the implanted silicon wafer. The hydrogen ions can be selectively introduced into the silicon wafer to the selected depth at an accuracy of about ±0.03 to ±1.5 microns. Of course, the type of ion used and process conditions depend upon the application.

As an example, MeV range implant conditions have been disclosed by Reutov et al. (V. F. Reutov and Sh. Sh. Ibragimov, "Method for Fabricating Thin Silicon Wafers", USSR's Inventors Certificate No. 1282757, Dec. 30, 1983), which is hereby incorporated by reference. In V. G. Reutov and Sh. Sh. Ibragimov, the use of up to 7 MeV proton implantation with optional heating during implant and post-implant reusable substrate heating was disclosed to yield detached silicon wafer thicknesses up to 350 um. A thermal cleaving of a 16 micron silicon film using a 1 MeV hydrogen implantation was also disclosed by M. K. Weldon & al., "On the Mechanism of Hydrogen-Induced Exfoliation of Silicon", J. Vac. Sci. Technol., B15(4), July/August 1997, which is hereby incorporated by reference. The terms "detached" or "transferred silicon thickness" in this context mean that the silicon film thickness formed by the implanted ion range can be released to a free standing state or released to a permanent substrate or a temporary substrate for eventual use as a free standing substrate, or eventually mounted onto a permanent substrate. In a preferred embodiment, the silicon material is sufficiently thick and is free from a handle substrate, which acts as a supporting member. Of course, the particular process for handling and processing of the film will depend on the specific process and application.

The requirement for high productivity calls for the use of a particle accelerator with the highest possible beam current. This high current, in combination with the aforementioned requirement for high energy, implies that that the beam will carry high power, depositing the power as heat into the substrate. According to certain embodiments, the challenge of cooling the substrates in vacuum can be mitigated by spreading the beam power over a plurality of substrates, thereby reducing the heat flux density and increasing the area available for cooling.

One approach is to scan the ion beam back and forth using magnetic or electrostatic deflectors. Alternately, the beam made be made to diverge statically through the use of carefully designed magnetic or electrostatic lenses. In either case, in the processing of silicon substrates with ion beams, the ion beam is passed through a subsequent collimating lens system to make the diverging beam parallel.

This parallelism is important in order to prevent channeling. As discussed below, channeling is a process wherein those incident ions that are precisely aligned with a crystal plane or axis of the substrate will penetrate the substrate to anomalously large depths and also show large variability in the depth of penetration. By making the beam substantially parallel, the range of ion angles present in the beam is limited and falls within a narrow range, typically less than a few degrees. By inclining the axes of the lattice of the substrate crystal slightly relative to the beam axis, channeling may be prevented.

Were a divergent beam, whether scanned or statically divergent, to impinge on a crystal substrate, the ions in some small fraction of the substrate surface would find themselves aligned with the crystal planes, producing anomalously large implant depth in only that specific area, leading to poor film properties of yield loss. In most areas of the substrate channeling will not occur: however, where channeling does occur it can disrupt the formation of thin films of material.

In the present case, the high beam power requires that the beam be spread over a relatively large area. Collimating magnets or electrostatic lenses that operate over large (meter-scale) dimensions are difficult to design and expensive. Furthermore, scanning the beam in two dimensions rather than only a single dimension, is highly advantageous. Unfortunately, collimating lenses that collimate in two dimensions simultaneously are virtually impossible to construct.

Certain embodiments in accordance with the present invention may employ a scanning mode for implantation. An example of such an embodiment is shown in the simplified schematic views of FIGS. 11-11A. In particular, FIG. 11 is a simplified schematic diagram illustrating components of an embodiment of an apparatus for performing implantation according to the present invention. Apparatus 1100 comprises ion source 1102 in vacuum communication with beam transport section 1104. Beam transport section 1104 can contain elements for electrical and or magnetic beam extraction, shaping and focusing.

Upon exiting the beam transport section 1120, the highly energized ion beam is first optionally exposed to analyzing magnet 1142, which alters the direction of the beam and performs the cleansing function described throughout the instant application, such that initial contaminants of the high energy beam are routed to beam dump 1144.

In accordance with certain embodiments, the analyzing magnet 1142 exerts a force over the beam that is consistent over time, such that the resulting direction of the cleansed beam does not vary. In accordance with alternative embodiments, however, the analyzing magnet may exert a force over the beam that does change over time, such that the direction of the beam does in fact vary. As described in detail below, such a change in beam direction accomplished by the analyzing magnet, may serve to accomplish the desired scanning of the beam along one axis.

Figure 11A:
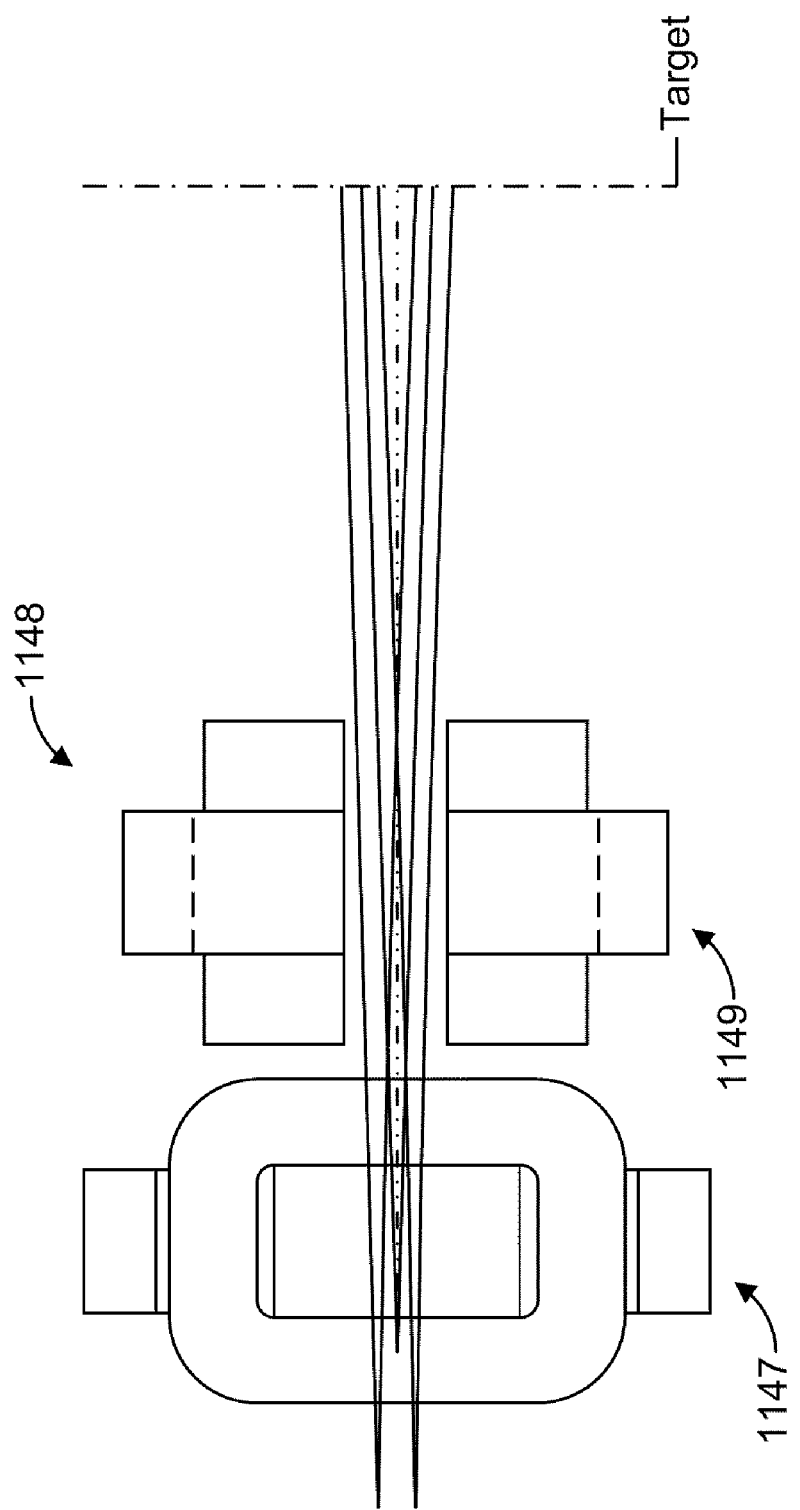
FIG. 11A shows an enlarged schematic view of the scanning device of the apparatus of FIG. 11.

After this analyzing magnet element, the beam may be further focused, and the beam can then be scanned using various methods to both provide a DC offset and/or AC varying beam. For example, in the embodiment of FIG. 11, upon exiting the analyzing magnet, the cleansed ion beam enters beam scanner 1148. FIG. 11A shows a simplified schematic diagram of one embodiment of the beam scanner 1148 in accordance with the present invention. Specifically, beam scanner 1148 comprises a first scanner dipole 1147 configured to scan to vary the location of the beam in a first plane. Beam scanner 1148 also comprises a second scanner dipole 1149 configured to scan to vary the location of the beam in a second plane perpendicular to the first plane.

Final beam shaping and focusing may be carried out using various combination of quadrupole and Sextupole etc magnetic focusing, where magnetic field is arranged in a manner to confer upon the beam a desired profile (i.e. Gaussian, top-hat etc.)

A sophisticated control system can be utilized for achieving whole area scan coverage, or for providing patterned coverage (i.e. lines or spots only). The control system may provide for lesser or greater dosages by controlling a dwell time of the beam, and/or by regulating the number of times the beam is scanned over the same location. Throughout the transport section, the beam may be allowed to expand by allowing a dedicated drift portion.

Figure 11B:
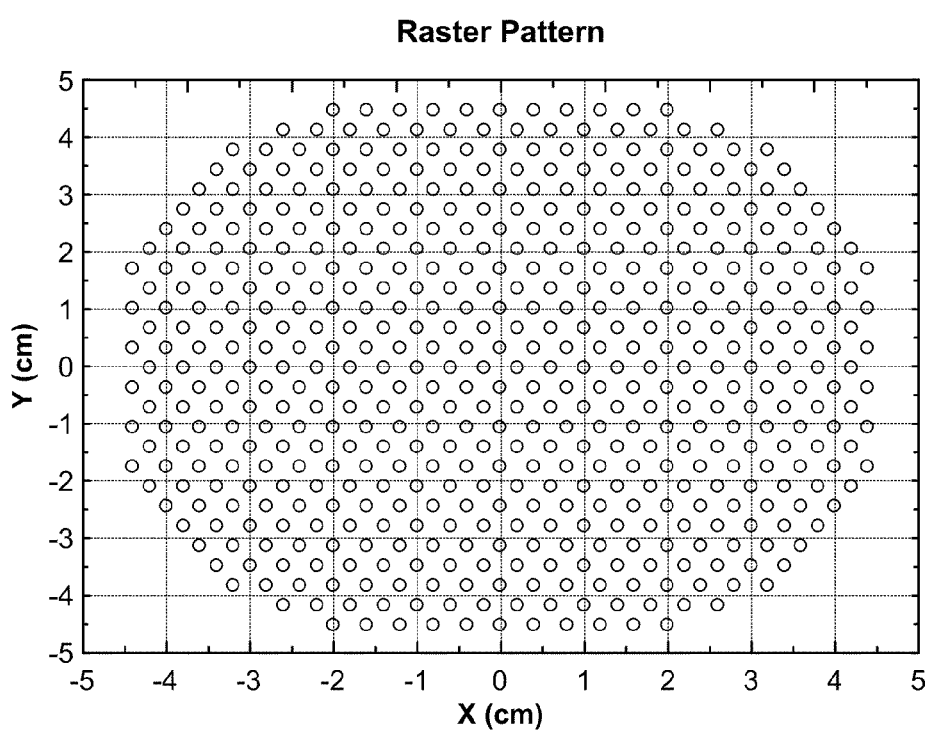
FIGS. 11B-E show various plots of simulated scanning of a high energy ion beam over a surface of a workpiece according to an embodiment of the present invention.
Figure 11C:
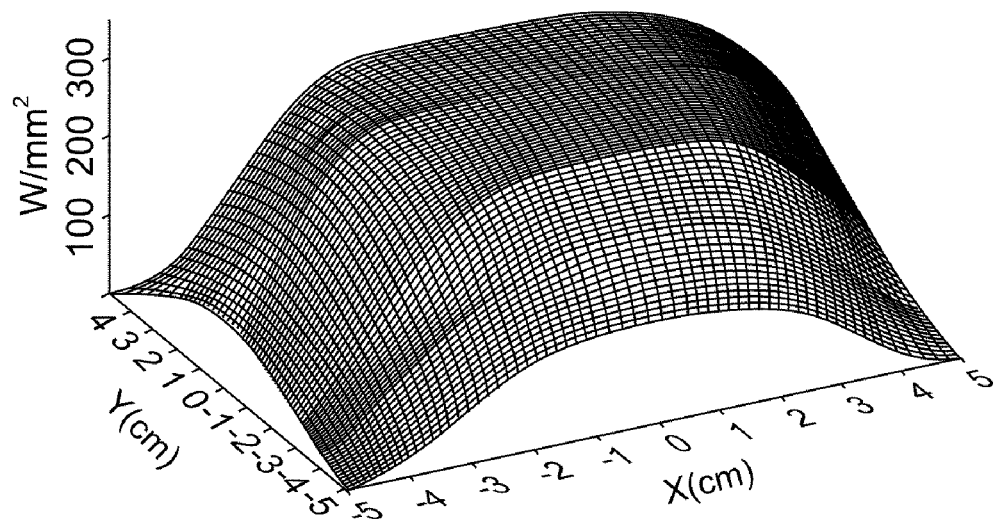
Figure 11D:
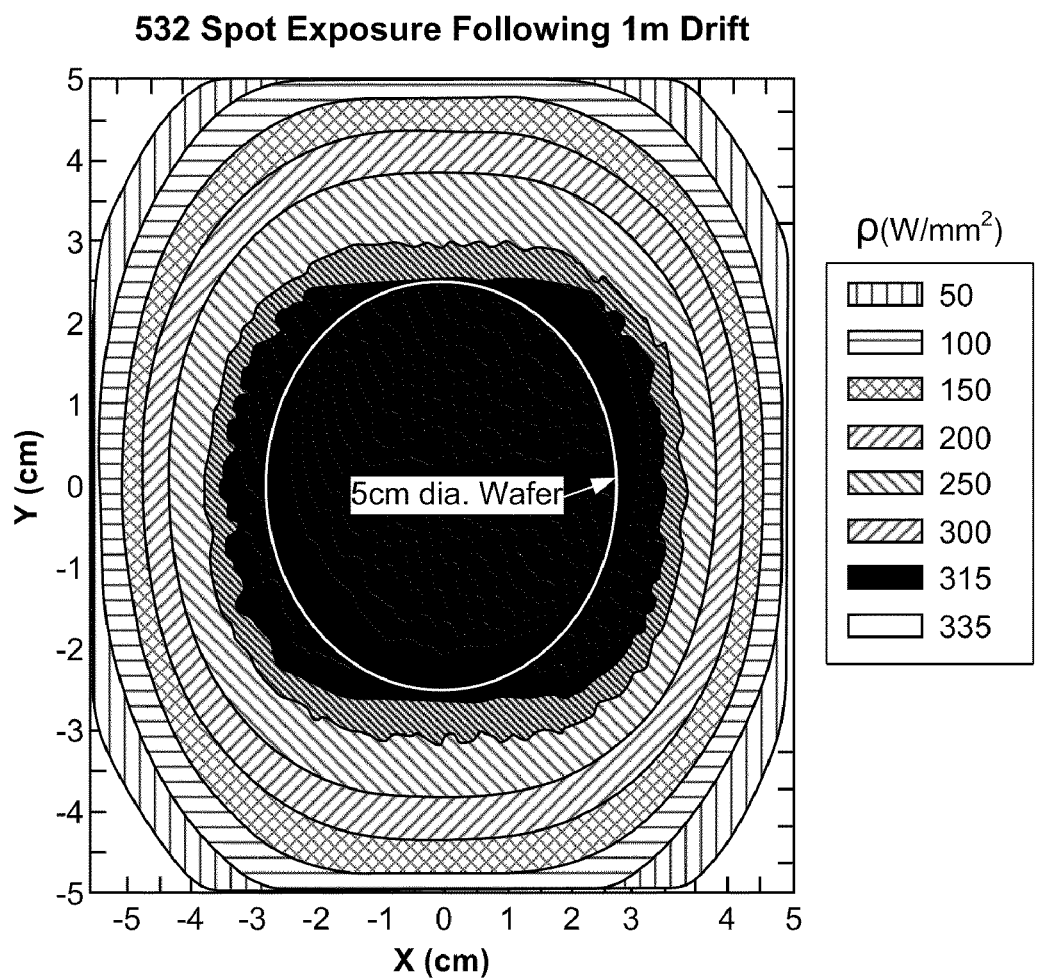

FIGS. 11B-E show simulated results of scanning an high energy beam of ions over a workpiece according to an embodiment of the present invention. Specifically, FIG. 11B shows a raster pattern of 532 spot exposure. FIG. 11C plots in three dimensions the power density of the 532 spot exposure of FIG. 11B. FIG. 11D plots in two dimensions the power density of the 532 spot exposure of FIG. 11B.

Figure 11E:
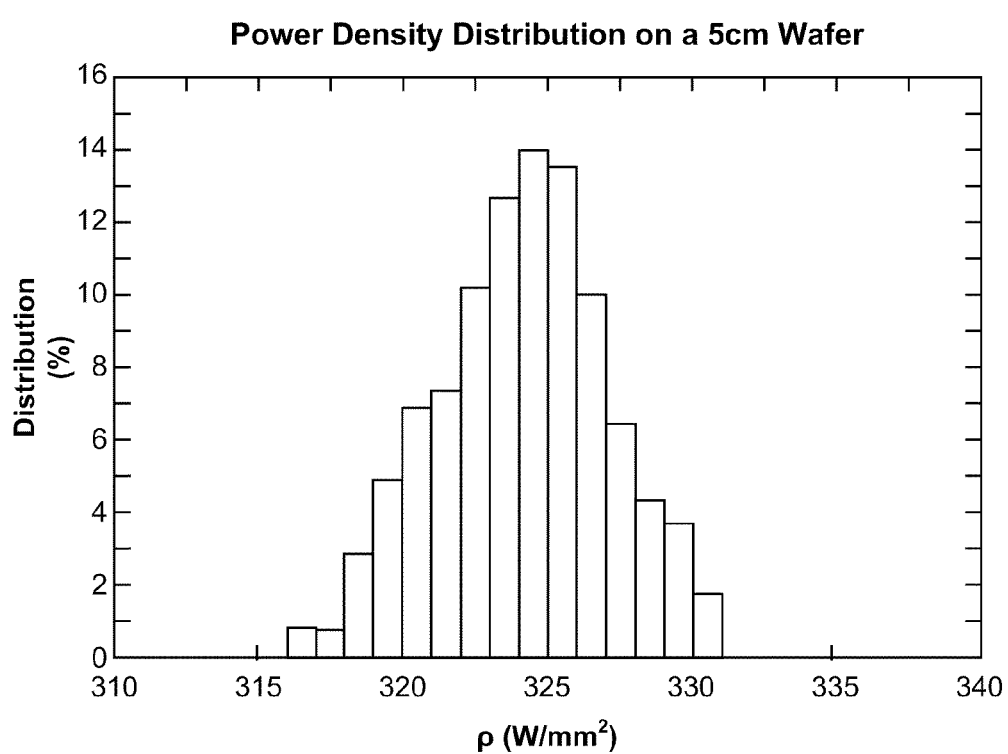

FIG. 11E is a bar graph of the power density versus distribution on a 5 cm wafer. The following 1 m drift. Taken together, these figures indicate that it is possible to irradiate a 5 cm diameter workpiece with a proton density of 3E16/sq-cm with a power density uniformity of less than <5%.

While the particular embodiment shown in FIG. 11 includes elements for shaping and controlling the path of the beam, these are not required by the present invention. Alternative embodiments in accordance with the present invention could employ a drift tube configuration, lacking such elements and allowing the shape of the beam to expand after it exits the accelerator. Rather than scanning the beam itself, alternative embodiments may change the location of the beam by physical translation of the target tile itself.

FIG. 11 shows the remaining components of the apparatus, including an end station 1159. In this end station 1159, tiles 1160 in the process of being scanned with the energetic ion beam, are supported in a vacuum in scanning stage 1162. The tiles 1160 are provided to the scanning stage through a robotic chamber 1164 and a load lock 1166.

The various components of the apparatus of FIGS. 11-11A, including any specialized motion of the scanner (such as dithering motion as is described below), is typically under the control of a host computer 1180 including a processor 1182 and a computer readable storage medium 1184. Specifically, the processor is configured to be in electronic communication with the different elements of the apparatus 1100, including the ion source, beam transport, and end station. The computer readable storage medium has stored thereon codes for instructing the operation of any of these various components. Examples of aspects of the process that may be controlled by instructions received from a processor include, but are not limited to, pressures within the various components such as end station and the beam transport, beam current, beam shape, scan patterns (either by scanning the beam utilizing a scanner and/or analyzing magnet, and/or moving the target utilizing translation with XY motored stages at substrate, i.e. painting), beam timing, the feeding of tiles into/out of the end station, operation of the beam cleaning apparatus (i.e. the analyzing magnet), and flows of gases and/or power applied to the ion source, etc.

Figure 12:
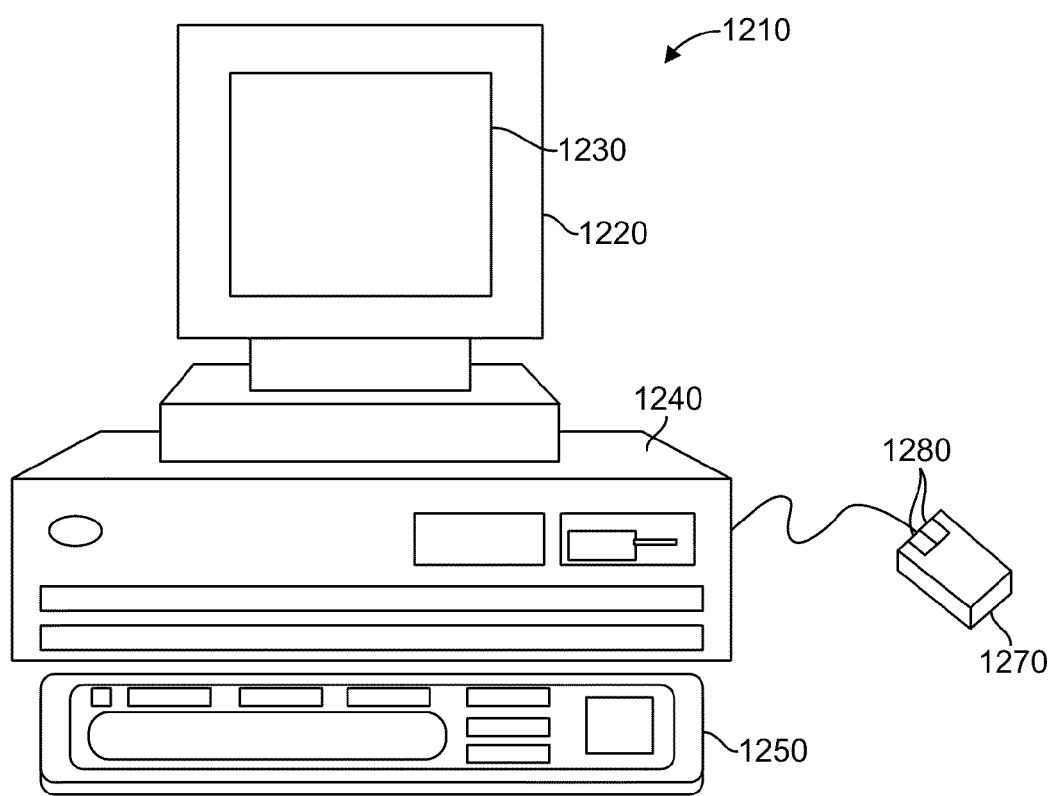
FIG. 12 is a schematic illustration of a computer system for use in accordance with embodiments of the present invention.

The various components of the coupon system described above may be implemented with a computer system having various features. FIG. 12 shows an example of a generic computer system 1210 including display device 1220, display screen 1830, cabinet 1240, keyboard 1250, and mouse 1270. Mouse 1270 and keyboard 1250 are representative "user input devices." Mouse 1270 includes buttons 1280 for selection of buttons on a graphical user interface device. Other examples of user input devices are a touch screen, a light pen, track ball, data glove, microphone, and so forth. FIG. 12 is representative of but one type of system for embodying the present invention. It will be readily apparent to one of ordinary skill in the art that many system types and configurations are suitable for use in conjunction with the present invention. In a preferred embodiment, computer system 1210 includes a Pentium class based computer, running Windows NT operating system by Microsoft Corporation. However, the apparatus is easily adapted to other operating systems and architectures by those of ordinary skill in the art without departing from the scope of the present invention.

As noted, mouse 1270 can have one or more buttons such as buttons 1280. Cabinet 1240 houses familiar computer components such as disk drives, a processor, storage device, etc. Storage devices include, but are not limited to, disk drives, magnetic tape, solid state memory, bubble memory, etc. Cabinet 1240 can include additional hardware such as input/output (I/O) interface cards for connecting computer system 1210 to external devices external storage, other computers or additional peripherals, further described below.

Figure 12A:
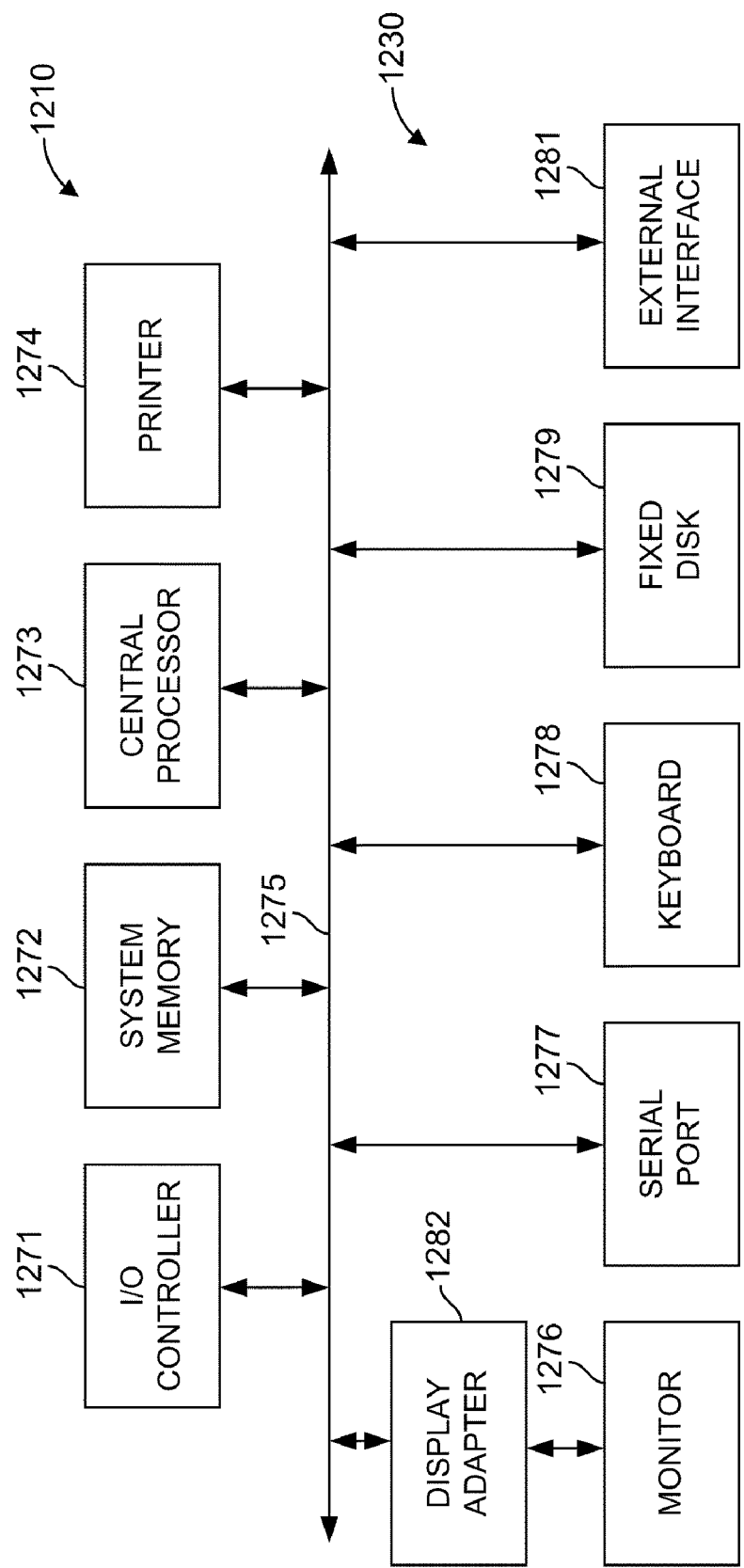
FIG. 12A is an illustration of basic subsystems the computer system of FIG. 12.

FIG. 12A is an illustration of basic subsystems in computer system 1210 of FIG. 12. This diagram is merely an illustration and should not limit the scope of the claims herein. One of ordinary skill in the art will recognize other variations, modifications, and alternatives. In certain embodiments, the subsystems are interconnected via a system bus 1275. Additional subsystems such as a printer 1274, keyboard 1278, fixed disk 1279, monitor 1276, which is coupled to display adapter 1282, and others are shown. Peripherals and input/output (I/O) devices, which couple to I/O controller 1271, can be connected to the computer system by any number of means known in the art, such as serial port 1277. For example, serial port 1277 can be used to connect the computer system to a modem 1281, which in turn connects to a wide area network such as the Internet, a mouse input device, or a scanner. The interconnection via system bus allows central processor 1273 to communicate with each subsystem and to control the execution of instructions from system memory 1272 or the fixed disk 1279, as well as the exchange of information between subsystems.

Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory.

Any of the software components or functions described in this application, may be implemented as software code to be executed by a processor using any suitable computer language such as, for example, Java, C++ or Perl using, for example, conventional or object-oriented techniques. The software code may be stored as a series of instructions, or commands on a computer readable medium, such as a random access memory (RAM), a read only memory (ROM), a magnetic medium such as a hard-drive or a floppy disk, or an optical medium such as a CD-ROM. Any such computer readable medium may reside on or within a single computational apparatus, and may be present on or within different computational apparatuses within a system or network.

The scanning stage of FIG. 11 may be structured to reduce the effects of channeling. Various techniques which may be employed to reduce channeling are described below in a separate section.

The implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth.

According to particular embodiments, implantation can occur under conditions such that the energy state of the substrate at all internal locations is insufficient to initiate a non-reversible fracture (i.e., separation or cleaving) in the substrate material. Alternatively, a patterned implant can be employed to introduce particles into only certain areas of the substrate, or to introduce lower doses in certain areas.

According to certain such embodiments, patterned implantation can be employed such that only regions in which cleaving is to be initiated, receive a full or high dose. Other regions where cleaving is merely to be propagated, may received reduced doses or no doses at all. Such variation in dosage may be accomplished either by controlling the dwell time of the beam in a particular region, by controlling the number of times a particular region is exposed to the beam, or by some combination of these two approaches. In one embodiment, a beam of 20 mA of H+ ions may provide a flux of $1.25 \times 10^{17}$ H atom/(cm$^2$ sec), with a minimum dwell time of 200 ps, resulting from a scan speed of 2.5 km/sec (corresponding to a scan frequency of 1.25 KHz within a 1 meter tray width using a 5 cm beam diameter), resulting in a per-pass minimum dose of $2.5 \times 10^{13}$ H atom/cm$^2$. Longer dwell times, of course, would increase the dosage received.

According to certain embodiments, cleaving action in high dose regions may be initiated by other forces, including but not limited to physical striking (blades), ultrasonics, or the stress resulting from the differences in coefficients of thermal expansion/contraction between different materials. In accordance with one particular embodiment, the substrate may be bonded to a metal layer, which as the substrate/metal combination cools, induces a stress sufficient to initiate cleaving in the regions receiving a high implant dosage, and/or propagate a pre-existing implant initiation region.

It should be noted, however, that implantation does generally cause a certain amount of defects (e.g., micro-detects) in the substrate that can typically at least partially be repaired by subsequent heat treatment, e.g., thermal annealing or rapid thermal annealing. Optionally, the method includes a thermal treatment process after the implanting process according to a specific embodiment. In a specific embodiment, the present method uses a thermal process ranging from about 450 to about 600 Degrees Celsius for silicon material. In a preferred embodiment, the thermal treatment can occur using conduction, convection, radiation, or any combination of these techniques. The high-energy particle beam may also provide part of the thermal energy and in combination with a external temperature source to achieve the desired implant temperature. In certain embodiment, the high-energy particle beam alone may provide the entire thermal energy desired for implant. Such secondary use of the high-energy beam as a heating source can help limit the energy expenditure of the system and increase overall system power efficiency. In a preferred embodiment, the treatment process occurs to season the cleave region for a subsequent cleave process. Of course, there can be other variations, modifications, and alternatives.

Figure 15:
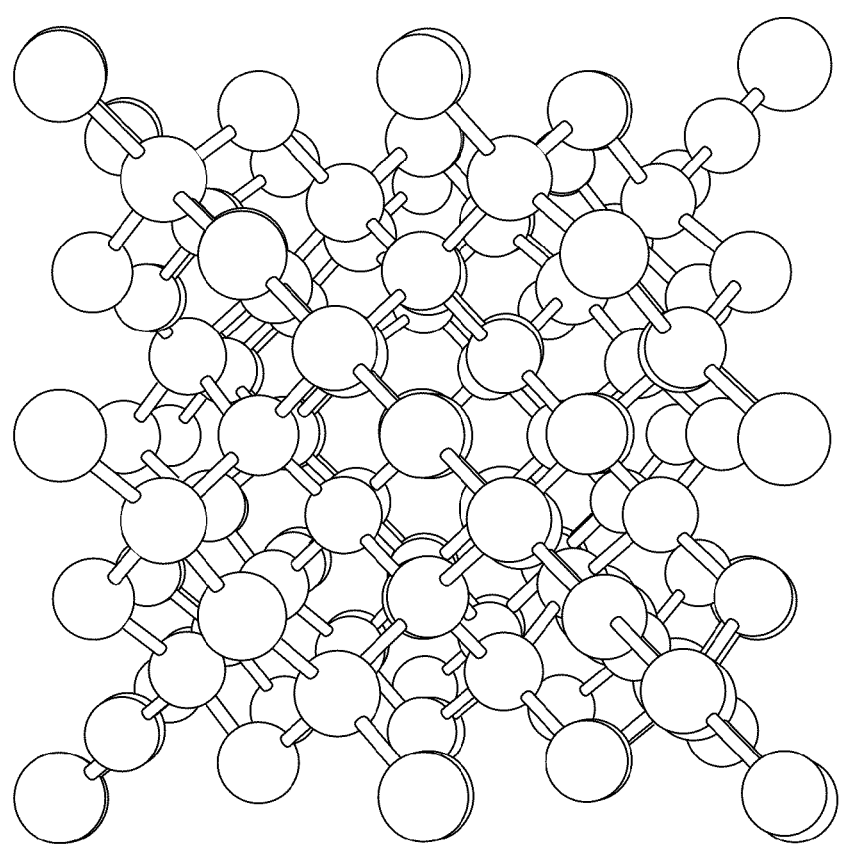
FIG. 15 shows a silicon crystal lattice as viewed from the perspective of the beam aligned with the crystal axes, illustrating how channeling occurs.

In a specific embodiment, the method includes a step of freeing the thickness of detachable material, which is free standing, using a cleaving process, while the detachable material is free from an overlying support member or the like, as illustrated by FIG. 15. As shown, the detachable material 1501 is removed from the remaining substrate portion 1505. In a specific embodiment, the step of freeing can be performed using a controlled cleaving process. The controlled cleaving process provides a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method frees the thickness of material from the substrate to completely remove the thickness of material. Of course, there can be other variations, alternatives, and modifications.

Figure 13:
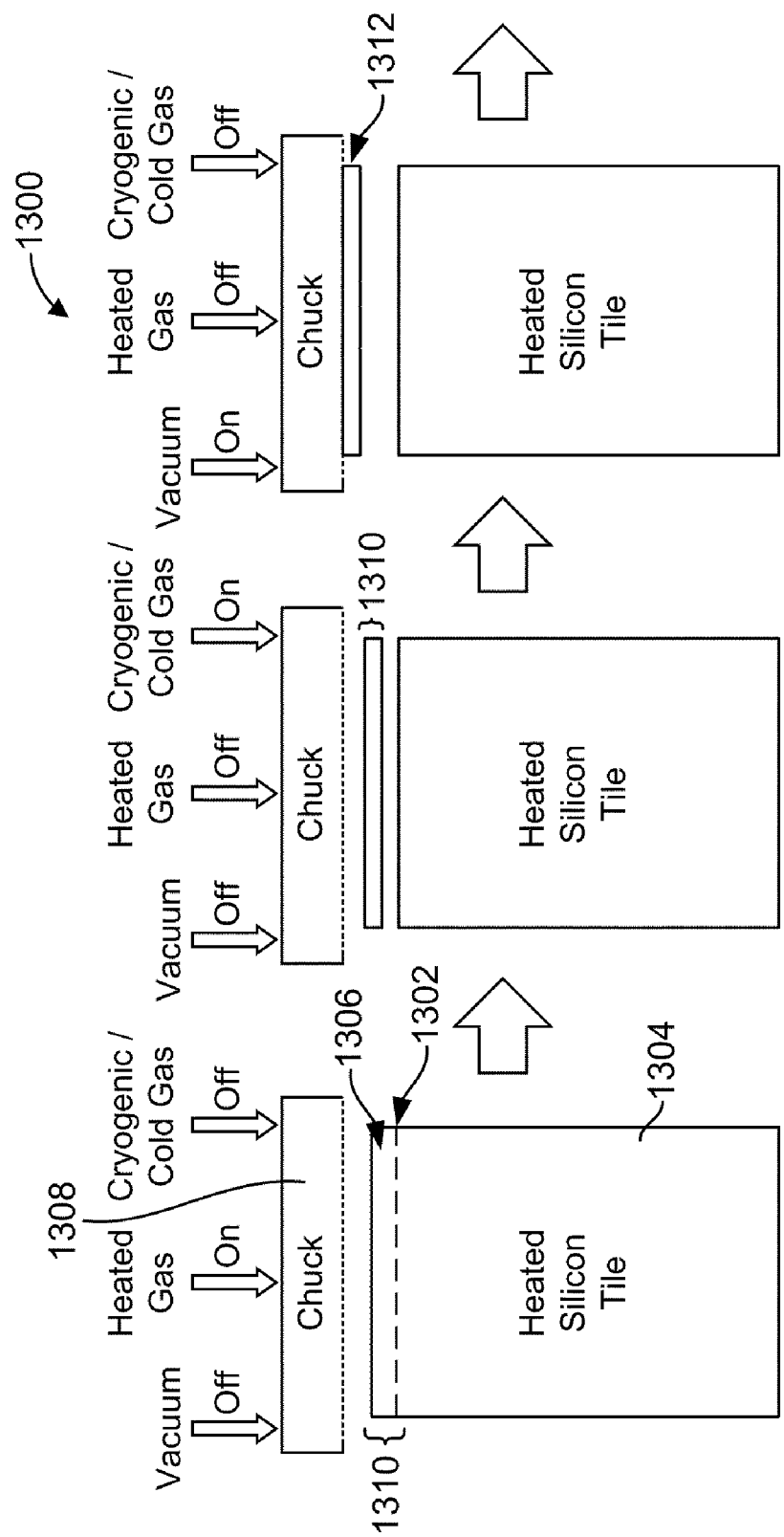
FIG. 13 illustrates a method of freeing a thickness of detachable material according to an embodiment of the present invention.

FIG. 13 illustrates a method 1300 of freeing a thickness of detachable material 1310 according to an alternative embodiment of the present invention. As shown, a cleave plane 1302 is provided in a substrate 1304 having a surface region 1306. The substrate can be a silicon wafer or the like. The cleave plane can be provided using implanted hydrogen species described elsewhere in the present specification in a specific embodiment. Other implant species may also be used. These other implant species can include helium species or a combination. In a specific embodiment, the substrate is maintained at a pre-determined temperature range. As shown, a chuck member 1308 is provided. The chuck member includes means to provide a vacuum, a heated gas, and a cryogenic/cold gas. To detach the detachable material, the chuck member is coupled to the surface region of the substrate and the chuck member release a heated gas to increase the temperature of the substrate to another range. The substrate is cooled using the cryogenic/cold gas to cause detachment of the thickness of material from the substrate. The detached thickness of material may then be removed by applying a vacuum to the surface region 1312. Of course there can be other variations, modifications, and alternatives.

In a specific embodiment, the present method can perform other processes. For example, the method can place the thickness of detached material on a support member, which is later processed. Additionally or optionally, the method performs one or more processes on the semiconductor substrate before subjecting the surface region with the first plurality of high energy particles. Depending upon the embodiment, the processes can be for the formation of photovoltaic cells, integrated circuits, optical devices, any combination of these, and the like. Of course, there can be other variations, modifications, and alternatives.

Channeling

Figure 14:
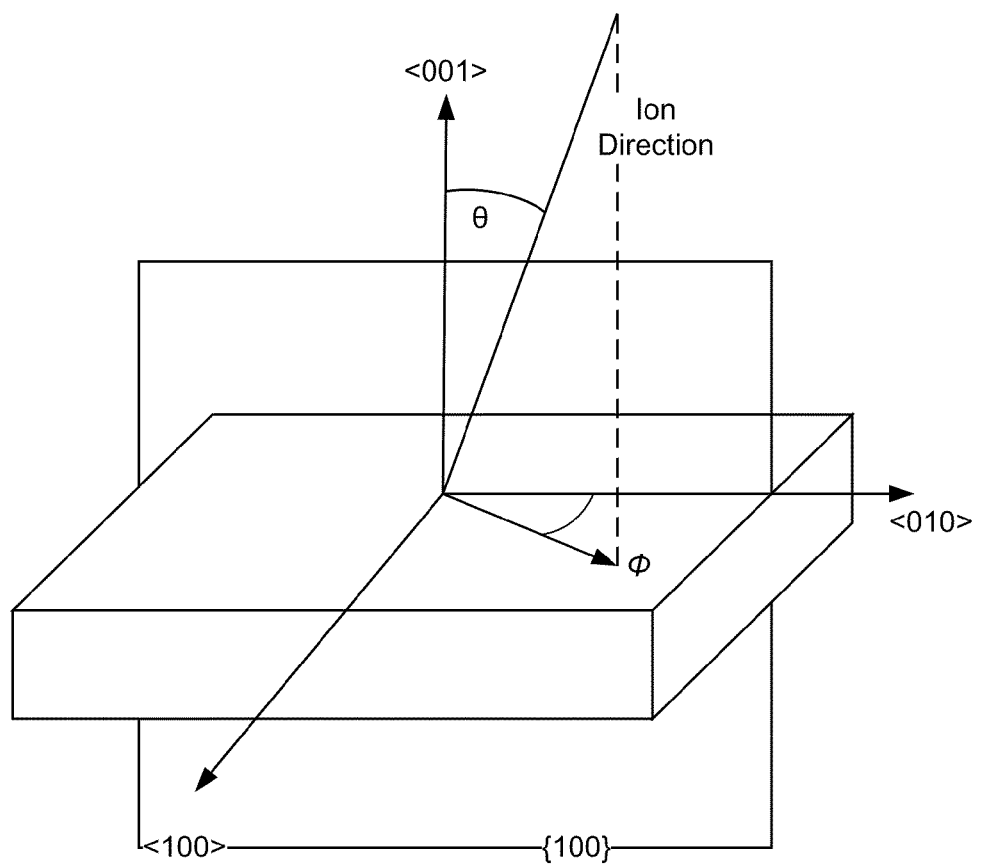
FIG. 14 shows the angles of incidence of a single ion, or a well-collimated ion beam, in relation to the crystal axes of the target substrate.

As mentioned briefly above, channeling effects can result when an accelerated particle beam is scanned over a target. FIG. 14 shows a simplified perspective view of a cone implant beam scanned in two dimensions over a <100> single crystal silicon lattice. FIG. 15 shows the lattice as viewed from the perspective of the beam. FIG. 15 indicates the existence of axes or planes in the lattice. In particular, where the beam is closely aligned with an axis or plane of the lattice, the impinging ion may travel further into the material before encountering an atom of the lattice, a phenomenon known as channeling.

Figure 16:
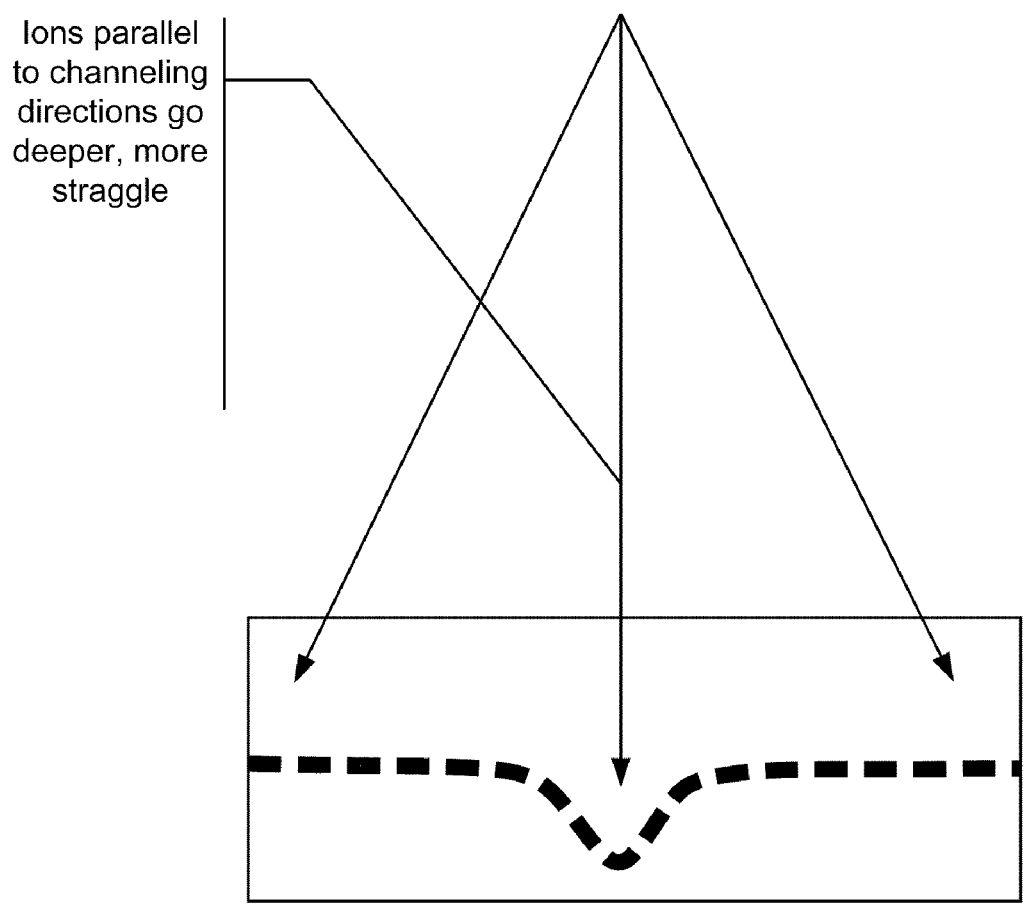
FIG. 16 shows schematically how the angle of incidence of ions in a diverging particle beam varies over the surface of a substrate and how ions will undergo channeling and penetrate more deeply in those areas where the beam is precisely aligned with the crystal planes.

FIG. 16 schematically how the angle of incidence of ions in a diverging particle beam varies over the surface of a substrate. As shown in FIG. 16, the occurrence of channeling may give rise to certain undesirable effects. Specifically, implanted particles experiencing channeling (at center) will travel more deeply into the material than particles not experiencing channeling (at edges). The channeling will affect the consistency of implant depth, resulting in a wider implant range and a broader distribution of depths (straggle).

Figure 17:
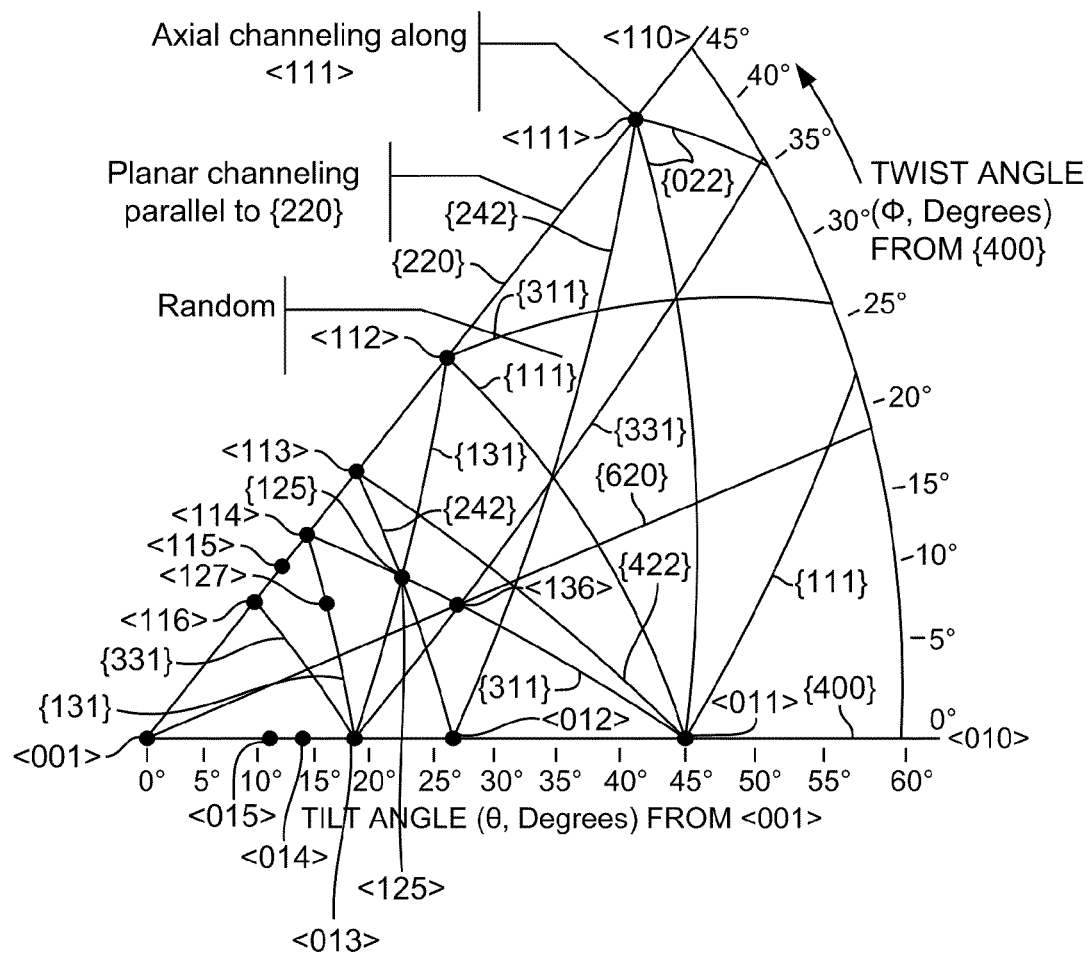
FIG. 17 shows a stereographic projection of the silicon lattice along the <100> direction illustrating the incidence angles corresponding to axial (dots) and planar (lines) channeling.

FIG. 17 shows a <001> stereographic projection of silicon, identifying different channeling phenomenon. Different types of channeling are known, including axial channeling and planar channeling. Planar channeling occurs where the incident ion direction is near parallel to one plane of the lattice. Axial channeling occurs where the incident ion direction is simultaneously near parallel to at least two planes of the lattice, and is characterized by a deeper penetration depth and a larger critical channeling angle than planar channeling.

Typically axial and planar channeling happens on the low index axes and plane. For single crystal silicon, the <100>, <110>, and <111> are three major axial channeling orientations: {100}, {111}, {110} and {112} are major planar channeling directions.

When an ion beam is spread over a range of angles as in a conical beam or a beam scanned in two directions without collimation, the angle of incidence of the ions relative to the crystal planes varies across the surface of the target. Ions will be aligned with the planes only in certain areas of the surface and where they are, channeling will occur producing a characteristic star pattern. The reason for the star pattern is straightforward. Specifically, taking a {111}-orientation wafer as an example, the major low-index planes are shown in the perspective and top views of FIGS. 18A-B. The planes represent the alternating major low miller index planes {211} and {011}. A conical beam will contain some ions parallel to these planes and therefore will exhibit channeling along a corresponding star shaped set of lines. Where they intersect in the center, the ions will exhibit axial channeling.

Channeling can also occur in other lattice orientations. For example, FIG. 19 shows channeling for a wafer having a (100) orientation. This figure shows the expected occurrence of both planar and axial channeling in a (100) wafer.

Moreover, channeling effects are not limited to implantation into monocrystalline semiconductor materials. Channeling may also occur to some extent in other forms of semiconductor materials, including but not limited to polycrystalline silicon.

If the beam scans along across the surface, whenever the beam is parallel to the green and red plane, planar channeling will happen. If the film is thin enough (thinner than the ion range Rp), some ions can channel entirely through the film and can be detected directly. However, the intensity of the transmitted ions at the ion range will necessarily show a higher intensity at axial and planar channeling locations since the ion range will be higher at these locations. Because crystal structure, the resulting intensity map will also yield the characteristic star pattern of the crystal planes.

To lower straggle and ensure a consistent range of implantation, it may be useful to employ techniques reducing channeling effects. A number of specific techniques that can be employed alone or in combination to reduce channeling, are now discussed below.

Crystal Miscut

One approach to reducing channeling is for angle of incidence of the beam to diverge from a direction normal to the lattice. In one technique, this is accomplished by providing a substrate that has been miscut. That is, the wafer may be provided having an angle between the normal to its surface, and the normal to its main crystal plane. As used herein, the term "miscut" refers to a substrate surface that is not cut parallel to any of primary crystal planes.

FIG. 20A is a simplified view illustrating the cross-section of the (0-11) plane of (111) substrate without miscut. FIG. 20B is a simplified view illustrating the cross-section of a (0-11) substrate that is miscut.

Axial channeling can be avoided using the miscut concept. A crystal miscut can be characterized by two angles: a miscut angle $\Delta\theta$ representing the angle between surface normal direction and main crystal plane normal direction shown in FIG. 20B, and the miscut direction $\Phi$, here defined from (0-11) normal plane. If the incident beam is parallel to the <111> orientation, axial channeling will occur. Considering the case with $\Delta\theta$ miscut, to avoid any incident beam line being parallel to the lattice line in FIG. 20B, the criteria should be followed that the miscut angle is greater than arctan(x/H). For example, in the case of a bean scanner apex at H=3000 mm above the substrate and a substrate size of 156 mm, x=156/2, requiring a miscut angle of at least 1.5° to eliminate axial channeling. If all the substrates are arranged to have their surfaces perpendicular to the beam cone apex, the channeling problem applies only across each wafer limiting the required miscut angle as described above.

Tilting Substrate Relative to Incident Beam

While crystal miscut may serve to desirably alter the orientation of the lattice relative to an incident accelerated beam, miscutting may offer certain disadvantages. One disadvantage is the expense of obtaining such miscut wafers, which results in the inefficient consumption of material from a boule, in addition to special handing efforts. Accordingly, other techniques may be employed alone or in combination with miscut, in order to reduce or eliminate channeling effects. One such technique is tray tilt.

In particular, the angle between the wafer surface normal and the ion beam is called the tilt angle. A non-zero tilt angle may be employed to reduce or eliminate channeling effects.

Figure 21A:
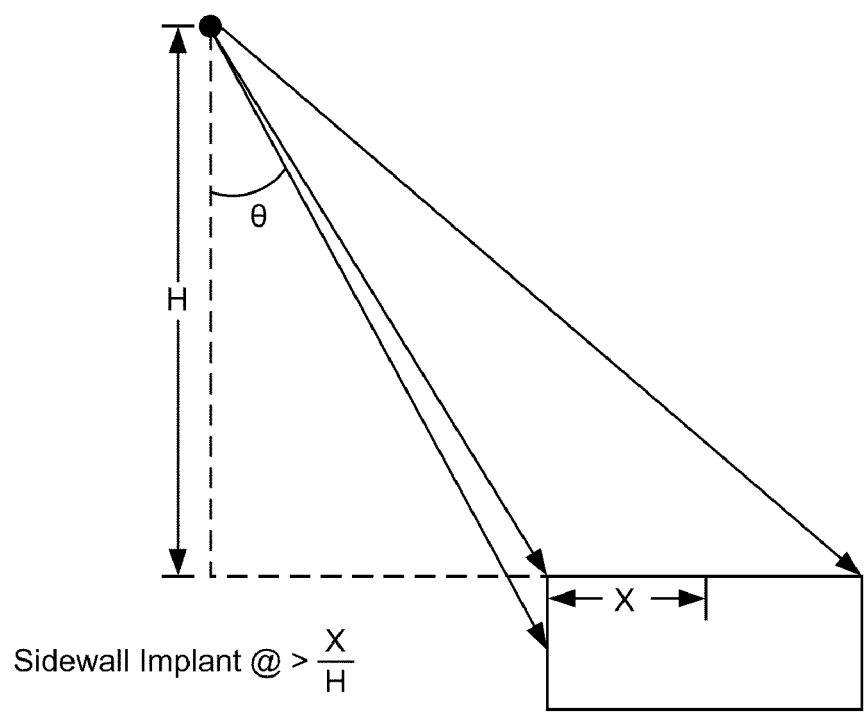
FIG. 21A depicts a general case for avoiding implantation of ions into a substrate sidewall.

As an initial matter, it is noted that there are intrinsic limits to the amount of tilting to which a substrate can be subjected. For example, FIG. 21A shows a simplified view of an accelerated particle beam originating from point O at a height H above a substrate S, being scanned across the surface of the substrate. Where the angle theta ($\theta$) between the normal to the substrate lattice and the scanned beam exceeds X/H (X being one-half the substrate width), the beam of accelerated particles will impact the substrate sidewall S' rather than the substrate surface. Such sidewall impact is highly undesirable, as it will result in implantation of particles in regions not corresponding to the cleave region.

Figure 21B:
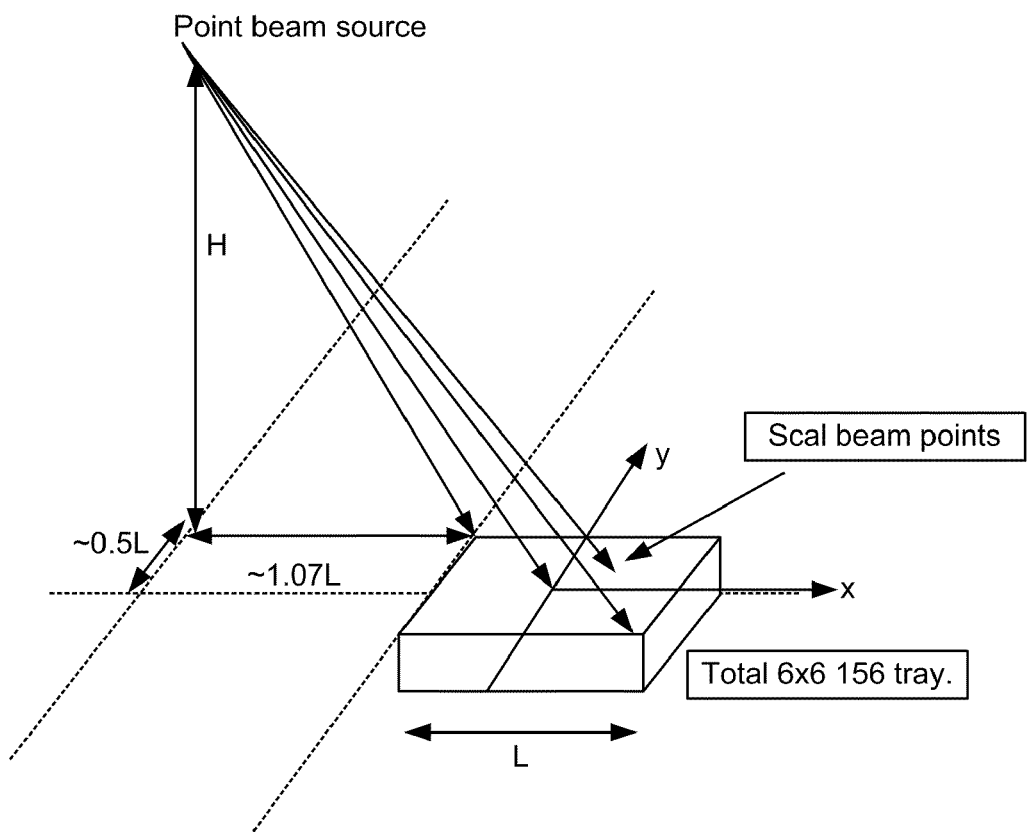
FIGS. 21B and 21C depict a general analysis for approaches to avoiding channeling in accordance with embodiments of the present invention.
Figure 21C:
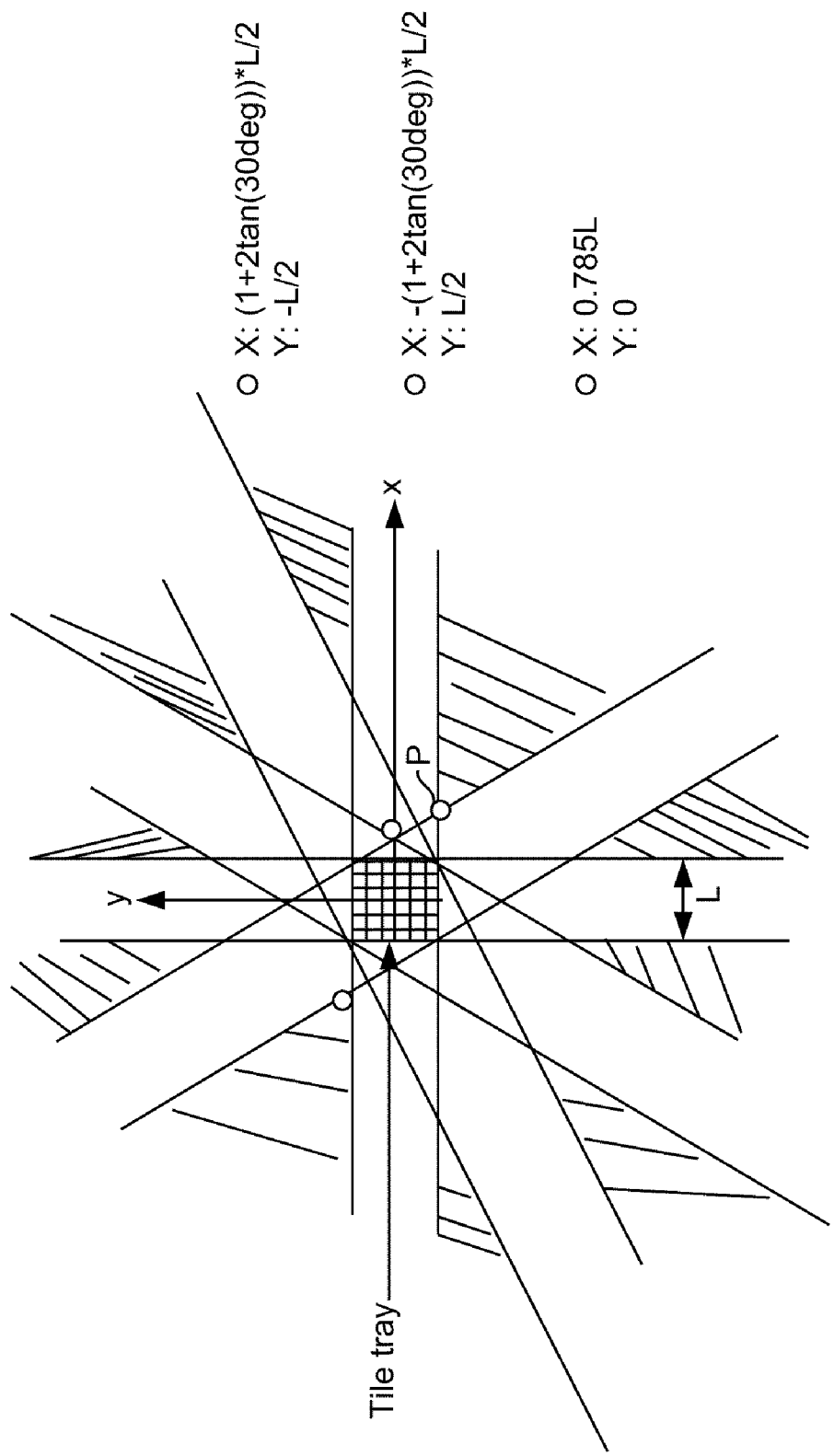

Thus, this relation between $\theta$, X, and H imposes a restriction on the maximum angle of $\theta$ if sidewall implant it to be avoided. In the particular case where H=3m and X=78 mm, the maximum value of theta is 1.5 degrees FIGS. 21B and 21C depict a general analysis for approaches to avoiding channeling in accordance with embodiments of the present invention. Specifically, FIG. 21B shows a perspective view of a beam scanning across a target substrate or tray supporting multiple tiles. FIG. 21C shows an overhead view of the target tile/tray. In these Figures, the dimension L can be one length of a tile, or the length of a tray supporting multiple tiles.

In FIG. 21C, if the projected point of the point beam source is located in the hashed area, any channeling issue will be zeroed-out. Point P in FIG. 21C is the closest point where no axial channeling will occur. Achieving this can involve tilting the tile/tray relative to the incident beam, or in certain embodiments a combination of both miscut and tilting of the substrate. For one tile case, the tilt angle can be 3.2°.

Figure 22B:
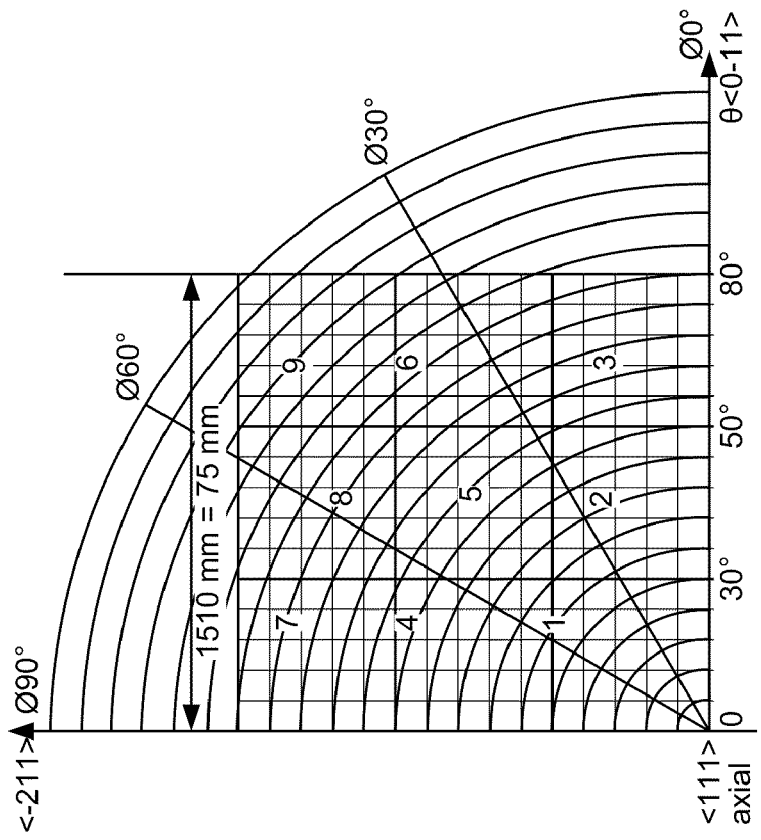
FIGS. 22A and 22B are perspective views showing the scanning of an ion beam in one embodiment of a system according to the present invention.
Figure 22A:
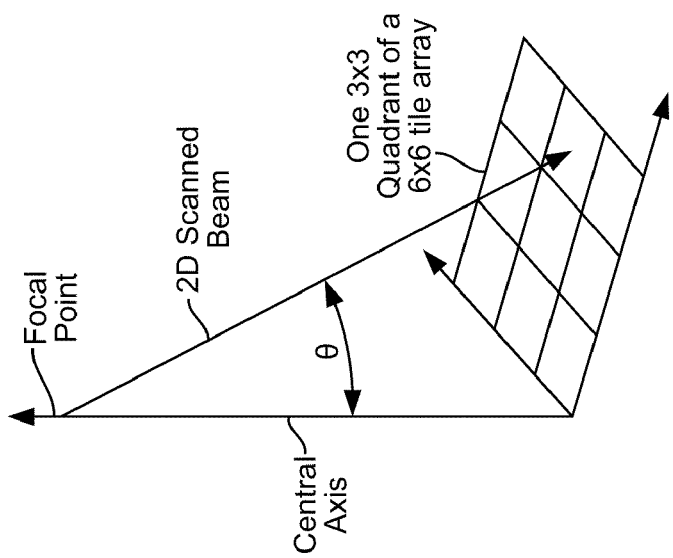

FIG. 22A is a perspective view showing the scanning of an ion beam in one embodiment of a system according to the present invention. Specifically, FIG. 22A shows an embodiment with a tray having a total length L (~1m) and supporting an array of 6×6 tiles of width 156 mm. In this particular embodiment, the central axis height (H) of the beam above the tray, is 3 m. FIG. 22B is a top view of the system of FIG. 22A, showing the locations of different tiles on the tray.

As shown in FIGS. 22A-B, assuming no tile miscut, the beam and tile relative positions can be characterized by ($\theta$, $\Phi$), and calculated $\theta$ and $\Phi$ are shown. When both $\theta$ and $\Phi$ are 0°, the Tile 1 in FIG. 22B will experience the most pronounced ion channeling, including the major <111> axial channeling as well as major {011} and {211} planar channeling. There will be no channeling at the location of Tile 9. Tiles 4, 2, 8, and 6 will experience planar channeling. If {211} channeling is ignored, and only {110} channeling is considered, tiles 6, 7, and 9 will have no major channeling issues.

Considering avoiding axial channeling only, the smallest tilt angle for the whole 6×6 trays will be 8.9°. Trim simulations indicate that the range of the ion (random range Rp) changes from 150 μm at a tilt angle of 0°, to 146 μm at a tilt angle of 8.9°. The total thickness variation (TTV) within one tile will be 1 μm, which gives TTV of ~0.6%.

Dithering

Embodiments of the present invention offer approaches for avoiding the channeling problem without the use of collimating ion-optics elements. In one embodiment, during the process of ion implantation, the substrate (or substrates) may be tilted back and forth, or 'dithered', over a range of angles over time. Channeling still occurs, but the dithering spreads the channeling effect more uniformly over the area of the substrate(s). Thus, where formerly there would have been a high probability of channeling in a small fraction of the area receiving the beam, there is now a low probability of channeling almost uniformly spread over the entire surface. This results in a consistent and uniform cleaving process. As used herein, the term 'dithering' also refers to other forms of repeated motion of a substrate, including but not limited to rotation, tilting along two axes, or tilting along one or two axes in combination with rotation.

Figure 23:
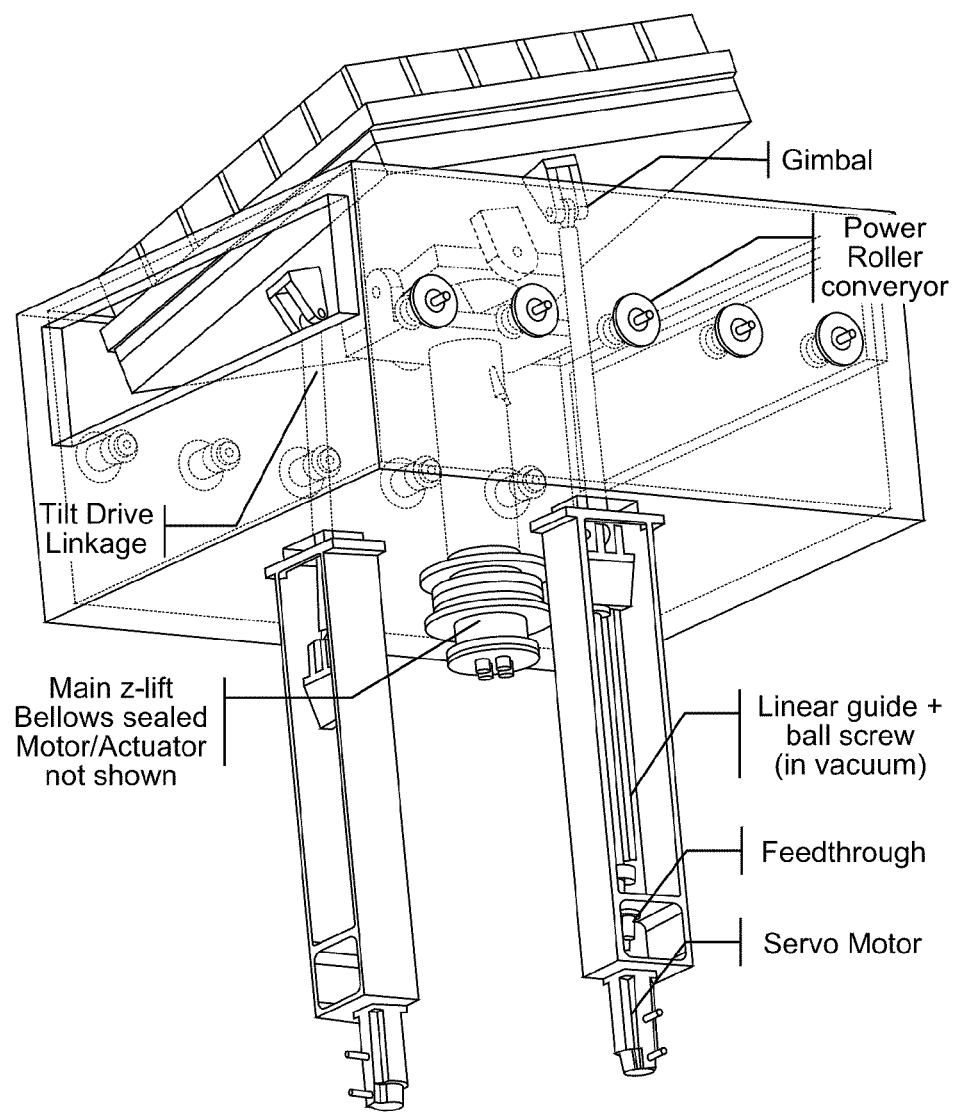
FIG. 23 shows a perspective view of an apparatus configured to impart dithering.

FIG. 23 shows a schematic view of an apparatus configured to impart dithering. The apparatus of FIG. 23 is configured to allow slow tilting of a platen supporting a plurality of bulk substrates, in order to achieve anti-channeling action. A tip/tilt gimbal concept is shown, employing 12° tip and 12° tilt utilizing a ball screw and linear guides in vacuum. This particular device utilizes a motor in air with ferrofluid feedthrough, and specifies a tilt frequency at 0.2 Hz. The device can be designed for a high speed tilt for synchronization with slow magnetic scan axis frequency.

While the specific embodiment shown in FIG. 23 allows for dithering movement in two dimensions, this is not required by the present invention. According to alternative embodiments, a scan stage according the present invention may allow for dithering movement in only one dimension. Further embodiments of the present invention may allow for dithering motion along one axis, while offsetting the lattice of the substrate relative to the beam at a constant tilt along another axis.

Figure 23A:
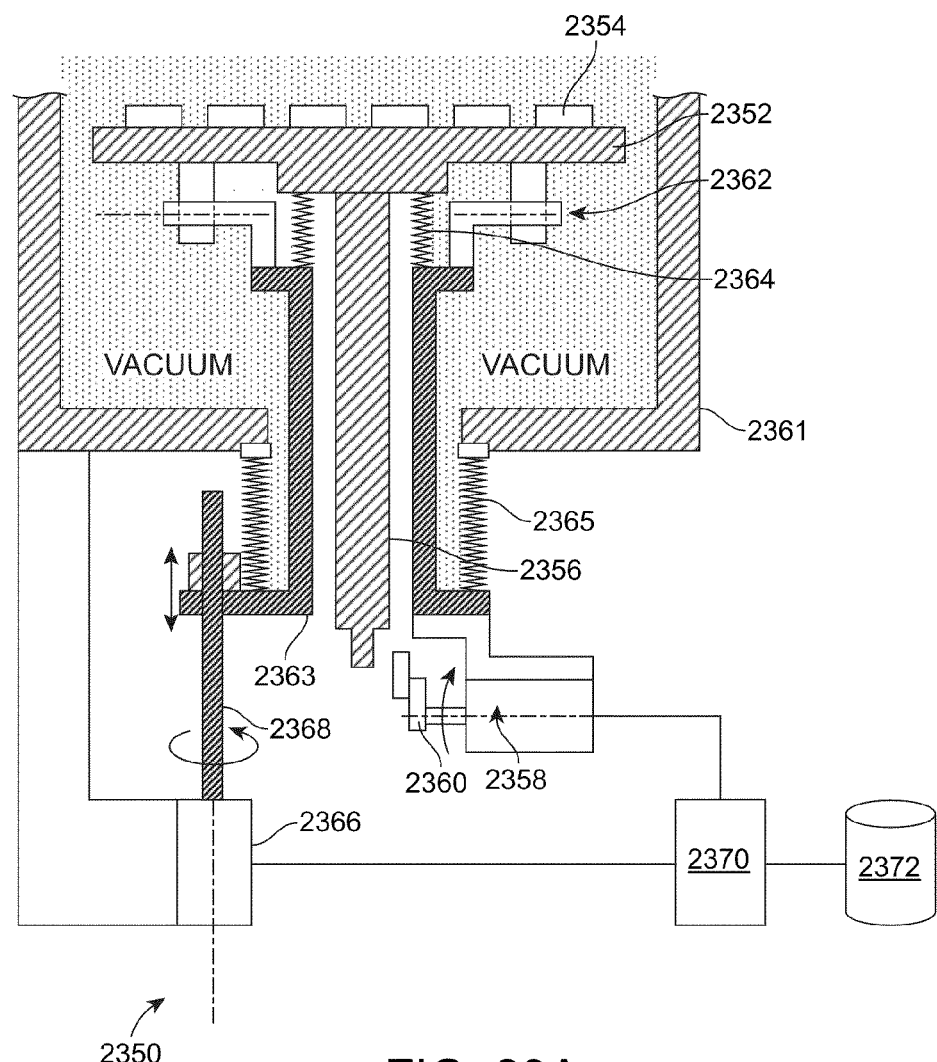
FIG. 23A shows a cross-sectional view of an alternative embodiment of an apparatus configured to impart dithering.

FIG. 23A shows an alternative embodiment of an end station apparatus of a particle implanter in accordance with the present invention. The end station apparatus 2350 comprises a platen 2352 with cooling blocks 2354, that is supported on a platen tilt arm 2356. This platen is moveably positioned within a process chamber 2361.

In particular, the platen tilt arm is in communication with a mechanical element such as a tilt motor 2358, through a crank arm 2360. The tilt motor is in electronic communication with a system controller 2370. Controller 2370 is further in electronic communication with a computer-readable storage medium 2372, having stored thereon code for instructing actuation of the tilt motor.

Movement of the platen and platen tilt arm within the process chamber 2361 occurs along an axis extending into the page. This movement of the platen and the tilt arm is allowed by hinges 2362 with frame 2363, and accommodated by tilt bellows 2364.

The platen including the cooling blocks and the associated tilt arm, are also configured to be moved in a vertical direction relative to an overlying grid-like pallet. The pallet is not shown in this figure, but is shown and described below in connection with FIGS. 36A-C.

Specifically, a platen lift assembly comprising a lift motor 2366 and ball screw 2368 in physical communication with frame 2363, may be used to raise and lower the platen within lift bellows 2365 relative to the pallet. This allows the platen to engage, lift, and incline the tiles seated on the pallet, in preparation for implantation with accelerated particles. The lift motor is also in electronic communication with system controller 2370.

Lowering the platen subsequent to implantation by the platen lift assembly serves to re-seat the substrates (and any associated supporting pedestals) within the pallet. The substrates/pedestals can then be removed from the end station, and subjected to any additional processing.

In certain embodiments, dithering under high energy (4 MeV plus) implants may reduce channeling influence by changing the angle between beam and crystal face utilizing the tilt angle of plane or angle of the beam, such that the relative angle is not within one or smaller angles that results in cleave failures, etc. (sub percent within about 1 percent or so), resulting in a total thickness variation (TTV) of less than 1 percent (single percent range) to five percent TTV. By contrast, channeling leads to dimples of 25% or greater.

Figure 24B:
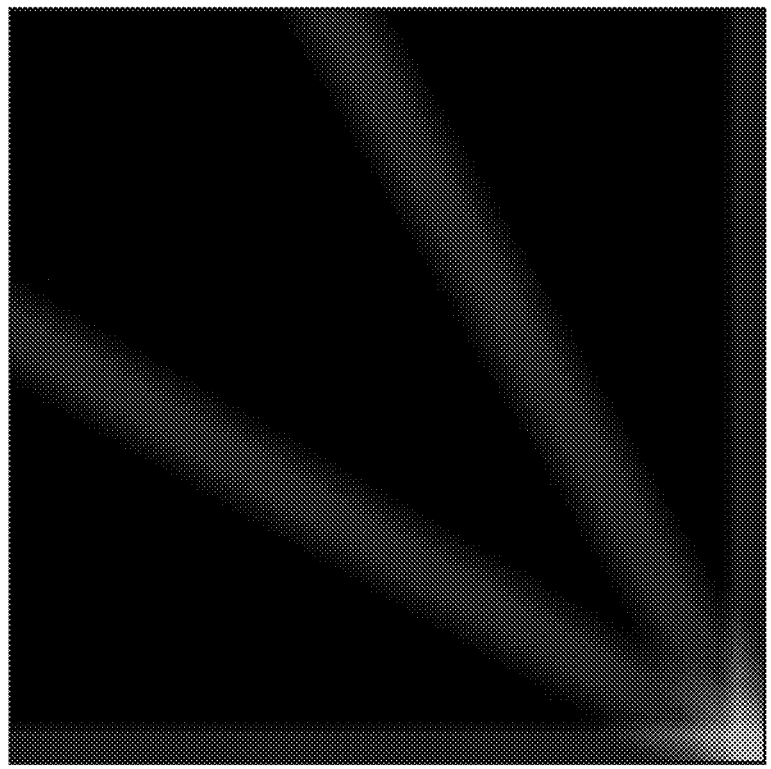
FIGS. 24A and 24B show the results of the effects of dithering on implant character.
Figure 24A:
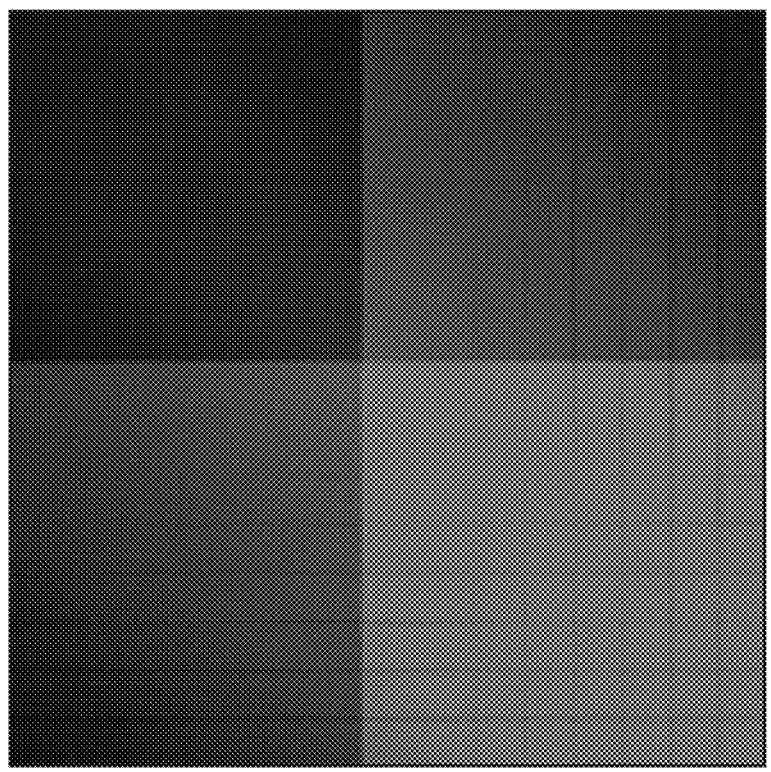

FIGS. 24A and 24B show the results of the effects of dithering on implant character. These figures assume a 1 m×1 m tray exposed by conical ion source at a height of 3 m, with a critical planar channeling angle=0.1 degrees.

FIG. 24A shows implantation with no dithering, with a beam divergence of +/−1 degree. FIG. 24A shows that planar channeling is apparent and non-uniform, with a maximum probability of about ~67% shown in the bright areas.

By contrast, FIG. 24B shows implantation with dithering of +/−5 degrees. FIG. 24B shows that planar channeling is much reduced, with a with a maximum probability of about ~8.4%. In FIG. 24B, the color scale has been rescaled with red=max, and black=0. Dithering to an even greater degree (i.e. +/−10 degrees) should produce an even higher uniformity of implantation.

Figure 25:
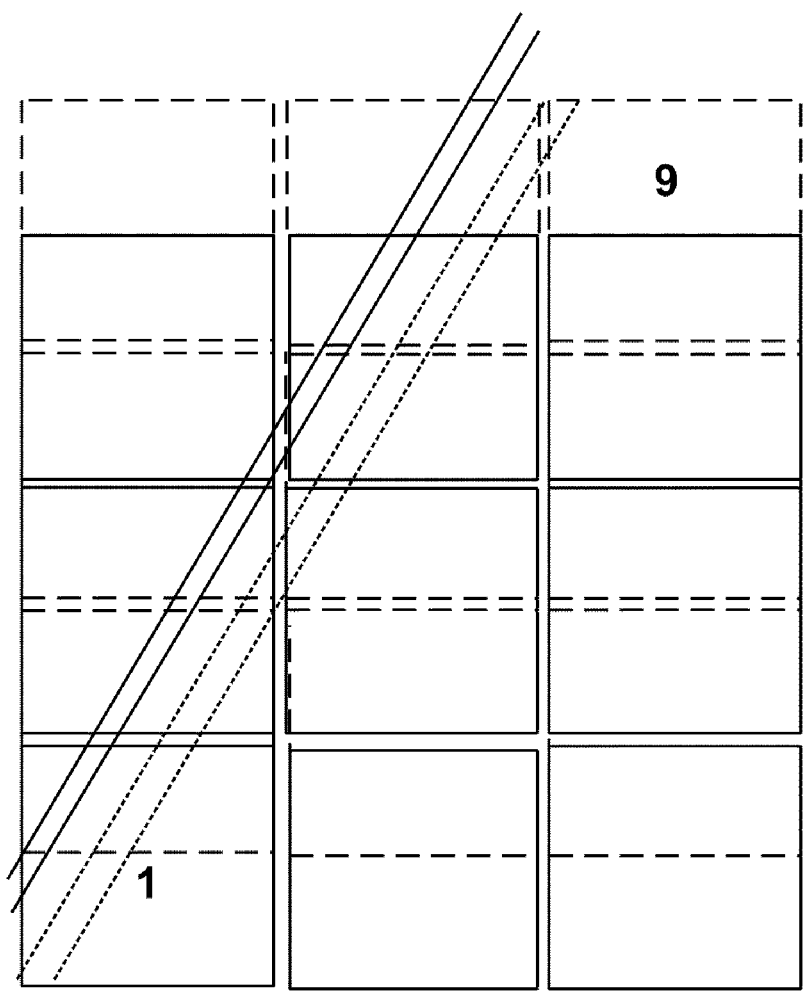
FIG. 25 shows a top view of an embodiment of the present invention for conducting dithering.

FIG. 25 shows an embodiment of dithering. In particular, by simply moving a target tray upward, the planar pattern will move accordingly, thereby diluting channeling ion concentration in any one region.

Figure 26:
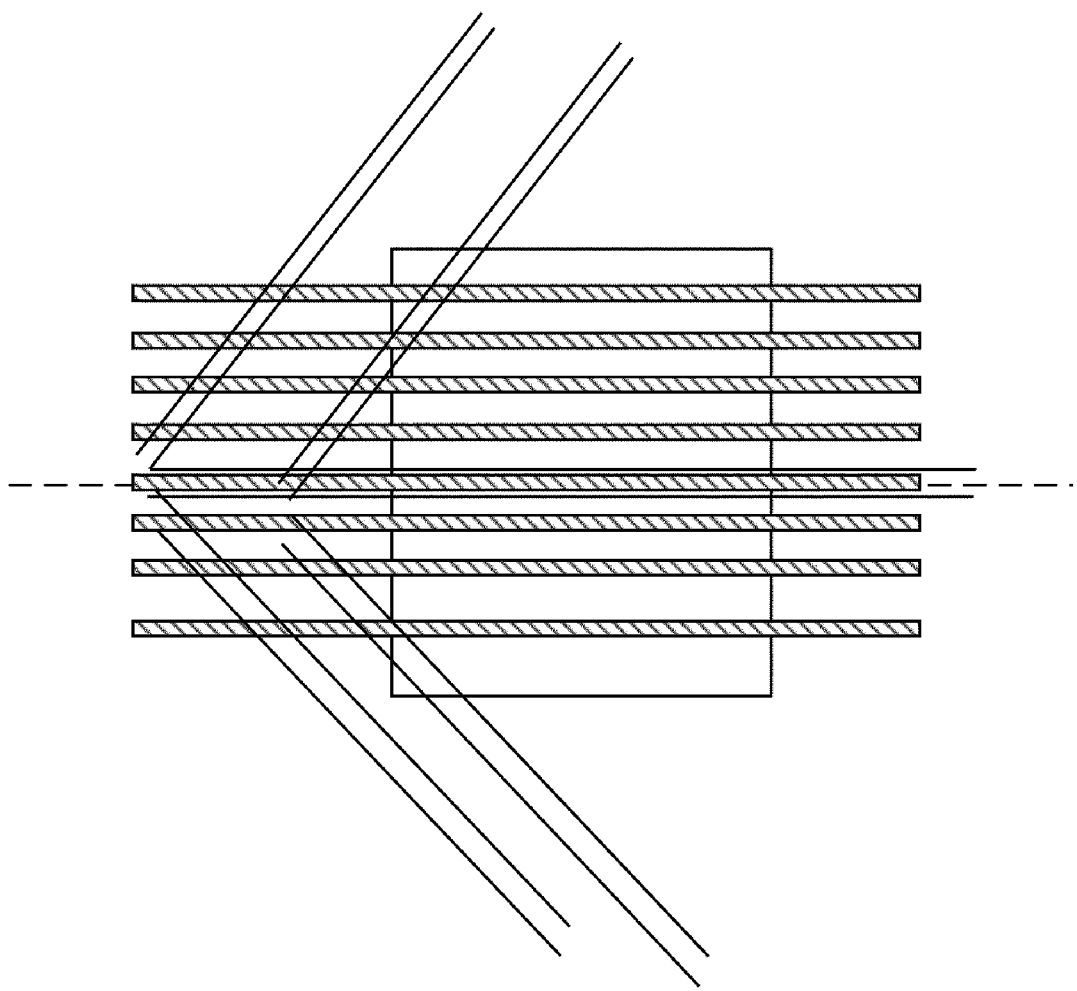
FIG. 26 shows a top view of another embodiment of the present invention for conducting dithering.
Figure 27B:
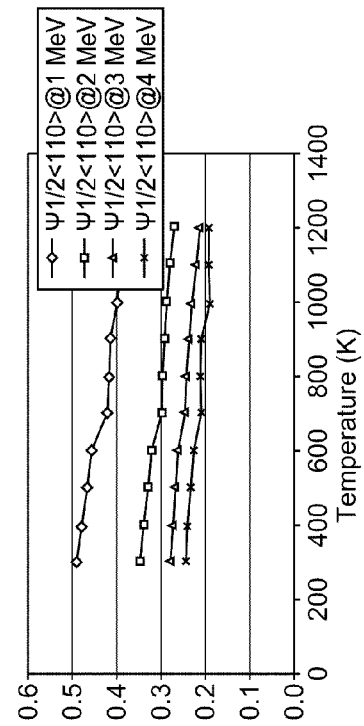
FIGS. 27A-D plot half angle versus temperature for different implantation conditions.
Figure 27D:
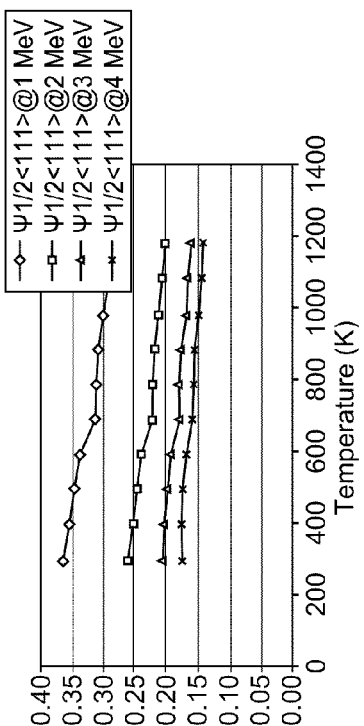
Figure 27A:
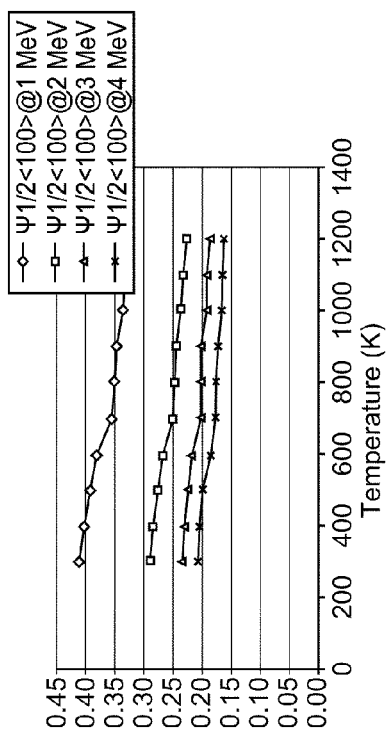
Figure 27C:
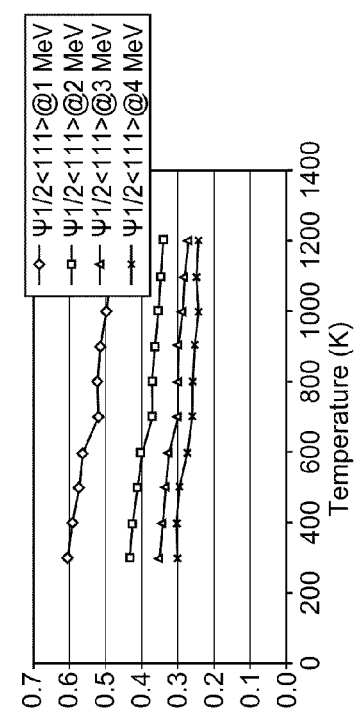

FIG. 26 shows another depiction of the dithering process. Under this configuration, miscut is used in combination with slow axis dithering. Here, the miscut angle for avoiding axial channeling is not less than 1.5°. In order to average planar channeling under this embodiment, twisting of the tiles or trays is employed. The twist angle needs to be 3.2°, which requires 3.2° miscut instead of 1.5°.

According to embodiments of the present invention, the desired dithering movement can be accomplished by movement of individual tiles supported on a tray, and/or by movement of the entire tray. It is also possible to synchronize the dithering or tilting motion of the tray with the position of the ion beam on the surface of the tray, thereby synchronizing the angle of the tray and the scanning angle of the ion beam. This allows the relative angle between the beam and the substrate surfaces to remain relatively fixed.

In certain embodiments, the timing of a dithering motion of the substrate may be coordinated with the timing of scanning movement of the beam on the platen, so that the planes of the crystal are not aligned at a particular location when the beam impinges that location. Such temporal coordination between scanning movement and dithering motion may serve to ensure continuous misalignment of the crystal planes from the beam, reducing channeling effects independent of other techniques that offset the substrate face relative to the beam (such as miscut or fixed tilting).

Finally, as indicated above channeling is not limited to monocrystalline substrates undergoing particle implantation. As some channeling may occur even in substrates exhibiting limited ordered structure, embodiments of the present invention may employ dithering during implantation of particles into other forms of semiconductor material, including but not limited to polycrystalline silicon.

Shuffling of Tile Position Over Repeated Implants

In a particular embodiment, a tray bearing an array of 6×6=36 tiles will experience, depending on film thickness, up to thousands of separate implantation steps. To ensure uniformity, it is important to avoid accumulation of any planar channeling patterns. One way to avoid such accumulation is to "reshuffle" the tiles by rotating them within the tray, and/or divide each tray into four parts. Each quadrant of the tray can be rotated 180° to help wash out any developing channeling patterns.

For example, in one embodiment, after twenty successive cleaves, each quadrant of the tray could be rotated 180°. In such case, as shown in FIG. 25, Tile 9 (which never experienced planar channeling) would replace the location of tile 1, and tile 1 would move to occupy the former position of tile 9. Such a reshuffling approach would be effective to eliminate unwanted "burn-in" of a planar channeling patterns over multiple implants.

Heating

It is known that the temperature will affect the thermal vibration amplitude of atoms in a lattice. This vibration amplitude in turn affects the character of the channeling that may occur.

One quantitative measure of channeling is the channeling half-angle ($\psi_{1/2}$). FIGS. 27A-D are the estimated results of half-width angle at zero depth of three major axial channeling events. From these figures, we can see that at the same incident proton energy, $\psi_{1/2}$ slowly decreases with increasing implant temperature. Thus according to embodiments of the present invention, the temperature of the target material during implantation process may be carefully controlled as a further technique in eliminating or avoiding channeling.

While various techniques for avoiding channeling have been discussed individually above, they may also be employed in combination with one another. For example, in one embodiment, a target tile may be tilted only part of the necessary amount to move the channeling location off of its surface, with the remainder of the offset amount being provided by miscutting of the substrate. In still other embodiments, the substrate may be offset from the implantation beam along one axis by tilting or a combination of tilting/miscut, with dithering motion taking place along the other axis.

Figure 28:
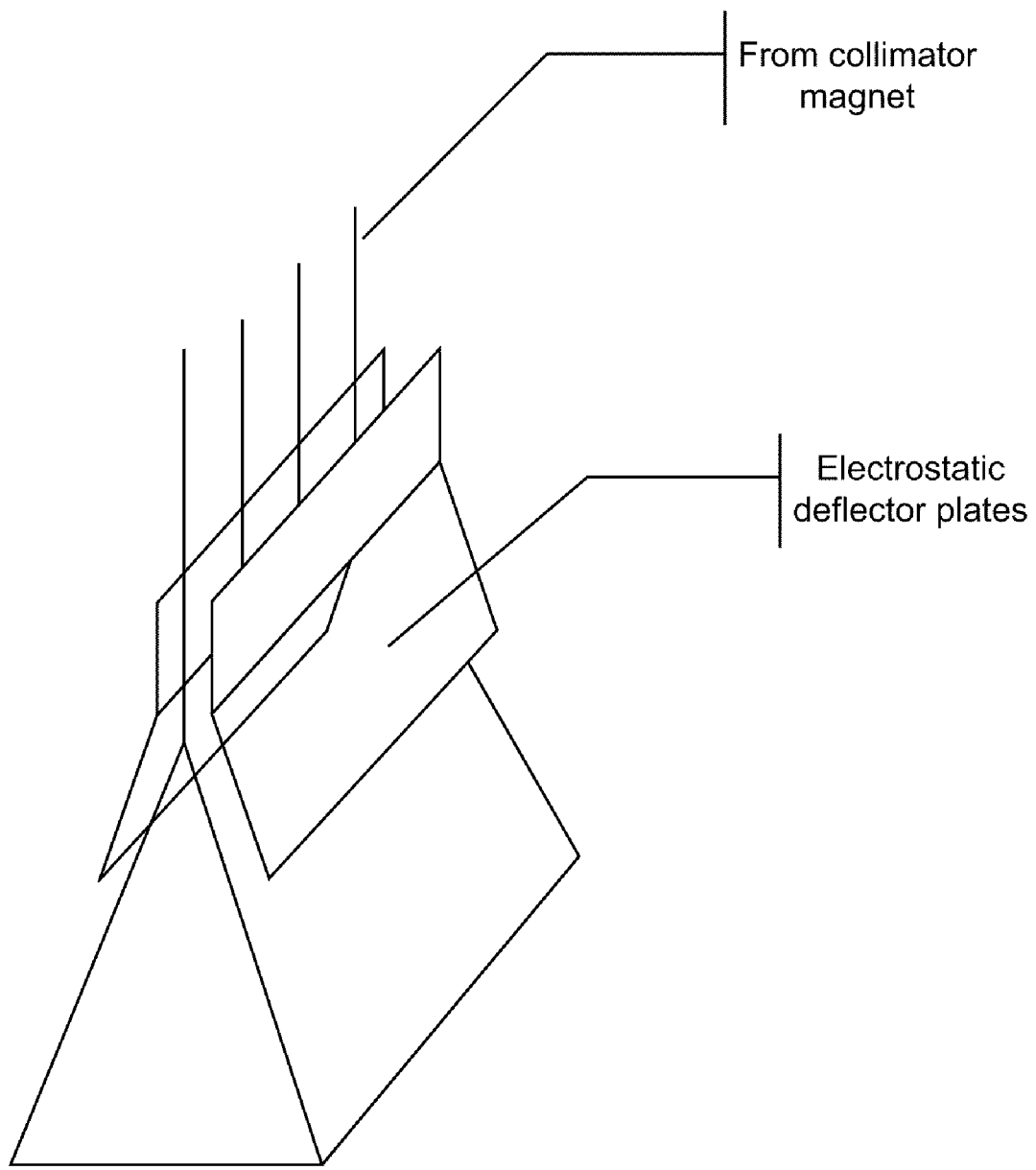
FIG. 28 shows an alternative approach to dithering.

Still another approach to avoiding channeling is shown in FIG. 28. Under this approach, a parallel magnetic scan in 1D, is followed by a diverging electrostatic scan in orthogonal direction. Such action would provide a wedge beam that is parallel in one dimension and divergent in the other. Such an approach can eliminate channeling through use of fixed substrate tilts and/or miscuts, without requiring dithering motion of the substrate. This case is also functionally identical to the case of a beam scanned in one dimension into a fan-shaped beam, while the substrate tray is moved mechanically through the beam in the orthogonal direction. Again, channeling can be eliminated through use of fixed substrate tilts and/or miscuts, without requiring dithering motion of the substrate.

One-Dimensional Scanning

While the above-referenced discussion has focused upon scanning an accelerated particle beam in two dimensions, embodiments in accordance with the present invention are not limited to such an approach. In an alternative embodiment, the beam may be scanned in one dimension, while the target tile/tray is physically translated in an orthogonal dimension. By magnetically or electrostatically collimating the beam in the scanned direction, the beam will impinge the surface of the substrates at a single angle or a very narrow ranges of angles with minimal variation of incidence angle over an entire tray of substrates. The elimination of channeling in this case is relatively easy by a combination of fixed and equal tilting of all substrates and or fixed and equal miscutting of all substrates.

Additional Features

Embodiments in accordance with the present invention relate generally to techniques including methods and systems for forming free-standing films using temperature controlled high energy implantation and cleaving from spatially configured substrates in bulk form, such as a silicon ingot. Such free-standing films are useful as a photovoltaic material such as a solar cell. But, it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, semiconductor substrate manufacturing, biological and biomedical devices, and the like.

A free-standing film of semiconductor material having a thickness of 10 µm or greater, may be cleaved from a bulk substrate utilizing implantation of an ionic species at a desired surface temperature. In an embodiment, the cleaving involves removably clamping spatially configured bulk substrate materials on a temperature controlled stage or platen using chemical bonding, a mechanical clamp device, or a magnetic clamp device; then implanting particles such as ions at a first, lower temperature to create a cleave region; followed by implanting particles such as ions at a second, higher temperature to enhance stress in the cleave region.

In another embodiment, the bottom of the bulk substrate material can be glued (e.g. using thermally conductive glue or thermally conductive epoxies) to a thermal and mechanical pedestal or a pedestal/framed pallet combination which can facilitate the mounting and handling of the bulk substrate material.

In yet another embodiment, a conductive pad (such as a silicone pad) may be added between the pedestal (and/or the open frame pallet) and the temperature controlled stage or platen over a mechanical base.

In other embodiments, backside gas with adjustable pressure can be used to create a thin conductive layer to facilitating thermal conduction between the pedestal or pallet and the platen. The gas can be guided along certain distribution groove within the conductive pad and sealed by a ring shaped lip seal when the pedestal engages with the platen with the conductive pad. By adjusting the gas pressure the heat transfer from the work surface of the bulk substrate material to its bottom bonded to the pedestal or pallet, thereby providing control to the surface temperature and temperature gradient for implantation and cleaving process.

Depending upon the particular embodiment, the pedestal can be configured to have a proper size to fit in an open grid pallet and be independently adjustable in height and tilting angle relative to a base plane of the open grid pallet. In accordance with certain embodiments, the pedestal can be reused on other bulk substrates. The resulting cleaved free-standing films of semiconductor material, such as single crystal silicon, are particularly suited for use in the collection of solar energy.

In a specific embodiment, the present invention provides a system for manufacture a free-standing film from a bulk substrate. The system includes a platen disposed on a mechanical base and clamped with a pedestal by a clamp device. The pedestal is bonded to a bottom surface of a bulk substrate with a top surface exposed. The system further includes an implant subsystem configured to introduce an ionic particle beam into at least the entire top surface of the bulk substrate. Furthermore, the system includes a controller coupled at least to the implant subsystem and the clamp device of the platen. The controller is also configured to send one or more automation signals to the clamp device for adjusting the platen spatially so that the top surface of the bulk substrate has a suitable orientation relative to the ionic particle beam during an implantation process.

In another specific embodiment, the present invention provides a system for large scale manufacture of free-standing films from bulk substrates. The system includes a plurality of platens arranged on a mechanical base in 6×6 matrix configuration. Each platen is clamped with a pedestal fitted using a clamp device through an open grid unit of an open frame pallet. Each pedestal is bonded to a bottom surface of one of a plurality of bulk substrates with a corresponding top surface exposed. The system also includes an implant subsystem configured to introduce an ionic particle beam into at least the top surface of each of the plurality of bulk substrates. Furthermore, the system includes a controller coupled at least to the implant subsystem and the clamp device of each of the plurality of platens. The controller is further configured to send one or more automation signals to the clamp device for individually adjusting each platen spatially so that the top surface regions of the plurality of bulk substrates have corresponding suitable orientations relative to the ionic particle beam during an implantation process.

Numerous benefits may be achieved over pre-existing techniques using embodiments of the present invention. In particular, embodiments of the present invention use an high energy ion implantation process and a controlled cleave process to transfer a free-standing film directly from a spatially configured bulk substrate. In a preferred embodiment, the present method and device advantageously reduces or substantially prevent ion channeling effect in the processing of crystal substrates such as silicon with the ion beams. Channeling is a process wherein those incident ions that are precisely aligned with a crystal plane or axis of the substrate penetrate the substrate to anomalously large depths and also show large variability in the depth of penetration. In most surface areas of the bulk substrate the channeling effect will not occur, but where it does it can produce catastrophic results during or after cleaving the free-standing film. By fixedly inclining the bulk substrate surface crystal axes slightly relative to the beam axis, the channeling effect may be prevented entirely or be pushed near the edges of substrate. Therefore, a substantially uniform depth defined by a cleave plane or cleave region beneath a surface of a well prepared bulk substrate can be formed within the surface area of the bulk substrate. This results in a consistent and uniform cleaving process. The thickness of transferable material may be further processed to provide high quality semiconductor films with uniform thickness for application such as photovoltaic devices, 3D MEMS or integrated circuits, IC packaging, semiconductor devices, any combination of these, and highly efficient photovoltaic cells.

In a specific embodiment, the present method can be applied successively to cleaving multiple free-standing films or slices from a single ingot, e.g., silicon tile with a thickness less than 10 cm. That is, the method can be repeated to successively cleave slices (similar to cutting slices of bread from a baked loaf) according to a specific embodiment. It is found that embodiments of this invention can be applied to make thin silicon slice in 20 μm or less to 200 μm or more in thickness and an 156 mm×156 mm or 125 mm×125 mm form factor for standard PV cell applications. In another embodiment, the present method and structure use a temperature control stage or platen to hold a plurality of bulk substrates spatially configured to be exposed to a raster-scanned energetic particle beam with proper dosage. Other radiations from electrons, photons can be added for additional temperature control or direct thermal treatment during the cleave process.

Numerous additional benefits may be achieved over pre-existing techniques using embodiments of the present invention. In particular, embodiments of the present invention can utilize a cost effective particle accelerator device and method for providing a high energy implant process for layer transfer techniques. In certain embodiments, the particle accelerator may comprise a DC Electrostatic accelerator, such as a Dynamitron, Van de Graaff, Tandem Van de Graaff, accelerator. Alternatively, the particle accelerator can comprise a radio frequency (RF) particle accelerator, such as a cyclotron or a RF linear accelerator (RF Linac). Examples of such RF particle accelerators comprise a Radio Frequency Quadrupole, commonly called RFQ, or combinations of these, (for example, a RFQ combined with a Drift Tube Linac or a RFI (RF-Focused Interdigital) Linear Accelerator), and others. In certain embodiments, the present invention may provide a beam of accelerated particles from a cyclotron.

In an embodiment, the present invention provides a clamping and/or holding device and related method for securing a bulk substrate for achieving a stable mechanical and thermal condition for the implant and cleave processes. Additionally, the present method and structurally allow for volume production of free-standing films using repeated implant/cleave processes over a plurality of bulk substrates clamped over the temperature controlled platen in a transfer tray. In an alternative embodiment, embodiments according to the present invention may provide a seed layer that can further provide for layering of a hetero-structure epitaxial process. The hetero-structure epitaxial process can be used to form thin multi junction photovoltaic cells, among others. Merely as an example, GaAs and GaInP layers may be deposited heteroepitaxially onto a germanium seed layer, which is a transferred layer formed using an implant process according to an embodiment of the present invention. Of course, there can be other variations, modifications, and alternatives.

Embodiments in accordance with the present invention relate generally to techniques including methods and systems for forming free-standing films using temperature controlled high energy implantation and cleaving from spatially configured substrates in bulk form, such as a silicon ingot. Such free-standing films are useful as a photovoltaic material such as a solar cell. But, it will be recognized that the invention has a wider range of applicability.

As used herein, the term "bulk material" can refer to a predominantly homogenous piece of single crystal or polycrystalline material standing alone, for example a single crystal silicon tile or a portion thereof. In certain examples, metallurgical silicon (lower graded silicon) tile or ingot can be used. Alternatively, for purposes of the instant patent application the term "bulk material" can also refer to the predominantly homogenous single crystal or polycrystalline material in conjunction with one or more additional elements, for example the various adapter plate embodiments described below, as well as any o-rings or other elements employed to secure such an adapter plate to the predominantly homogenous single crystal or polycrystalline material.

A free-standing film of semiconductor material having a thickness of 15 μm or greater, may be cleaved from a bulk material utilizing implantation of a high energy ionic species at an energy level of a few MeV. In one embodiment, the cleaving involves implanting a certain dose of high energy ions at a first, lower temperature to create a localized initiation region (usually near an edge or corner area), and then implanting lower dose of ions at a second, higher temperature over all area (via scanning the beam over surface) to form a cleave region. Cleaving can then be initiated from the initiation region and a controlled propagation can be guided along the cleave region, leading to a separation of a free-standing film from the bulk material. The formation of free-standing films from the bulk material in this manner substantially reduces the amount of semiconductor material that is conventionally lost to the kerf of a blade or wire cut. The resulting free-standing film of semiconductor material, such as single crystal silicon, is particularly suited for high graded single crystal solar cells.

For purposes of the following disclosure, a "free-standing film" is defined as a film of material that can maintain its structural integrity (i.e. not crumble or break apart), without being in contact with a supporting member such as a handle or transfer substrate and/or requiring mechanical support from the supporting member. Typically, thin films (for example silicon films having a thickness of 5-10 μm and thinner) are unable to be handled without breaking Conventionally, such thin films are manipulated using a supporting structure, which may also be needed to create the thin film in the first place. Handling of thicker films (e.g. silicon films having a thickness of 15-50 μm) may be facilitated by the use of a support, but such a support is not mandatory. Accordingly embodiments of the present invention relate the fabrication of free-standing films of crystal silicon material having a thickness of greater than 15 μm, typically ranging from 20 to 150 μm.

In order to ensure the free-standing films with thickness up to 150 μm being successfully removed by a controlled cleaving process from a cleave region created by ion implantation, a well controlled temperature of the bulk material or temperature gradient across the film around the cleave region may be desirable according to a specific embodiment. Particularly, the optimum temperature control can be achieved by balancing one or more heat sources and/or sinks of thermal power during the implantation and cleaving process. Further, the bulk material, which also is simply called substrates or tiles, need to be space-configured to have proper surface orientation variation for large scale operation and process optimization. Details of the temperature control and substrates configuration can be found throughout the present specification and more particularly below.

Most of the thermal power management involved is CW (steady-state) thermal power according to a specific embodiment. The CW power flux sources and/or sinks can be one or more of the followings: (i) A temperature-controlled stage with a planar surface appropriately engaged with the bulk material through a high thermal conductivity backside contact, i.e., heating or cooling through a gas-layer interface region. In certain embodiments for large scale operation, the temperature-controlled stage can be made to be a framed pallet engaged in platen with space-configured planar surfaces for supporting a plurality of pedestals each holding a substrate or a tile. (ii) An IR heating source by forcing a current to flow through the bulk material volume (such as electromagnetic inductive heating source); and (iii) Floodlight or other appropriate CW radiant sources for heating the surface from above. In certain embodiments, the CW radiation sources include means for delivering energy by beam such as proton, laser, electron beam as well as non-beam including ultrasonic transducer, induction heating, and mechanical approach or the like the original ion beams for implantation, one or more electron beams. (iv) Any combinations of the above (i), (ii), and (iii). Of course, someone of ordinary skill in the art would recognize other variations, modifications, and alternatives.

In a specific embodiment, the purpose of these CW sources or sinks will be to set the desired range of the treatment zone of the bulk material, defined as the cleave region and the silicon layer overlying the cleave region, as accurately and quickly as possible. These thermal sources or sinks can be controlled through surface and bulk temperature measurement via electronic controller to achieve the desired overall thermal profile for the treatment zone. Of course, someone of ordinary skill in the art would recognize other variations, modifications, and alternatives.

One thermal power source is the implant radiation itself according to a specific embodiment. A conventional implant device may deliver 50-100 kW of beam power to the surface under irradiation. This is a substantial additional heating source during the cleave region formation by implantation. The cleave region essentially includes relatively concentrated defect networks around a cleave plane located near the End-Of-Range (EOR) of the implanted high energy ionic particles high energy ionic particles where the kinetic energy of the implanted particles is partially transferred to thermal energy. This thermal source can be a scanned CW or pulsed thermal source and can be partially controlled by adjusting the duty factor of the implant device and the scanning speed and spatial characteristics of the particle beam. Beam expansion can occur by rapid electromagnetic scanning but can also occur through drift of the beam over a distance where the beam will naturally expand to the desired beam diameter and beam flux spatial distribution.

If the power flux is low enough, slow scanning (or even no scanning) of the expanded beam can occur without surface overheating. With a smaller beam diameter such as 5 cm for example (which is useful for generating patterned implant dose profiles within each tile), the power flux can be as high as 5-10 kw/cm$^2$ and may require magnetic or electrostatic fast scanning to avoid surface overheating. Implant radiation can be combined with other forms of energy according to a specific embodiment.

Furthermore, the surface can also be treated through a pulsed thermal power flux in a specific embodiment. Pulsed power is defined here as a thermal pulse delivered within a thermal time constant depending on particular material and film thickness to be cleaved. For example, for a typical silicon treatment zone, the time constant is estimated to be 20-50 μsec. Longer thermal pulses are quasi-CW and would be combined as a CW source mentioned above. The pulsed power flux sources may include flash lamps and pulsed laser sources with energies deposited within 30-50 μsec. The thermal pulses delivered by these sources can instantaneously heat the treatment zone up to and past the melting point of the bulk material if desired.

The effect contemplated by this treatment is to add shear stresses onto the cleave region under formation to lower its cleave energies. More specifically, because the thermal conductivity within an implant EOR is significantly degraded, a temperature difference is generated across the cleave plane. The temperature differential causes a CTE (coefficient of thermal expansion) mismatch between the materials across the cleave plane and a corresponding shear stress. The shear stress adds to internal stress present due to the way of holding the bulk material on the stage and other stress such as silicon displacement stresses. The treatment by using the pulsed power flux to increase shear stress may effectively lower the implant dose required to facilitate the cleaving process and simultaneously help anneal bulk radiation defects. Of course, there can be other variations, modifications, and alternatives.

Figure 29:
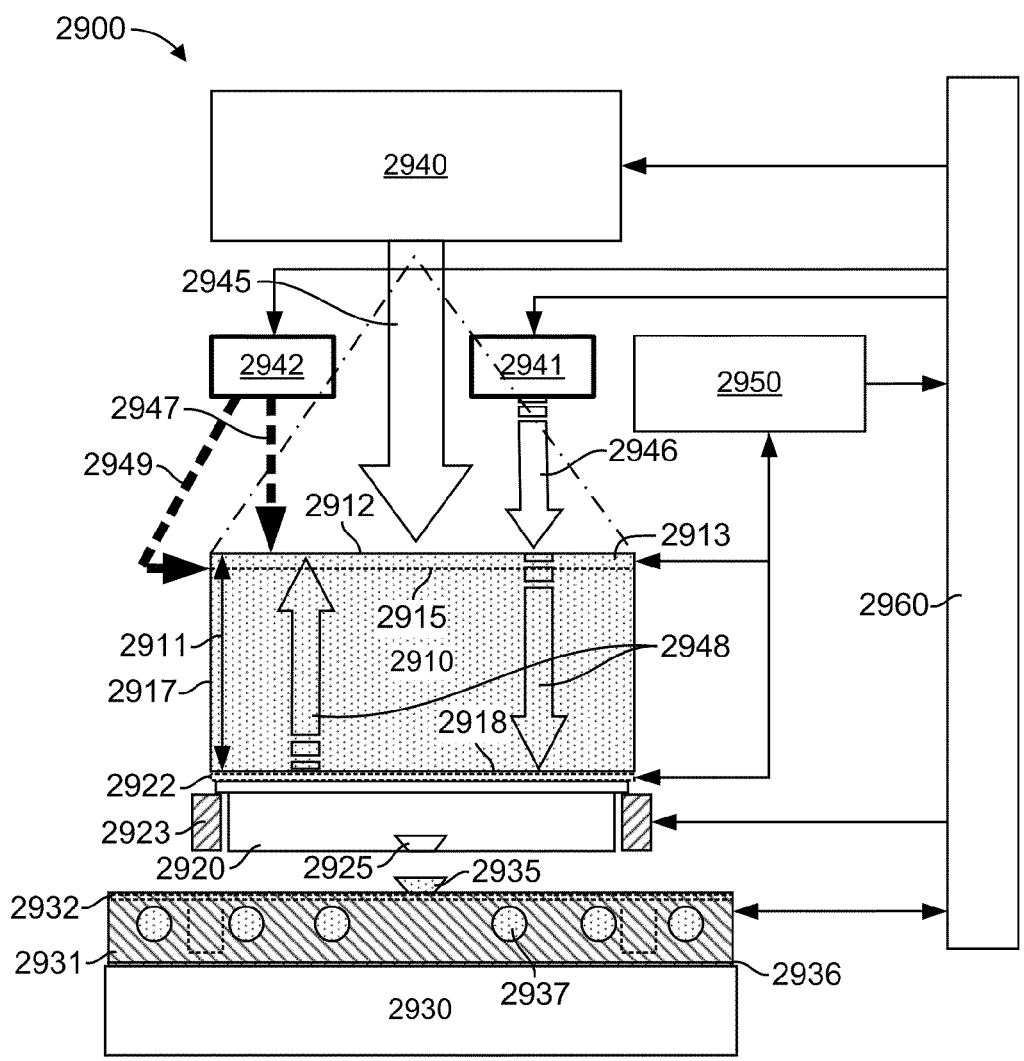
FIG. 29 shows a simplified view of a system for manufacture of free-standing films with substrate temperature control and space-configuration control in accordance with an embodiment of the present invention.

FIG. 29 is a simplified diagram illustrating a system for manufacture of free-standing films with temperature and substrate configuration control in accordance with an embodiment of the present invention. This figure is merely an example, which should not unduly limit the scope of the claims. One of ordinary skill in the art would recognize many variations, alternatives, and modifications. As shown in FIG. 29 as one specific embodiment, a system 2900 for manufacture of free-standing films with temperature control includes at least a bulk substrate 2910 supported on a pedestal 2920, a mechanical base 2930 configured to have a platen 2931 engaged with an open frame pallet 2923 for supporting the pedestal 2920, an implant subsystem 2940 for processing the bulk substrate 2910 from above a surface region 2912, a sensing subsystem 2950 for monitoring the process of manufacture of one or more free-standing films from the bulk substrate 2910, and a control subsystem 2960 for at least controlling a operation of the implant subsystem 2940 and controlling substrate temperature and substrate spatially configuration through the pedestal 2920 and the platen 2931 through height or angle adjustment. As shown, in one embodiment, the pedestal 2920 is bonded with a bottom surface 2918 of the bulk substrate 2910 sandwiched by a thermal pad 2922. Both the pedestal 2920 and the platen 2931 can be made of highly thermal conductive material. The platen 2931 includes a mechanical clamp structure 2935 configured to mate with another clamp structure 2925 built within the pedestal 2920. Between the pedestal 2920 and the platen 2931 an interface region 2932 can be filled with a thermal conductive pad, or a conductive coating, or simply a layer of backside gas, to enhance the temperature control efficiency. Similarly, a thermal conductive pad, or a conductive coating, or simply a layer of backside gas can be inserted to another interface region 2936 between the platen 2931 and its supporting mechanical base 2930. The platen 2931 further is configured to include multiple inner channels 2937 for cooling water, providing additional heat dissipation path to the system 2900.

The bulk substrate 2910 has its top surface 2912 subjected to receive a beam 2945 of high energy particle radiations from the implant subsystem 2940 and other CW or pulse thermal flux from one or more alternative radiation sources 2941 or 2942. In a specific embodiment, the implant subsystem 2940 is configured to introduce ionic particles in MeV energy level. For example, the implant subsystem includes a particle accelerator for accelerating and confining ionic particles to form the particle beam with an energy level ranging from 1 MeV to 5 MeV.

Various types of particle accelerator can be used in the implant subsystem. Certain embodiments of the present invention may use a linear accelerator apparatus based on radio frequency (RF) principles, for example a Radio-Frequency Quadrupole linear accelerator (RFQ-Linac), Drift-Tube Linac (DTL), Quadrupole-Focused Interditigated Linac (QFI), or RF-Focused Interdigitated (RFI) technology. Alternative embodiments may employ a cyclotron particle accelerator.

In a specific embodiment, the present method uses a mass-selected high-energy implant approach, which has the appropriate beam intensity. To be cost-effective, the implant beam current should be on the order of a few tens of milliamps of $H^+$ or $H^-$ ion beam current. If the system can implant such sufficiently high energies, $H^{2+}$ ions can also be advantageously utilized for achieving higher dose rates. Ion implant apparatuses useful for embodiments of the present invention have been made recently available by the use of DC electrostatic particle accelerators such as the DYNAMITRON proton accelerator available from Ion Beam Applications SA, Belgium). Other forms of DC electrostatic accelerators which may be used include Van de Graaff or Tandem cascade accelerator types.

The general structure of DC accelerator comprises an insulating column. The ion source lies at one end in a high voltage terminal while the target is at ground potential. The electrical field existing between the two terminals accelerates the particles emitted from the ion source to target. DYNAMITRON proton accelerator uses a cascaded voltage generator enclosed in a high pressure tank before connected to an accelerator tube. The voltage generator is composed of an equal number of rectifier tubes on each side of cascaded column structure. Semi-circular corona rings are attached to anode and cathode of each rectifier in the cascade. Two rf (around 100 kHz) electrodes are mounted near inner surface of the tank. The beam travels between high voltage terminal and ground through the highly evacuated accelerator tube made by metal and further connected to a scanning device at the exit port of the implant subsystem.

In an implementation, lighter ions like hydrogen ions are utilized. In other implementations, ionic particles containing deuterium species or helium species may be used. Additionally, the implant subsystem 2940 is configured to scan the particle beam 2945 to at least cover all surface region 2912. For example, the implant subsystem includes a scanning device capable of raster scanning the particle beam over an area of 1.5 m×1.5 m or greater at the substrate surface region 2912. In an embodiment, the scanned beam forms a cone shape from a pseudo point source. The cone beam can cover the area of 1.5 m×1.5 m of the substrate surface region through the beam scanning alone. In another embodiment, the scanned beam forms a fan-shape. Substrate linear motion can be incorporated together with the beam scanning to cover the whole surface region. As a result of, at least partially, the high energy particle implantation a cleave region 2915 beneath the surface region 2912 can be formed. In some implementations, the ionic particle beam 2945 is used just to form a patterned region which is a small portion of the top surface 2912. An alternative function of the high energy ionic particles is to provide a pulsed thermal flux towards the surface region 2912 and rest part of the bulk substrate 2910. The one or more alternative radiation sources 2941 or 2942 also provide their shares of CW or pulsed thermal flux. For example, the one or more alternative radiation sources comprise a plurality of flash lamps and a plurality of pulsed laser sources. The mechanical base 2930 further can serve a thermal path for an inductive Joule heating source to provide heat to the bulk substrate 2910.

The sensing subsystem 2950 comprises a plurality of sensors including temperature sensor, position sensor, pressure sensor, and surface roughness probe. During the implantation process and subsequent cleaving (including cleave initiation and propagation) process, the sensing subsystem 2950 is capable of collecting all real time sensor data related to the state of the bulk substrate 2910 being processed under implantation or cleaving. The sensor data will be delivered to the controller 2960 and used as an input data for executing a feedback/feedforward control scheme to determine one or more corresponding automation signals to the clamp devices for reconfigure each platen. For example, the clamp device is a mechanical clamp. The automation signal is correspondingly for driving robot-like motions including lifting, rotating, dithering, tilting, etc. In another example, the clamp device is electromagnetic in nature. Thus the automation signal is formulated to drive the device by electric IN pulses and subsequently cause the clamp device to perform mechanical motions including lifting, rotating, dithering, tilting, etc. Additionally, the controller 2960, in response to the sensor data, is configured to provide temperature (thermal flux) control adjustments of the implant subsystem 2940, one or more alternative radiation sources 2941 or 2942, and other thermal sources or heat sink associated with the mechanical platen 2930.

Figure 29A:
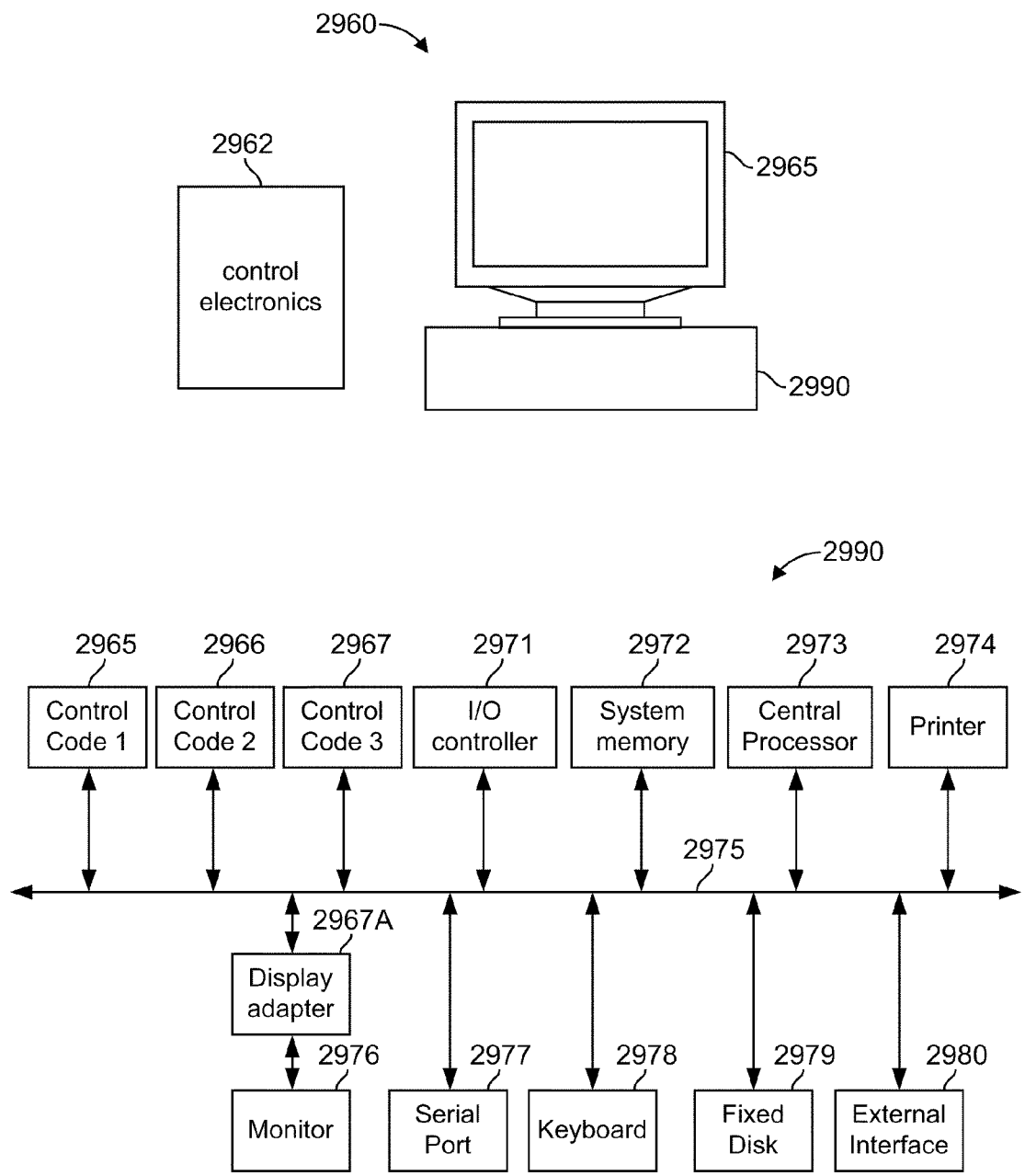
FIG. 29A shows a simplified view of a control subsystem included in the apparatus of FIG. 29 in accordance with an embodiment of the present invention.

FIG. 29A is a simplified diagram of a controller 2960 that is used to oversee and perform operation of the system 2900 of FIG. 29 as well as processing of information according to an embodiment of the present invention. This diagram is merely an example, which should not unduly limit the scope of the claims herein. One of ordinary skill in the art would recognize many other modifications, alternatives, and variations. As shown, the controller 2960 includes control electronics 2962 which links a computer system 2970.

In a specific embodiment, the controller 2960 uses the control electronics 2962 to execute plurality of control functions. For example, the control electronics 2962 includes multiple electronic boards or function cards. Each of those boards may be respectively adapted to couple the platen 2931 (and/or the open frame pallet 2920) to perform temperature control function and clamping function, to couple the implant subsystem 2940 for control the implantation process, to couple the CW radiation source 2941 and pulsed radiation source 2942) for both temperature control and assisting the cleave process, and to couple the sensing subsystem 2950 to receive the information related to current state of the bulk substrate 2910 and generate an input data packet for the computer system 2970.

In another specific embodiment, the computer system 2970 may be a Pentium™ class based computer, running Windows™ NT operating system by Microsoft Corporation. However, the computer system is easily adapted to other operating systems and architectures by those of ordinary skill in the art without departing from the scope of the present invention. FIG. 29A also shows a more detailed diagram of hardware elements in the computer system 2970 according to an embodiment of the present invention. The computer system 2970 is configured to receive the input sensor data via an I/O controller 2971, to process the data in a plurality of control codes 2965, 2966, 2967, running in a central processor 2973, and to send the output control commands/instructions back to the control electronics via I/O controller 2971. Each of the plurality of control codes is specifically designed for certain control functions in the apparatus 2900. For example, the control code 2965 running in the computer system 2970 may be a program for controlling the operation of the implant device to deliver certain high-energy ionic particle beams towards the surface region of the bulk material. In another example, the control code 2966 may be a program for generating a sample spatial reconfiguration procedure, which is to be delivered to the clamp device via one or more mechanical automation signals so that each platen can be individually spatially-reconfigured to achieve a suitable surface orientation for each bulk substrate supported by the platen. In yet another example, the control code 2967 may be a program capable of generating output commands for cooling of the stage, adding Joule heat through the clamp, and/or heating the top surface by the external heat sources etc. Of course, one of ordinary skill in the art would recognize many other modifications, alternatives, and variations.

In specific embodiments, all the hardware elements or subsystems of the computer system 2970 are interconnected via a system bus 2975. For example, subsystems such as a printer 2974, keyboard 2978, fixed disk 2979, monitor 2976, which is coupled to display adapter 2976A, and others are shown. Peripherals and input/output (I/O) devices, which couple to I/O controller 2971, can be connected to the computer system by any number of means known in the art, such as serial port 2977. For example, serial port 2977 can be used to connect the computer system to an external interface 2980 such as a modem, which in turn connects to a wide area network such as the Internet, a mouse input device, or a scanner. The interconnection via system bus 2975 allows central processor 2973 to communicate with each subsystem and to control the execution of instructions from system memory 2972 or the fixed disk 2979, as well as the exchange of information between subsystems. Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory.

Although the above has been illustrated in terms of specific hardware features, it would be recognized that many variations, alternatives, and modifications can exist. For example, any of the hardware features can be further combined, or even separated. The features can also be implemented, in part, through software or a combination of hardware and software. The hardware and software can be further integrated or less integrated depending upon the application. Further details of the functionality of the present invention can be outlined below according to the Figures.

As described above, the system 2900 is configured to execute one or more temperature control schemes to control a heat conduction to/from the engaged bottom region 2918 of the bulk substrate 2910 via the thermally conductive pedestal 2920 and platen 2931 as heat sink, the heat supply of incoming pulsed thermal flux from the scanned ionic particle beam 2945 and/or in combination with the CW thermal flux from one or more alternative radiation sources 2941 or 2942 can be tuned in terms of an effective thermal flux 2948 within the body of the bulk substrate 2910. Therefore, temperatures near or across the cleave region 2915 can be controlled during its formation, cleave initiation, and cleave propagation so that local thermal stress field especially a shear stress at a crack tip along the cleave region can be manipulated for facilitating the formation of a free-standing film. More details about the thermal-induced cleaving initiation and controlled propagation and applications for slicing shaped free-standing silicon films for manufacture of photovoltaic cells can be found in U.S. Nonprovisional patent application Ser. No. 12/019,110, and U.S. Provisional Patent Application Nos. 61/051,307, 61/051,344, and 61/092,683, all of which are commonly assigned and incorporated by reference herein in their entireties for all purposes.

Additionally referring to FIG. 29, the clamping mechanism using platen 2931 to engage with the bulk substrate 2910 held on pedestal 2920 substantially exposes the surface region 2912 as well as the side region 2917 of the bulk substrate 2910 so that the bulk substrate 2910 is in a ready position to be processed over a large percentage of its length 2911 for manufacture of a plurality of free-standing films. In an specific embodiment, the clamping mechanism shown above can be expanded so that the mechanical base 2930 can have multiple platen 2931 for clamping with (via pedestal or directly) multiple bulk substrates within the same system 2900. For example, the mechanical base 2930 has 36 platens 2931 arranged in 6×6 matrix or 64 platens 2931 arranged in 8×8 matrix to engage with an open frame pallet 2923 having substantially the same 6×6 or 8×8 matrix arranged open grid units. Each platen 2931 is configured to clamp with a pedestal 2920 and fitted in a single grid unit of the open frame pallet 2923. As a result, the manufacture yield of the system 2900 can be raised by many folds. In yet another specific embodiment, each individual platen 2931 supported on the mechanical base 2930 can be configured to be independently adjustable in terms of its spatial orientation and height. An advantage of this individual spatial configured platen is to provide flexibly various tilted orientations of the bulk substrate surface subjecting to the raster scanning implant particle beam 2940 with an desired dose-averaging and channeling prevention effect. Additional advantage lies in a process convenience provided for handling the bulk substrate by lifting up the platen 2931 from the bottom. Further, the flexible spatially configured platen also provides addition thermal adjustment so that the temperature controlled implantation processing on each individual bulk substrate within the 8×8 batches can be locally optimized. Additional descriptions about the spatial configurations for mounting the bulk substrates on the mechanical platen will be found in more details specifically below.

Figure 30A:
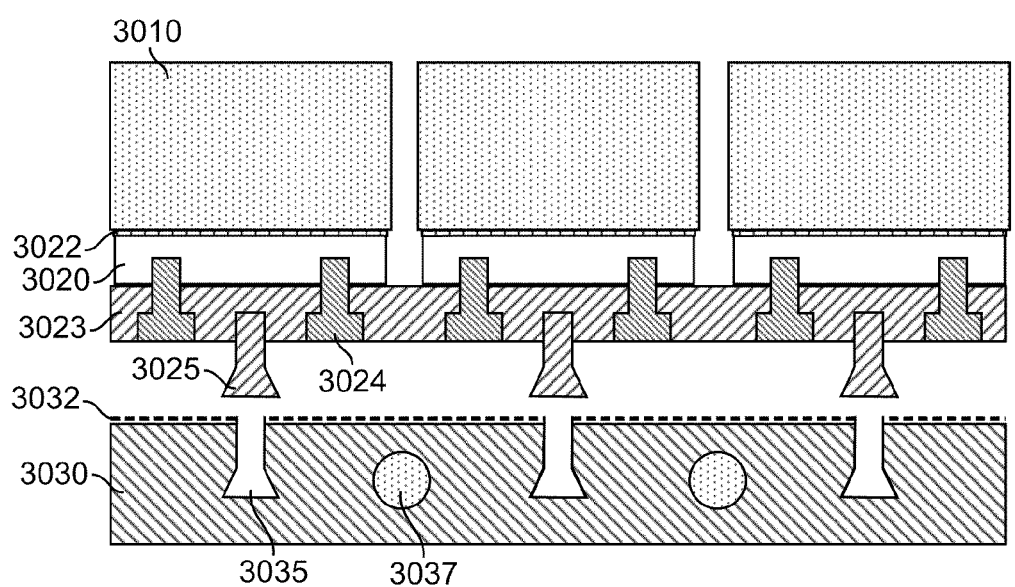
FIGS. 30A-30D respectively show a simplified cross section view of bulk substrates being held on a mechanical platen according to an embodiment of the present invention.

FIG. 30A shows a simplified cross section view of multiple bulk substrates being held on a mechanical platen according to an embodiment of the present invention. This diagram is merely an example, which should not unduly limit the scope of the claims herein. As shown, the bulk substrate 3010, for example crystal silicon tile, is bonded on the pedestal 3020 via a silicone material 3022. The pedestal 3020 may be configured to accommodate either a 156 mm silicon tile a 125 mm tile, depending on applications. Each of a plurality of pedestals 3020 with bonding bulk substrates 3010 is respectively coupled to a pallet 3023 by bolts 3024 for easy replacement. Between the pedestal 3020 and the pallet 3023 there can be silicone pad for enhancing thermal conduction. The pallet 3023 is configured to be a tray or carrier for moving batches of bulk substrates (or tiles) around factory and transfer in and out of the system 2900. The pallet 3023 includes one or more clamp elements 3025 that are configured to mate with corresponding one or more clamp elements 3035 within a platen 3030, so that the pallet 3023 can be clamped together with the platen 3030. Again, silicone pad 3032 can be inserted between the pallet 3023 and the platen 3030. In an embodiment, a small gap may exist in a backside between the pallet 3023 and the platen 3030 excepting a portion with mating clamp elements 3025/3035. Thermal conductive gas can be filled in the backside gap for achieving desired thermal conduction. Furthermore, the platen 3030 includes one or more channels 3037 capable of running cold water or other fluidic coolant material for cooling purpose. In another embodiment, the platen 3030 can be made of a spatially separated part for supporting a single bulk substrate 3010, which can be independently mounted on a mechanical base (not shown here) so that each platen can be spatially configured separately.

Figure 30B:
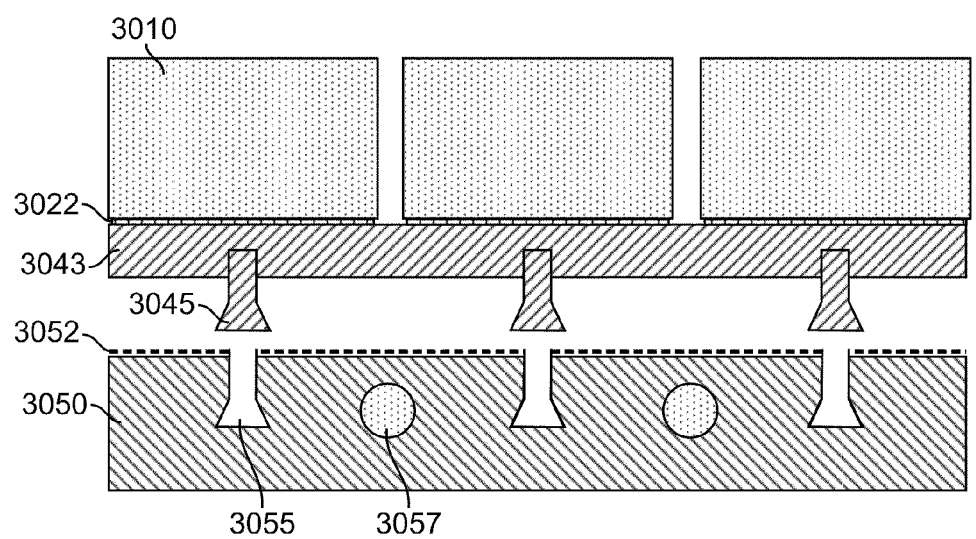

FIG. 30B shows a simplified cross section view of multiple bulk substrates being held on a mechanical platen according to another embodiment of the present invention. This diagram is merely an alternative example versus FIG. 30A, which should not unduly limit the scope of the claims herein. As shown, the bulk substrates or tiles 3010 are bonded directly to the pallet 3043 by silicone rubber material 3022, without the pedestal part. The pallet 3043 including one or more clamp elements 3045 is substantially similar to the pallet 3023. Then the pallet 3043 can be mechanically clamped with the platen 3050 via one or more mating clamp elements 3055. Additionally, the platen 3050 includes one or more channels 3057 capable of running cold water or other fluidic coolant material for cooling purpose. In a specific embodiment, the platen 3050 can be made of a spatially separated part for supporting a single bulk substrate 3010, which can be independently mounted on a mechanical base (not shown here) so that each platen can be spatially configured separately.

Figure 30C:
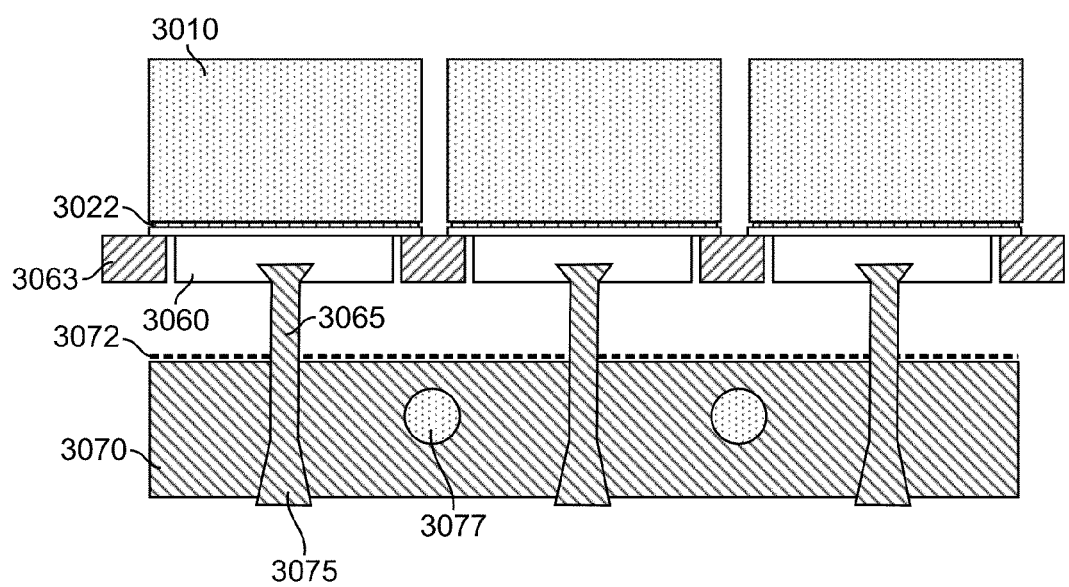

FIG. 30C shows a simplified cross section view of multiple bulk substrates being held on a mechanical platen according to another embodiment of the present invention. This diagram is merely another example, which should not unduly limit the scope of the claims herein. As shown, the bulk substrates 3010 again are respectively bonded on the pedestals 3060 by a glue or epoxy material 3022. Each pedestal 3060 is configured to be transferred and placed in a unit of an open frame pallet 3063, which is shown only the solid grid of the open frame pallet 3063 in the side view. The pedestal 3060 then can be clamped with the platen 3070 via one or more mating clamp elements 3065/3075. Also, the platen 3070 includes one or more channels 3077 capable of running cold water or other fluidic coolant material for cooling purpose. In a specific embodiment, the platen 3070 can be made of a spatially separated part for supporting a single bulk substrate 3010, which can be independently mounted on a mechanical base (not shown here) so that each platen can be spatially configured separately.

Figure 30D:
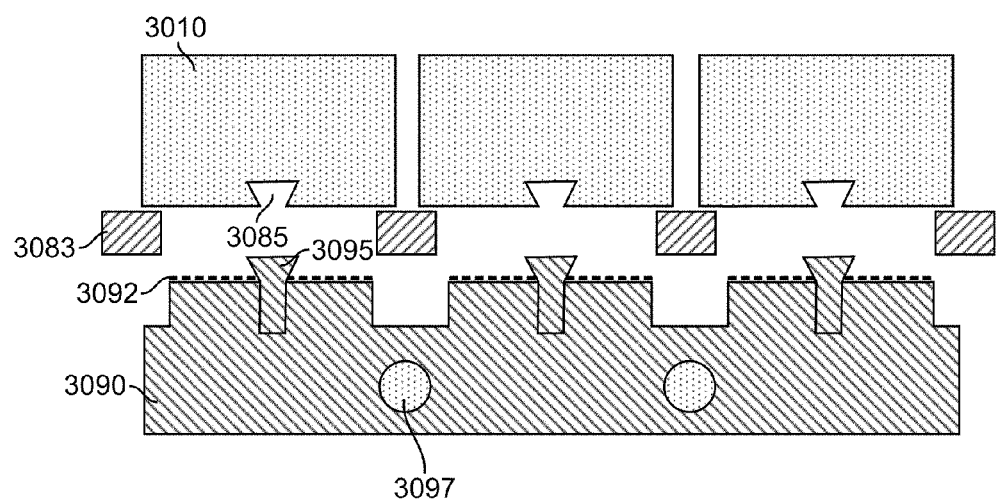

FIG. 30D shows a simplified cross section view of multiple bulk substrates being held on a mechanical platen according to another embodiment of the present invention. This diagram is merely an additional example, which should not unduly limit the scope of the claims herein. As shown, the bulk substrates 3010 are transported to engage with an open frame pallet 3083. The open frame pallet 3083 with only solid grid visible can be substantially similar to the open frame pallet 3063 shown in FIG. 30C. Each of the bulk substrates 3010 itself has a built-in clamp structure 3085 that can be directly mated with another clamp element 3095 on a platen 3090. In this case, no pedestal part is used. As clamped, between the bottom surface of the bulk substrate 3010 and the top surface of the platen 3090 there can be a backside gap filled with a backside gas film or be inserted with a silicone pad 3092 for enhancing thermal conductivity. Furthermore, the platen 3090 includes one or more channels 3097 capable of running cold water or other fluidic coolant material for cooling purpose. In a specific embodiment, the platen 3090 can be made of a spatially separated part for supporting a single bulk substrate 3010, which can be independently mounted on a mechanical base (not shown here) so that each platen can be spatially configured separately.

Figure 31:
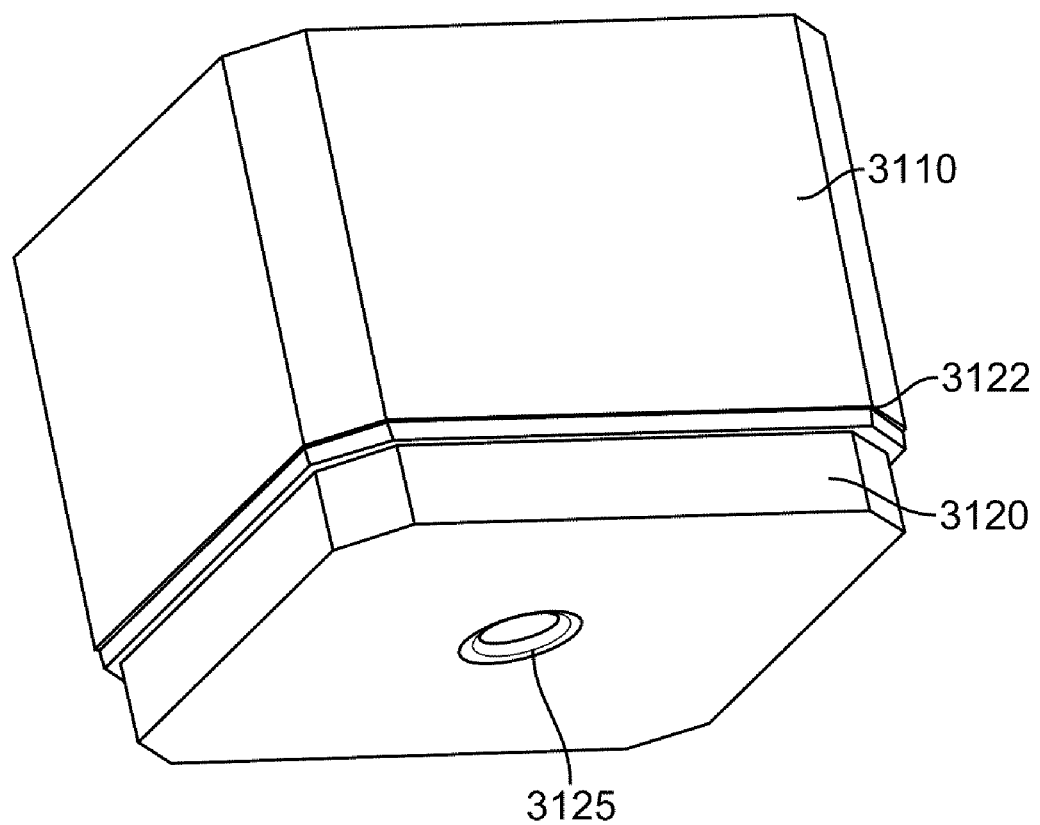
FIG. 31 shows a simplified perspective view of a bulk substrate being bonded on a pedestal according to an embodiment of the present invention.

FIG. 31 shows a simplified perspective view of a bulk substrate being bonded on a pedestal according to an embodiment of the present invention. This diagram is merely an example, which should not unduly limit the scope of the claims herein. As shown, the bulk substrate 3110 is a truncated square shaped rod, a typical shape for a crystalline silicon tile, or can be other shapes. The bulk substrate 3110 is bonded on to a pedestal 3120 by a layer of silicone material or other organic epoxy or elastomer materials with good bonding properties and excellent thermal conductivities. The pedestal 3120 can be made of aluminum material in general. As shown the aluminum pedestal 3120 has a clamp structure 3125 on its bottom which can be made of a steel sleeve used to couple with a individual platen as described in one shown in FIGS. 30A-30D. In an alternative embodiment, the pedestal 3120 can include at least a portion made of magnetic material or electromagnet-susceptible material embedded in the main aluminum body so that the pedestal 3120 can be clamped with an external magnetic platen by magnetic clamping.

Figure 32:
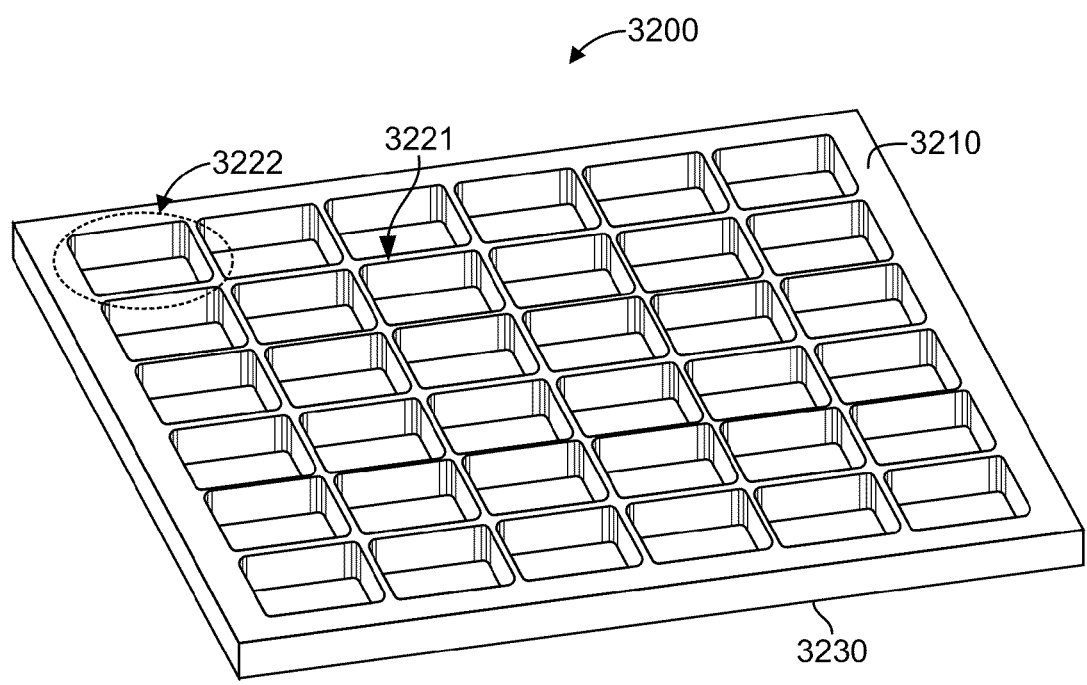
FIG. 32 shows a simplified perspective view of an open frame pallet according to an embodiment of the present invention.

FIG. 32 shows a simplified perspective view of an open frame pallet according to an embodiment of the present invention. This diagram is merely an example, which should not unduly limit the scope of the claims herein. As shown, the open frame pallet 3200 has 36 open grid units 3222 arranged into a 6×6 matrix, each having a shape and a size configured to be engaged with a pedestal or like structure that supported a single bulk substrate via silicone bonding or magnetic clamping. For example, 36 silicon tiles of either 156 mm size or 125 mm size can be accommodated. An edge portion of the pedestal is larger than the size of the open unit 3222 so as to be supported by the grid 3221. The pallet itself is made of metal for its good thermal conducting property and mechanical strength. Both the top surface 3210 and the bottom surface 3230 around each open unit 3222 can be attached with a silicone pad or other chemical elastomer bonding material when engaging with either the pedestal or a platen for enhancing thermal conductivity. Of course, there can be many alternatives, variations, and modifications in the structural details of the open frame pallet. For example, the shape of the open unit can be varied for correspondingly fitting a pedestal or even a bulk work piece with different shapes. In one example, the open frame pallet can have 8×8 open units or other different options.

Figure 33:
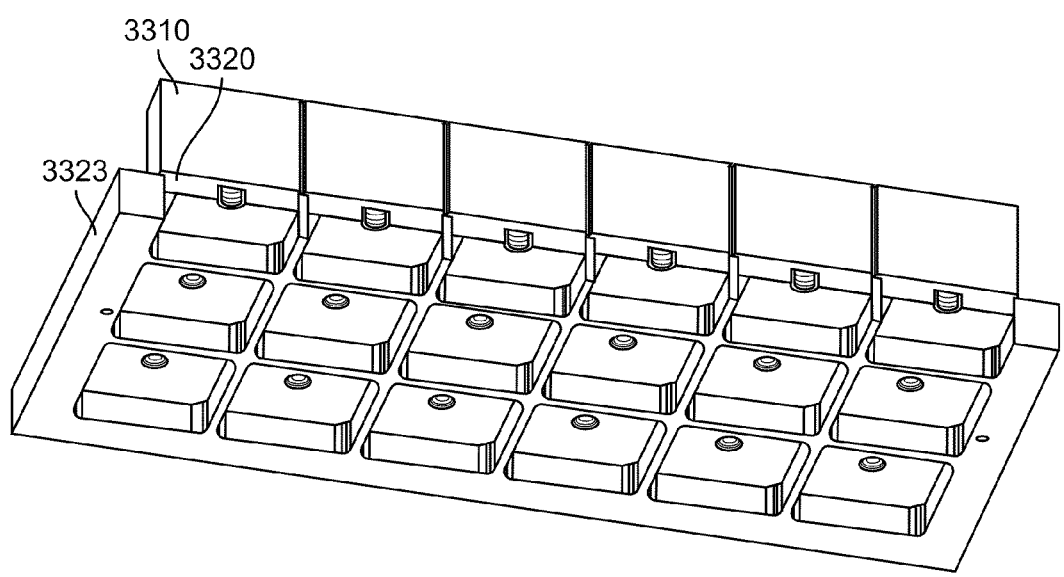
FIG. 33 shows a simplified perspective view of a plurality of bulk substrates each coupled to a pedestal being supported by an open frame pallet according to an embodiment of the present invention.

FIG. 33 shows a simplified perspective view of a plurality of bulk substrates each coupled to a pedestal being supported by an open frame pallet according to an embodiment of the present invention. This diagram is merely an example, which should not unduly limit the scope of the claims herein. As shown in a partial cut-away perspective view, an open frame pallet 3323 has supported a plurality of bulk substrates 3310 each coupled to a pedestal 3320. The open frame pallet 3323 can be substantially the same as the pallet 3200 shown in FIG. 32. Each of the pedestal 3320 is configured to be just fit into a volume, at least partially, of one open unit of the open frame pallet, leaving a remaining volume of the open unit for engaging with a single platen. Each pedestal 3320 can be substantially the same as the pedestal 3120 described in FIG. 31. Each bulk substrate 3310 can be a silicon tile either in 156 mm or 125 mm configured to manufacture a plurality of free-standing films. More structural description about the platens for fitting the above open frame pallet can be found in more details below.

Figure 34A:
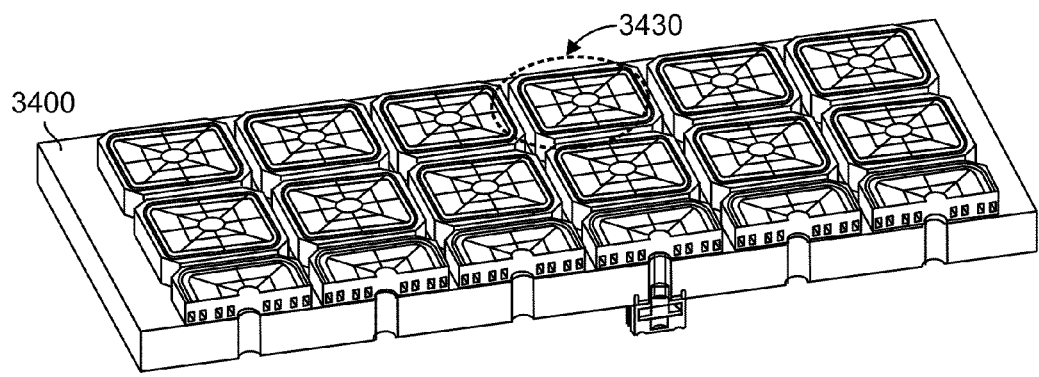
FIG. 34A shows a simplified perspective view of a plurality of platens attached on a mechanical base in accordance with an embodiment of the present invention.

FIG. 34A shows a simplified perspective view of a plurality of platens attached on a mechanical base in accordance with an embodiment of the present invention. This diagram is merely an example, which should not unduly limit the scope of the claims herein. As shown in a partial cut-away perspective view, the mechanical base 3400 has a plurality of flattened platens 3430 arranged in a 6×6 matrix pattern (partially shown). Each platen 3430 is structurally configured to mate with the remaining volume portion of the open unit of the pallet shown above. Each platen 3430 is intended for clamping with a pedestal above for further supporting a single bulk substrate. For example, the single bulk substrate can be a silicon tile either in 156 mm or 125 mm size ready for manufacture a plurality of free-standing films for making solar cells. Of course, there can be many alternatives, variations, and modifications.

Figure 34B:
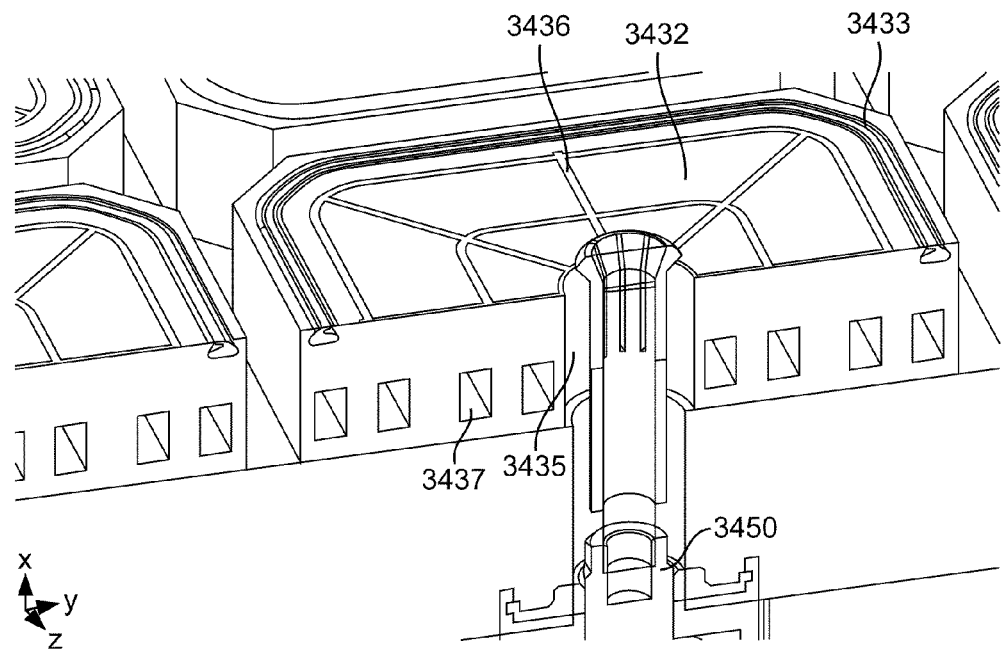
FIG. 34B shows a detailed structure of one platen shown in FIG. 7A.

FIG. 34B shows a detailed structure of a (cut-away) platen shown in FIG. 34A. As seen, the platen 3430 has a surface region 3432 bounded by a perimeter ring 3433. The surface region 3432 can be attached with molded-on silicone rubber pad (not shown). At the perimeter ring 3433 an O-ring material or a Kalrez high compliance seal can be installed for creating a sealed thin-plate volume once engaging with a pedestal or directly with a bulk substrate above. Within the surface region 3432, one or more patterned grooves 3436 can be engraved thereof, providing a path for injecting backside gas. Therefore, a thin backside gas film can be formed between the pedestal and the surface region 3432 in an engaged state between a pedestal and the platen 3430, thereby providing an excellent thermal conducting path for any work piece overlying the pedestal. For example, nitrogen gas can be supplied as the backside gas. In an embodiment of the present invention, the platen 3430 includes a plurality of tunnels 3437 directly embedded underneath the surface region 3432. Those tunnels 3437 can be supplied with cooling water or other fluidic coolant material. Furthermore, between the plurality of platen 3430 and the mechanical base 3400 there can be inserted thermal conductive pad so that the whole structure can serve as a good heat sink in addition to be a sample stage, which has been illustrated in FIG. 29 for supporting a temperature controlled implantation and cleaving process. Additionally, the platen 3430 includes a center hole 3435 for installing a mechanical clamp device 3450 from a bottom side of the mechanical base 3400. The mechanical clamp device 3450 is used to clamp the platen 3430 to a pedestal or a bulk substrate directly above. Of course, there can be other clamping mechanisms. For example, magnetic clamping is used in another embodiment of the present invention for mounting the pedestal onto the platen over the base.

Figure 35:
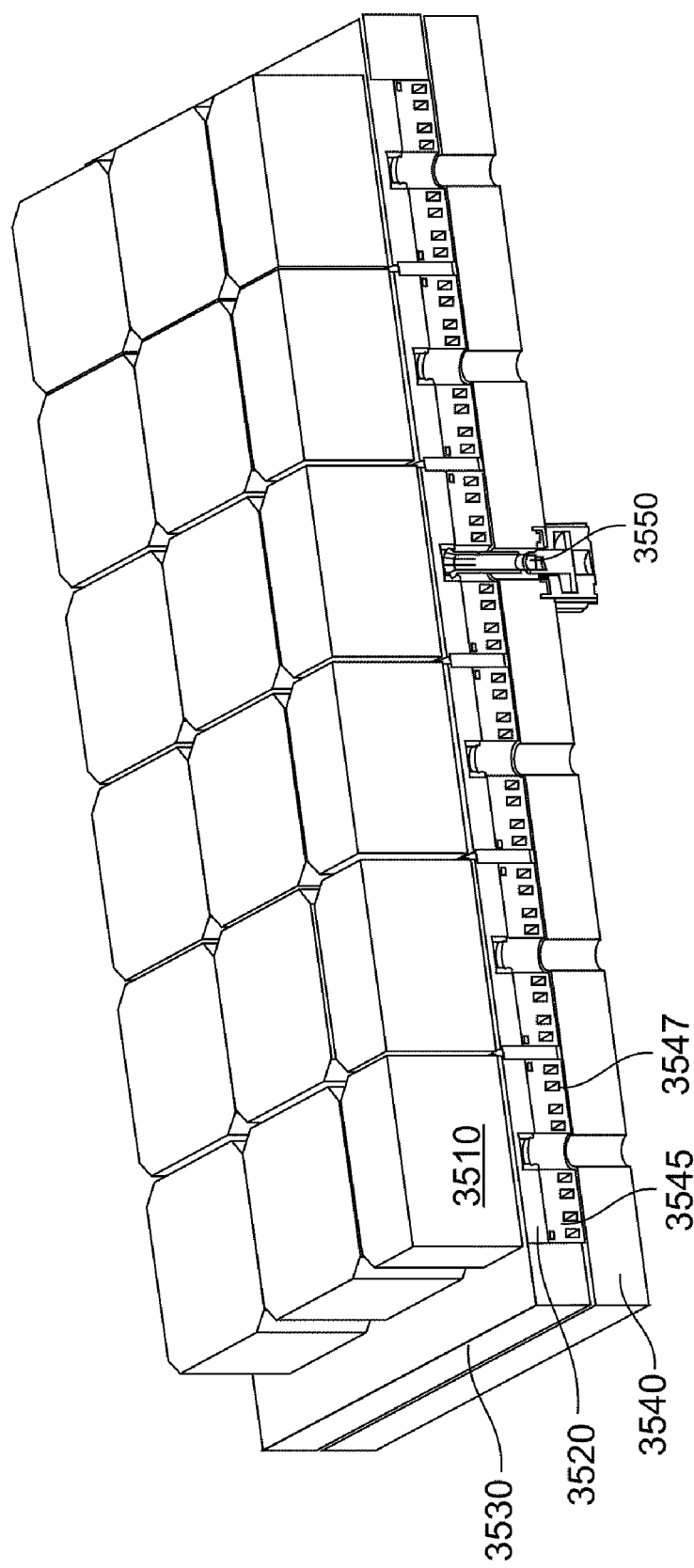
FIG. 35 shows a simplified perspective view of a plurality of bulk substrates being coupled to pedestals in an open frame pallet supported by a mechanical platen according to an embodiment of the present invention.

FIG. 35 shows a simplified perspective view of a plurality of bulk substrates being coupled to pedestals in an open frame pallet and clamped with a corresponding platen on a mechanical base according to an embodiment of the present invention. This diagram is merely an example, which should not unduly limit the scope of the claims herein. As shown in a partial cut-away perspective view, a plurality of bulk substrates 3510 are respectively bonded with a plurality of pedestals 3520 engaged with an open frame pallet 3530 with each pedestal being fitted in a single grid unit of the open frame pallet 3530 arranged in a 6×6 matrix configuration (partially shown). The open frame pallet 3530 has been mated with a mechanical base 3540 comprising a plurality of platen 3545 arranged in a same way as the open frame pallet. Each platen 3535 is protruded above the base 3540 so as to be fitted in the remaining portion of the grid unit of the pallet 3530 to engage and clamp with a corresponding pedestal 3520. The clamping mechanism shown here can be a mechanical based mechanism using a clamp device 3550 installed from the bottom of the mechanical base 3540. Of course, there can be many alternatives, variations, and modifications. For example, the clamp device 3550 can be configured to lift up the pedestal 3520 from below if necessary so that the bulk substrate (the silicon tile) 3510 can be picked up or accessible for replacement. In an implementation, the bulk substrate 810 is just a silicon tile 3510 installed in the system 2900 as the bulk substrate 2910 for manufacture of a plurality of free-standing films. In a specific embodiment, each platen 3545 includes a plurality of embedded tunnels 3547 with cooling water or other fluidic coolant material and can be installed onto a mechanical base 2930 in the system 2900, serving as a heat sink as part of a overall temperature control system suitable for performing both implantation and cleaving process.

Figure 36:
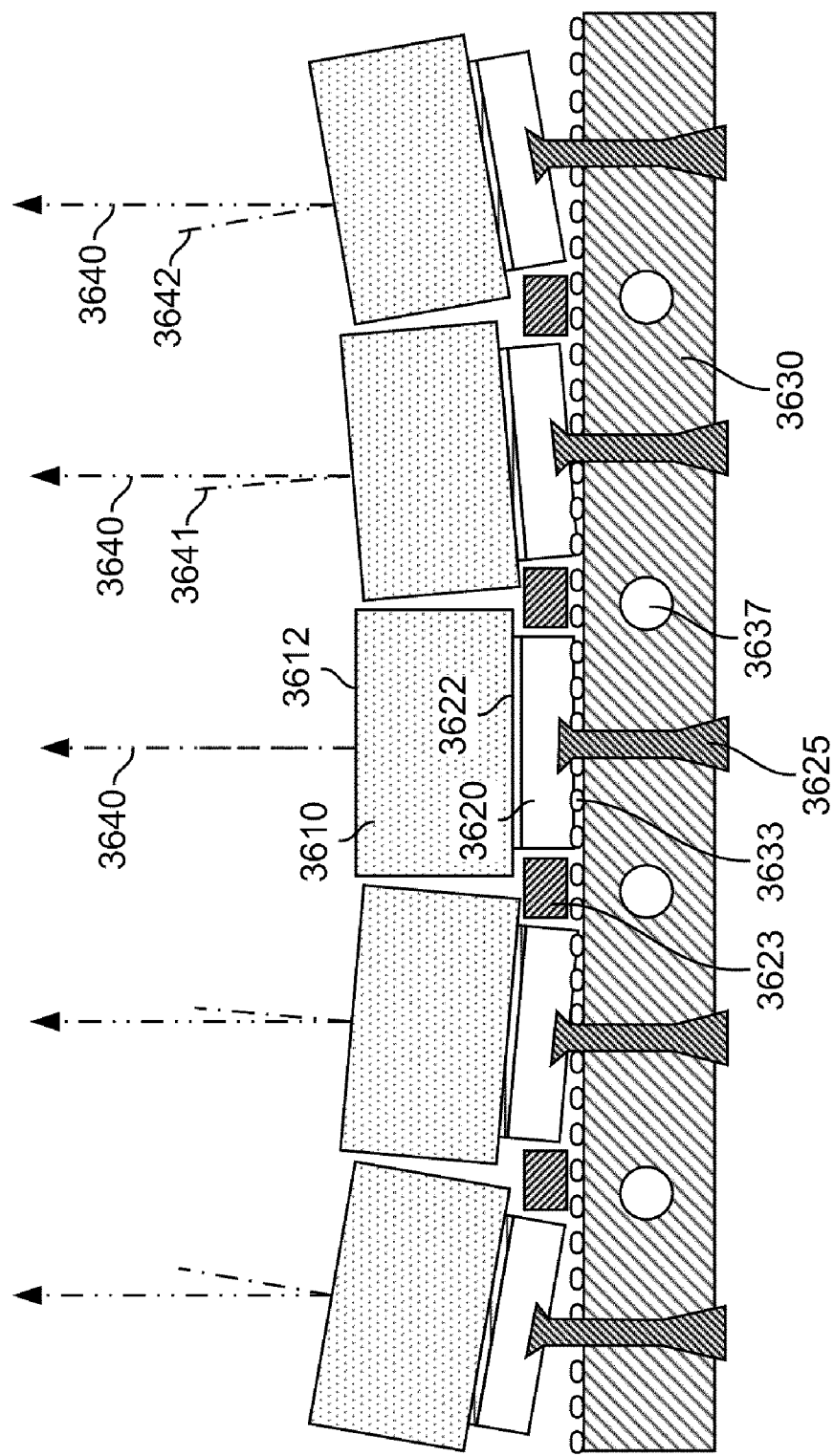
FIG. 36 is a simplified cross sectional view of diagrams illustrating multiple spatially-configured bulk substrates for manufacture free-standing films according to an embodiment of the present invention.

FIG. 36 is a simplified cross sectional view of diagrams illustrating multiple spatially configured bulk substrates for manufacture free-standing films according to an embodiment of the present invention. This diagram is merely an example, which should not unduly limit the scope of the claims herein. As shown, a batch of bulk substrates 3610 are pre-treated silicon tiles to be loaded in a system for manufacture a plurality of free-standing films using a batch processing method. Each of the batch of silicon tiles 3610 having a top surface 3612 is bonded on a single pedestal 3620 at a bottom interface region 3622. The pedestal 3620 is subsequently clamped with a platen 3630 using a clamp device 3625, forming an individual unit with spatially configurable bulk substrate. In a specific embodiment, the spatially configuration refers to a flexible orientation of the top surface 3612 which is subjected to a raster scanning particle beam from above (e.g., the particle beam 2945 as shown in FIG. 29) during an implantation process designed for manufacture a free-standing film. For example, a first unit in FIG. 36 has a surface orientation defined by a normal direction associated with the top surface 3612. In an implementation, the normal direction of the first unit may be substantially aligned with gravitational vertical direction 3640. In another implementation, the second unit next to the first unit is independently configured to have its normal direction 3641 tilted away from the gravitational vertical direction 3640. Furthermore, a third unit that is next to the second unit may be configured such that its top surface normal direction 3642 is further tilted away from the gravitational vertical direction 3640. In another specific embodiment, each unit with spatially configurable bulk substrate achieves a desired configuration by lifting, rotating, tilting, or dithering the corresponding platen individually using the associated clamp device.

A direct application of the spatially configured substrate is to prevent an ion channeling effect during the implantation process. The silicon tile 3610 with its top surface 3612 is subjected to the ionic particle beam during the implantation process for forming cleave region (or at least a cleave initiation region). Depending on a specific crystallographic plane associated with the top surface 3621, the highly directional incoming ionic particle beam, as they penetrate into the crystal, may be aligned to one or more specific directions along one or more lattice channels with much less atomic scatterings. Therefore, the incoming ions may reach much deeper depth along the one or more lattice channels before being giving up their energies to the crystalline lattice. As the beam is raster scanned across the top surface 3612 of each tile 3610 during the implantation process, one may expect one or more dipped profile to form within the cleave region (e.g., region 2915 in FIG. 29) created by the implanted hydrogen ions. This may result in undesired face bumps on the free-standing film after cleaving out of the tile 3610. Worst case may result in failure of the cleaving, leading to a cracked film. Since the lattice channels are highly depended on crystallographic direction, a small angular tilt or plus rotation of the top surface 3621 can move the beam direction away from the channel direction to prevent from the ion channeling effect. At least, certain channeling effect can be limited to substantially just a peripheral region or corner region to reduce its impact.

Referring to FIG. 35, each unit comprising a platen, a pedestal, and a supported bulk substrate and being arranged in 6×6 matrix configuration can be one of those units in FIG. 36. Therefore, each unit in FIG. 35 can be individually configured to have different tilted surface orientation as shown in FIG. 36. The implanting ion particle beam should raster scanned across the top surface of the every tile in above 6×6 matrix arrangement. Of course, the tiles near the middle part and the tiles near the edge part of the 6×6 matrix arrangement would experience a different incidental angle of the scanning ion beam. So does the central portion and the edge portions of the top surface for each tile experience different beam incidence angle. Thus each tile unit within the 6×6 matrix arrangement should be configured to adjust its tilt angle differently due to its unique location in the 6×6 or 8×8 matrix arrangement. In an embodiment, the clamp device 3550 can be used to lift up, rotate, or dither the correspond platen 3520 above and change surface orientation and relative beam incident angle by a few degrees, aiming to prevent ion channeling effect from the top surface of a specific tile 3510 above the platen 3520. Each of every unit within the 6×6 matrix arrangement can be spatially configured with a corresponding tilt angle individually by its own clamp device.

FIGS. 36A-C show simplified cross-sectional views of an alternative embodiment of a system, in which the orientation of surfaces of a plurality of substrates relative to an implant source can be stably and reproducibly achieved in a kinematic manner. FIG. 36A shows adjacent substrates 3650a and 3650b that are supported on respective pedestals 3652a and 3652b by an intervening adhesive layer 3654a and 3654b. Each pedestal includes a steel armature 3653. The pedestals are fitted into openings defined in a grid-like pallet 3655 (shown here in outline).

FIG. 36A also shows the underlying platen 3656 which is moveable in the vertical direction relative to the stationary pallet. The platen includes elevated cooling blocks 3658a and 3658b.

These cooling blocks include a magnetic clamping apparatus 3657 such as an electromagnet or an electro-mechanically controlled permanent magnet. This magnetic clamping apparatus is in electronic communication with controller 3670. Controller 3670 in turn is in electronic communication with computer-readable storage medium 3672, which contains code stored thereon to direct the operation of the magnetic clamping apparatus.

The cooling blocks also include internal cooling channels (shown in cross-section), as well as channels for conveying cooling gas to the upper surfaces of the cooling blocks. These upper surfaces of the cooling blocks are inclined at different angles A and B, respectively. These upper surfaces bear flexible O-ring seals 3658.

FIG. 36B shows the raising of platen 3656 relative to the stationary pallet, such that the O-rings on the inclined surfaces eventually engage the undersides of the pedestals. This engagement may take the form of successive contact with different points on the cooling blocks to seat the pedestal in a kinematic manner, such that the location of the pedestal/substrate is constrained. Such a kinematic coupling can be effected utilizing complementary raised/recessed surfaces positioned at strategic points on the respective engaging elements (pedestal/platen).

Sealing of the pedestal to the respective cooling block, may be effected by a clamping force arising between the steel armature on the pedestals and the corresponding electromagnet or electro-mechanically controlled permanent magnet of the corresponding cooling blocks. This clamping and sealing causes the o-ring to be compressed into a corresponding groove in the cooling block surface. The resulting seal allows a cooling gas to be flowed through the cooling block to the backside of the pedestal, allowing the supported substrate to be cooled during implantation.

When seated, the bottom of the pedestal is essentially in face-to-face contact with the top of the cooling block, so that these two elements are in thermal communication. The clamping force causes the pedestal to compress the o-ring into an o-ring groove.

The cooling gas seeps into microscopic interstitial gaps between the two flat surfaces of the pedestal and the cooling block. The cooling gas serves to promote heat transfer/thermal communication between these surfaces. The o-ring functions to inhibit the cooling gas from leaking into the vacuum system.

While this particular embodiment shows an apparatus which includes a cooling gas, this is not required by the present invention. In alternative embodiments, the cooling gas could be replaced by, or could also include, a compliant elastomeric pad or film that promotes heat transfer between the pedestal and the platen.

At the conclusion of the step partially depicted in FIG. 36B, the surfaces of the pedestals and substrates are inclined at angles matching the fixed angles A and B of the cooling blocks. The substrate centers are thus disposed substantially perpendicular relative to the scanned beam.

FIG. 36C shows the reverse of the action of FIG. 36B. In particular the electromagnetic clamping force is relaxed between the armature of the pedestal and the electromagnet or an electro-mechanically controlled permanent magnet of the corresponding cooling block of the platen. The platen is lowered, such that the bottom surface of the pedestals disengage from the platen, engage with the sides of the pallet, and ultimately settle within the pallet openings. Again, this engagement may take the form of successive contact with different points on the pallet in order to seat the pedestal kinematically, such that the location of the pedestal/substrate is constrained in a stable and reproducible manner. Such a kinematic coupling can be effected utilizing complementary raised/recessed surfaces positioned at strategic points on the respective engaging elements (pedestal/pallet).

At the conclusion of the step partially shown in FIG. 36C, the surfaces of the pedestals and substrates supported thereon would again substantially planar with each other (as in FIG. 36A), and not inclined relative to the pallet.

Embodiments of the present invention are not limited to the particular embodiment of FIG. 36 or 36A-C. For example, in certain embodiments the attractive clamping force between the pedestal and the platen could arise from the application of other than an electromagnetic force, including but not limited to gravity or an electrostatic force.

And while the particular embodiment of FIGS. 36A-C shows movement of a platen relative to a stationary pallet for purposes of engagement/disengagement, this is not required by the present invention. In alternative embodiments, the pallet could move in a vertical direction relative to the platen, or both the pallet or platen could move in the vertical direction.

Moreover, while the particular embodiment of FIGS. 36A-C show an engaging force (gravity) as being separate from a clamping force (electromagnetic), this is also not required by the present invention. In alternative embodiments, a single force could be employed for both engagement and clamping.

Additional components could also be included in the embodiment of FIGS. 36A-C. For example during scanning of the implant beam, the underlying pallet could be exposed to some of the high energy particles, and this bombardment could result in an increase in the temperature of the pallet. Thus in certain embodiments, the pallet may be configured to be in thermal communication with a cooling mechanism to remove heat. In certain embodiments this cooling mechanism could be solid or liquid element that is in physical contact to draw heat away from the pallet by conduction.

Referring again to FIG. 29, the system 2900 can includes a single raster scanning particle beam 2945 for implanting a plurality of silicon tiles 2910 to form desired cleave region 2915 under each surface region 2912, provided each silicon tile 2910 is individually spatially configured to allow a substantially flexible surface orientation to avoid ion channeling effect. In an specific embodiment, the particle beam 2945 is scanned as a cone-beam from a point source using one or more electromagnetic lens (not shown). With properly selected distance between the point source and the bulk substrate surface 2912, the cone-beam scanning is configured to cover at least 1 meter by 1 meter two-dimensional region that can include a tray of 6×6 156 mm tiles or a tray of 8×8 125 mm tiles. In an alternative embodiment, the particle beam 145 can be scanned as a fan-beam while the tray under the beam can be shifted mechanically. Therefore, the techniques according to embodiments of the present invention can help to manufacture a plurality of free-standing films out of a plurality of silicon tiles substantially using batch system processing that combines both the temperature controlled implantation process and the thermal induced cleaving process.

As energetic ion particles penetrate a solid target material, they lose energy due to collisions with atomic nuclei and electrons in the target materials and ions eventually come to rest. The particles are stopped in a solid by two processes: nuclear and electronic stopping. The dominant stopping mechanism depends on the atomic weight and input energy of the implanted species. In order to fabricate free-standing kerf-loss free monocrystalline thin substrate material (20-150 μm in thickness), high-energy (MeV) range proton beams (e.g., the particle beam 145) are employed to create a defect layer at monocrystalline target such as c-Si, GaN at a predetermined design thickness. The mechanism of the implantation at this higher energy range is dominated by electronic stopping.

Typically axial and planar channeling happens on the low index axes and plane. For crystal silicon, <100>, <110> and <111> are three major axial channeling orientations; {100}, {111}, {110} and {112} are major planar channeling directions.

When the target material irradiated by the incidental particle beam is monocrystalline, the distribution of projected particles is found to be very strongly dependent on the relative orientations of beam and target crystal structure. This effect, as mentioned earlier, is commonly called the "channeling" effect. If the direction of a charge particle incident upon the surface of a crystal lies close to a major crystal direction, the particle will likely suffer a small-angle scattering as it passed through the first plane of atoms in the crystal. If projected particles parallel to a crystal axial, so-called axial channeling could occur. If the project beam parallel to a crystal plane, the particle can also channel in a manner known as planar channeling.

Figure 18B:
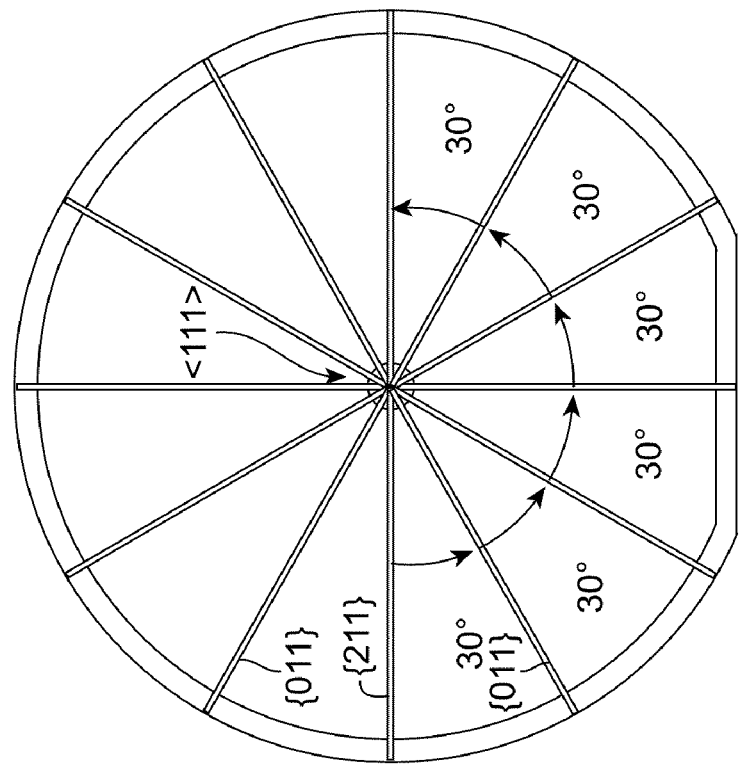
FIGS. 18A-B are perspective and top views of an {111}-orientation wafer showing the major low-index planes.
Figure 18A:
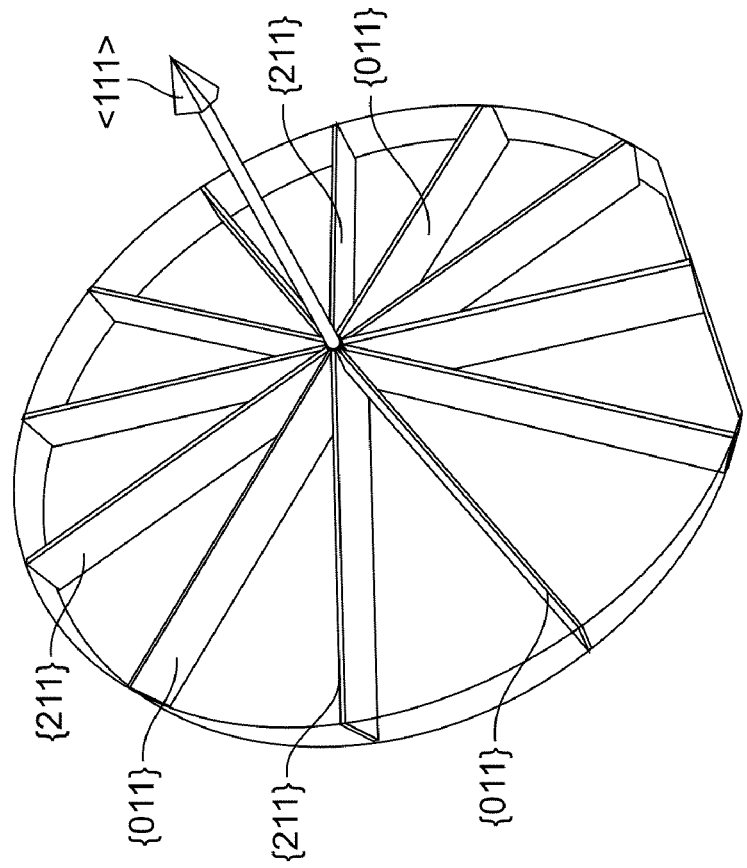

Taking a {111}-orientation wafer as an example, the major low-index planes are shown in FIGS. 18A-B, including low miller index planes {112} and {110}. The axial direction or the surface normal direction is <111>. If a perfect collimated ion beam incidents to the wafer along the <111> direction, a <111> axial channeling can occur and {112} and {110} planar channeling will happen as well. If the beam scans along across the surface, whenever, the beam is parallel to either the {110} or {112} plane, planar channeling will happen. If the film is thin enough (thinner than the ion EOR range), some ions will channel through the film and can be detected. The intensity of the transmitted ions at the ion EOR range will necessarily show a higher intensity at axial and planar channeling regions since the ion irradiation will be stronger at these regions. Because crystal structure, the resulting intensity map will also yield the characteristic star pattern of the crystal planes.

Figure 37A:
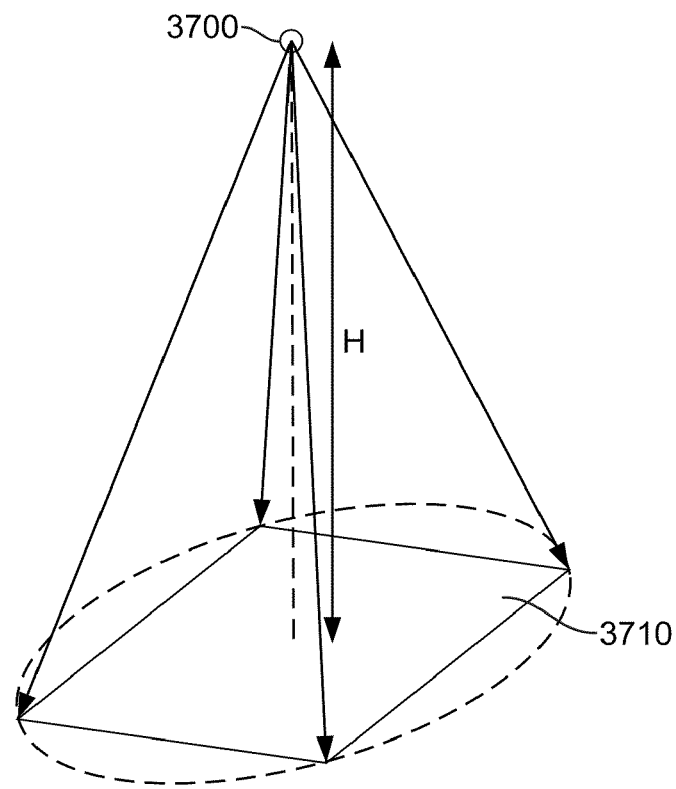
FIG. 37A is a simplified perspective view of a cone-beam irradiation from a point source onto a square shaped substrate according to an embodiment of the invention.
Figure 37B:
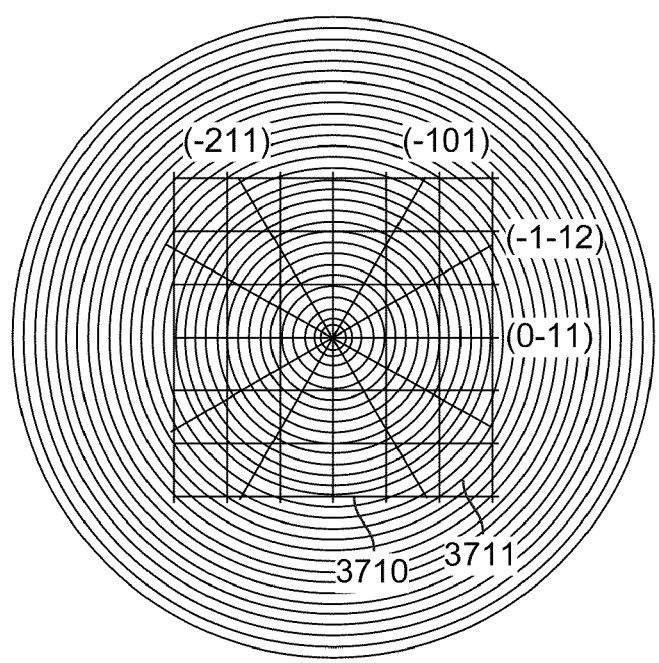
FIG. 37B is a simplified top view of the square shaped substrate comprising a tray of 6×6 substrates irradiated by the cone-beam with planar channeling planes being indicated according to an embodiment of the invention.

In an embodiment of the invention, the incidental particle beam is from a point source 3700 and scanned in a cone-beam to cover a two-dimensional area as shown in FIG. 37A. Depending on the distance H of the point source 3700 and the substrate 3710 as large as 1 meter by 1 meter square shaped area or greater can be fully covered by the scanned cone-beam. In another embodiment, the substrate 3710 comprises a tile tray containing an array of 6×6/156 mm tiles or 8×8/125 mm tiles. If the beam is perpendicular and above the center of the tray, the possible channeling pattern could be a star pattern shown as thick lines in FIG. 37B. In particular each tile here can be a crystal silicon with <111> axis as surface normal. Since the planar channeling yield is strongly dependent on the interplanar distance, {112} planar channeling is much weaker than that of {011} plane. Therefore the intensity and width of the line will be different. For crystal silicon with <100> surface normal, the channeling will yield a different star pattern with 45 angular spacing.

According to embodiments of the current invention, the ion channeling effect can be substantially avoided or effective averaged out during the implantation process performed in the system 2900 (FIG. 29) with spatially configured substrates. In an example, the implantation process is carried out with substrate temperature under control. As the temperature of the whole substrate is properly raised, for example greater than 600 K, the crystalline atomic networks vibrate more so that the ion channeling is effectively reduced.

In another example, the spatially configured substrate can be properly utilized to reduce or even avoid channeling effect. As described throughout the specification (and as illustrated in FIG. 30 through FIG. 36), 36 bulk substrates or tiles can be arranged into a 6×6 tray. Each tile is independently configured to be clamped and adjustable in tilting angle between the surface normal and the incidental particle beam. FIG. 22A is a perspective view of a particle beam with a tilt angle θ relative to surface normal and a twist angle φ relative to x-axis or <0-11> direction. The particle beam is irradiated onto one quadrant tray of the 6×6 tiles according to an embodiment of the invention. FIG. 22B is a top view of the FIG. 22A, illustrating several planar channeling planes with twist angle Φ=0, 30, 60, and 90 degrees, provided that each tile numbered from 1 through 9 has a surface at {111} crystal plane. In a specific embodiment, the central axis height (H) of the ion implantation system is about 3 meters. The tray has a total length L~1 m for 6 tiles. The beam and tile relative positions can be characterized by (Δ, Φ) and calculated θ and Φ. When both angles θ and Φ are 0°, the #1 in FIG. 22B has the worst ion channeling region, including the major <111> axial channeling as well as major {011} and {211} planar channeling. There are no channeling at the location of tile #9. Tile #4, 2, 8, and 6 are subjected to some degrees of planar channeling. Tile #3 and 7 are subjected to minor planar channeling at the edge. Additionally {211} channeling usually is rather weak so that only tile #1, 4, 5, and 8 will have channeling issues.

According to the embodiments of the current invention, each tile is clamped through a clamp device on a pedestal that fits into one of open frames within the 6×6 matrix tray. Each tile is configured to be adjusted its surface orientation relative to the scanned cone-beam from the ion implantation system. Effectively, each tile can have a substantially same spatial relationship between its surface and the incidental cone-beam. Therefore, the channeling issue for the whole sets (6×6) of tiles on the tray is turned to an issue of each tile.

Figure 38:
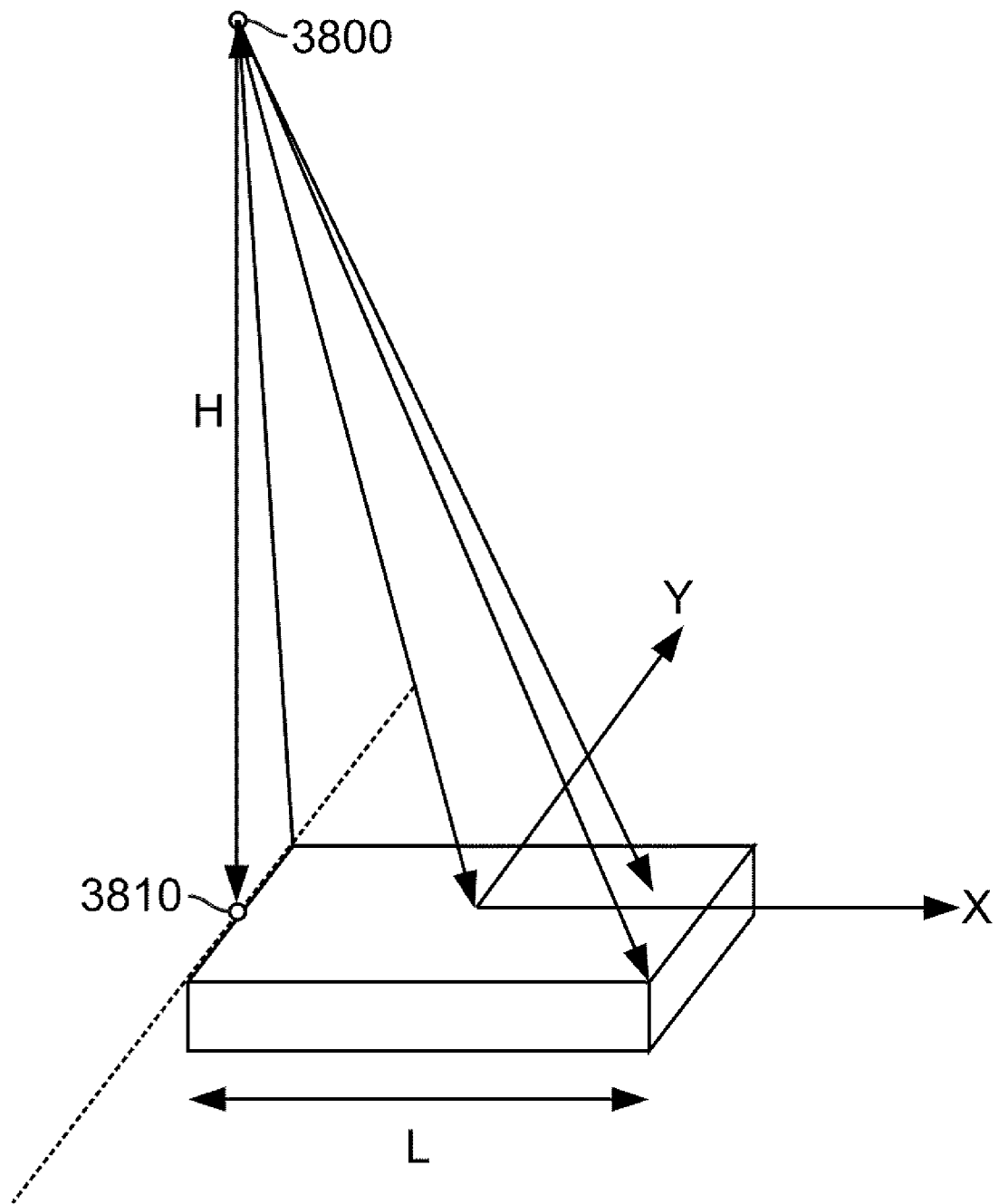
FIG. 38 is a schematic diagram illustrating a substrate tilted relative to the incident beam so the axial channeling spot is shifted to edge of the substrate according to an embodiment of the invention.

In an embodiment, each tile can be tilt properly to reduce or even avoid the channeling effect. For example, FIG. 38 shows that a tile is tilted it surface normal relative to the incidental beam so the axial channeling spot 3810 (occurring when incidental beam is aligned with the surface normal) is shifted to an edge of the tile according to an embodiment of the invention. The minimum tilt angle required to avoid axial channeling spot 3810 is L/2H. For a point ion source at a distance H about 3 meters away from the tile and a tile length L=156 mm, the required tilt angle is about 1.5°. While further tilting of the tile, to about 3.2° and greater, can make the tile free of planar channeling too. Of course, tilting of each tile within the 6×6 tray will take into accounts of all other tiles due to the mechanical arrangements therein.

In an alternative embodiment, each mono-crystalline substrate can be fabricated to have crystal miscut by an angle to achieve the similar effect of avoiding ion channeling. A crystal miscut can also be characterized by two angles: firstly, a miscut angle Δθ, the angle between surface normal direction and main crystal plane normal direction; secondly, a miscut direction angle Φ [here we define the angle from (0-11) normal plane]. FIGS. 20A and 20B are schematic cross sectional views of (0-11) plane of an (111) tile respectively with and without surface miscut angle Δθ irradiated by a scanned beam. As we know to avoid one tile axial channeling, the tile angle requires Δθ=±1.5°. If all the tiles are arranged to have its center location perpendicular to the beam source, the channeling issue will be an one-tile channeling issue. Considering the case with miscut angle Δθ, to avoid any incident beam line parallel to the crystal lines, the criteria is: 90°-arctan(x/H)+Δθ≠90°.

As described throughout the specification (and as illustrated in FIG. 30 through FIG. 36), 36 bulk substrates or tiles can be arranged into a 6×6 tray. Each tile is independently configured to adjust its tilting angle of the surface normal relative to the incidental particle beam direction, at least including a tilt angle and a twist angle for pseudo-square shaped tile. Additionally, each tile can be pre-fabricated with a desired miscut angle so that its axial channeling spot has been shifted away from the surface area. These options can be easily combined with the system 2900 as described in its spatially configured substrate arrangement. Furthermore, the whole tray of tiles or each individual tile can be slowly dithered to average out the remaining planar channeling effect after using tilting and/or miscut approach. The dithering motion can be a random motion, a linear motion, a rotation, a tilt plus twist motion, etc, depending on embodiments. Further detail on the tray or tile dithering design to prevent channeling can be found in a U.S. patent application commonly assigned.

Figure 39:
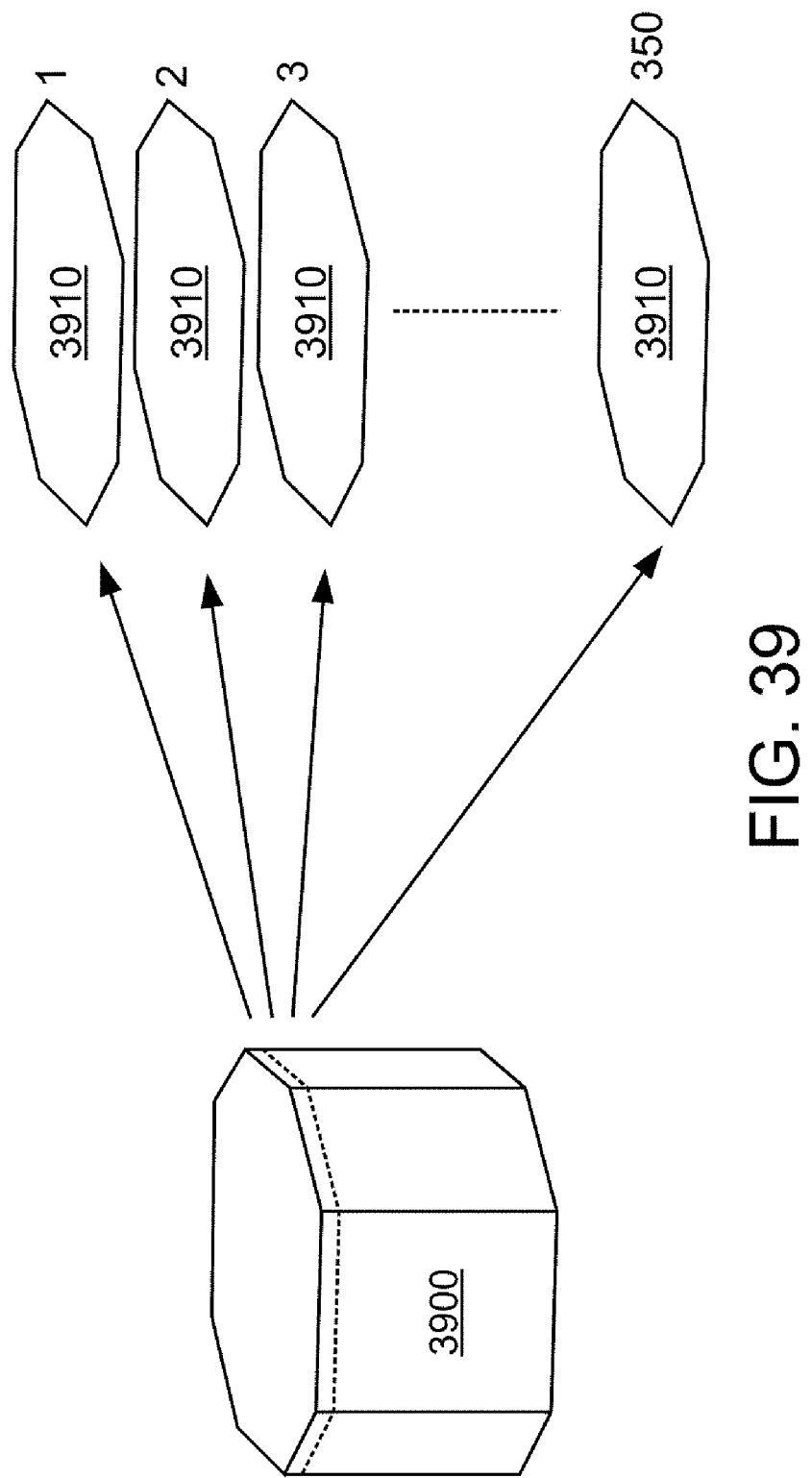
FIG. 39 shows a simplified view of a plurality of free standing thick films being removed from a bulk substrate in accordance with an embodiment of the present invention.

FIG. 39 shows a simplified view of a plurality of free-standing thick films being removed from a bulk substrate in accordance with an embodiment of the present invention. Single crystal silicon tile 3900 exhibits an original thickness of 5 cm (referring to thickness 2911 in FIG. 29) and has lateral dimensions of 156 mm×156 mm. As the density of single crystal silicon is about 2.32 gm/cm$^3$, the weight of this bulk single crystal silicon material is 15×15×5×2.32=2.61 Kg. Thus, cleavage of about 70% of the thickness of such tile 1000 utilizing techniques according to embodiments of the present invention, produces 350 free-standing single crystal silicon films 3910, each having a thickness of about 100 μm. As 1 m$^2$ represents about 45 tile surfaces having an area of 156 mm×156 mm, a total silicon surface area of about 7.8 m$^2$ can be produced from 70% of a 5 cm thick tile. The remaining 30% of the ingot not cleaved to form single crystal silicon, can be returned to the melt as highly purified starting material to produce a fresh ingot for cleaving.

Implantation of an accelerated particle beam into an exposed surface of a bulk substrate according to embodiments of the present invention may be performed for any one of a variety of purposes. One purpose is to create a cleave region in the bulk substrate, along which a thin film of material may be separated from the bulk substrate utilizing a controlled cleaving process. Such a controlled cleaving process is described more fully in U.S. Pat. No. 6,013,563 incorporated by reference in its entirety herein for all purposes.

The following describe various aspects of embodiments in accordance with the present invention.

According to an embodiment, a method for fabricating a thickness of material includes providing a substrate having a surface region and a thickness, generating a beam of accelerated particles, scanning the beam in two dimensions over the surface region to form a cleave region beneath the surface region defining a thickness of material to be detached. During the scanning, the method includes subjecting the substrate to a dithering motion. The method also includes freeing the thickness of detachable material using a controlled cleaving process.

In a specific embodiment of the above method, the dithering motion alters an angle at which the particles impact the substrate, thereby distributing channeling over the substrate.

In another embodiment, the dithering motion comprises tilting the substrate in two dimensions.

In another embodiment, the dithering motion comprises tilting the substrate in a first dimension.

In another embodiment, the above method also includes offsetting a lattice of the substrate relative to the beam by a constant angle in a second dimension.

In another embodiment, the surface region is substantially normal to the beam and the lattice is offset by a miscut.

In another embodiment, the lattice is offset by inclining the surface region relative to the beam.

In another embodiment, providing the substrate comprises providing a miscut substrate.

In another embodiment, the accelerated particles comprise hydrogen species, helium species, or a combination of hydrogen and helium species.

In another embodiment, the hydrogen species are provided at a dose of $2\times10^{16}$ per $cm^2$ and less.

In another embodiment, the particles are provided in an energy ranging from 0.5 MeV to 12 MeV.

In another embodiment, the thickness of detachable material has a thickness of between about 50-100 um.

In another embodiment, a total thickness variation (TTV) of the thickness of detachable material is between about 0.1-5%.

According to another embodiment, an apparatus includes a particle accelerator comprising an ion source and a transport section configured to output an accelerated particle beam, a scanning device configured to scan the accelerated particle beam in two dimensions, and a scanning stage configured to support a substrate in a vacuum with a surface region of the substrate exposed to the scanned accelerated particle beam. The scanning stage is configured to impart a dithering motion to the substrate during the exposure.

In an embodiment of the above apparatus, the scanning stage is configured to impart the dithering motion in two dimensions.

In another embodiment, the scanning stage comprises a first push rod in mechanical communication with a first side of a substrate support, and a second push rod in mechanical communication with a second side of the substrate support.

In another embodiment, the substrate support is configured to support multiple substrates.

In another embodiment, the substrate support is configured to separately dither the multiple substrates.

In another embodiment, the scanning stage is configured to impart the dithering motion in a first dimension.

In another embodiment, the scanning stage is configured to offset a surface of the substrate relative to the beam at a constant angle in a second dimension.

In another embodiment, the scanning stage comprises a push rod in mechanical communication with a first side of a substrate support.

In another embodiment, the substrate support is configured to support multiple substrates.

In another embodiment, the particle accelerator comprises a DC particle accelerator.

According to another embodiment, a system for manufacturing a free-standing film from a bulk substrate includes a pedestal configured to receive a bottom surface of a bulk substrate having an exposed top surface, a platen disposed on a mechanical base and configured to secure the pedestal utilizing a clamp device, an implant subsystem configured to introduce a particle beam into the exposed top surface, and a controller coupled at least to the implant subsystem and to the clamp device. The controller is configured to send one or more automation signals to spatially adjust a position of the pedestal relative to the implant subsystem, to ensure a desired orientation of the top surface relative to the particle beam during an implantation process.

In an embodiment of the above system, the platen comprises one or more grooves and a perimeter seal, a plurality of embedded channels, and a center structure associated with the clamp device.

In another embodiment, the platen further comprises an overlying pad for enhancing thermal contact between the platen and the pedestal.

In another embodiment, the plurality of embedded channels are used for delivering fluidic coolant material.

In another embodiment, the one or more grooves are used to distribute a backside gas in a thin volume of space between the platen and the clamped pedestal sealed by the perimeter seal.

In another embodiment, the backside gas comprises nitrogen gas.

In another embodiment, the clamp device comprises a mechanical clamp.

In another embodiment, the clamp device comprises an electromagnetic clamp.

In another embodiment, the mechanical base, in response to the automation signal, is further configured to adjust the platen through one or more mechanical operations selected from lifting the platen away from the mechanical base, rotating the platen, imparting a dithering motion to the platen, tilting the platen, and shuffling a position of the platen relative to another platen.

In another embodiment, the above system further includes a plurality of other platens, each of the plurality of other platens being substantially the same as the platen in structure and configured to secure another pedestal.

In another embodiment, the plurality of other platens are arranged on the mechanical base in a 6×6 matrix configuration.

In another embodiment, each of the plurality of other platens is clamped through an open grid unit of an open frame pallet, the corresponding platen being secured to a corresponding pedestal supporting a bulk substrate substantially similar to the bulk substrate.

In another embodiment, the open frame pallet comprises 36 open grid units arranged in 6×6 matrix configuration for fitting the 36 pedestals respectively.

In another embodiment, each of the platens is able to be spatially configured relative to the particle beam in response to the automation signal.

In another embodiment, the plurality of other platens and the platen comprises a total of 64 platens arranged on the mechanical base in an 8×8 matrix configuration mating with an open frame pallet with an 8×8 matrix open grid units.

In another embodiment, each of the 64 platens is individually spatially-configurable relative to the particle beam in response to at least one of the automation signal.

In another embodiment, the bulk substrate comprises single crystalline silicon tile having a truncated square sectional shape in a 156 mm×156 mm or a 125 mm×125 mm size.

In another embodiment, the implant subsystem comprises a linear accelerator for accelerating the particle beam to an energy level ranging from 1 MeV to 5 MeV.

In another embodiment, the implant subsystem comprises a cyclotron accelerator accelerating the particle beam to an energy level ranging from 1 MeV to 5 MeV.

In another embodiment, the implant subsystem comprises an electrostatic accelerator accelerating the particle beam to an energy level ranging from 1 MeV to 5 MeV.

In another embodiment, the particle beam comprises hydrogen species, or deuterium species, or helium species.

In another embodiment, the implant subsystem further comprises a scanning device configured to raster scan the particle beam over an area of 1.5 m×1.5 m or greater.

In another embodiment, the controller comprises an electronic circuit capable of handling signal input/output and performing multiple control tasks and process operations managed by a computer system for executing one or more control codes.

In another embodiment, the suitable orientation comprises ensuring a relative incident angle between the particle beam and the exposed top surface to reduce a channeling effect.

In another embodiment, the above system also includes one or more thermal radiation sources in thermal communication with the exposed top surface.

In another embodiment, the above system also includes a sensing subsystem coupled respectively to the implant subsystem, the one or more thermal radiation sources, the platen, and the bulk substrate, and configured to collect physical state information about the bulk substrate, and configured to deliver one or more sensor data associated with the physical state information to the controller.

According to yet another embodiment, a method for manufacturing a free-standing film from a bulk substrate includes providing a pedestal bonded to a bottom surface of a bulk substrate having an exposed top surface, providing a platen disposed on a mechanical base, clamping the pedestal to the platen with a clamp device, causing a particle accelerator to introduce a particle beam into the exposed top surface to form a cleave region, and performing a controlled cleaving process along the cleave region to separate a film of material from the bulk substrate.

In an embodiment of the above system, the platen comprises one or more grooves and a perimeter seal, a plurality of embedded channels, and a center structure associated with the clamp device, the method further comprising delivering fluidic coolant material through the embedded channels.

In another embodiment, the one or more grooves are used to distribute a backside gas in a thin volume of space between the platen and the clamped pedestal sealed by the perimeter seal.

In another embodiment, the pedestal is clamped to the platen utilizing a mechanical clamp device.

In another embodiment, the pedestal is clamped to the platen utilizing an electrostatic clamp device.

In another embodiment, the pedestal is clamped to the platen utilizing a vacuum clamp device.

In another embodiment, during the introduction of the particle beam into the surface of the bulk substrate, causing the mechanical base to adjust the platen through one or more mechanical operations selected from lifting the platen away from the mechanical base, rotating the platen, imparting a dithering motion to the platen, tilting the platen, and shuffling the platen with another platen.

In another embodiment, the mechanical base is configured to provide a relative incident angle between the particle beam and the top surface to reduce ion channeling effects.

In another embodiment providing a plurality of additional pedestals bonded to respective bulk substrates, providing a plurality of additional platens, clamping to each of the additional platens one of a respective plurality of additional pedestals, and introducing a particle beam into the exposed top surfaces of the additional bulk substrates to form cleave regions.

In another embodiment, each of the plurality of other platens is clamped with the corresponding additional pedestal through an open grid unit of an open frame pallet.

In another embodiment, the particle beam has an energy level ranging from about 1 MeV to 5 MeV.

In another embodiment, the particle beam comprises hydrogen species, or deuterium species, or helium species.

In another embodiment, introduction of the particle beam comprises scanning the particle beam over an area of 1.5 m×1.5 m or greater.

In another embodiment, the above method also includes applying thermal energy to the bulk substrate from a source other than the particle beam.

In another embodiment, the above method also includes collecting and delivering to the controller, information regarding a physical state of the bulk substrate.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions or deuterium and hydrogen ions to allow for formation of the cleave plane with a modified dose and/or cleaving properties according to alternative embodiments. Still further, the particles can be introduced by a diffusion process rather than an implantation process. Of course there can be other variations, modifications, and alternatives. Therefore, the above description and illustrations should not be taken as limiting the scope of the present invention which is defined by the appended claims.

What is claimed is:

1. A method comprising:
providing a substrate having a surface region and a thickness;
generating a beam of accelerated particles;
scanning the beam in two dimensions over the surface region to form a cleave region beneath the surface region and defining a thickness of material to be detached;
during the scanning, moving the substrate to alter an effective angle between the beam and a plane of the surface of the substrate; and
freeing the thickness of material to be detached from the substrate using a controlled cleaving process.

2. The method of claim 1 wherein the moving alters an angle at which the particles impact the substrate, thereby distributing channeling over the substrate.

3. The method of claim 1 wherein the moving comprises tilting the substrate around a first axis.

4. The method of claim 3 wherein the moving further comprises tilting the substrate along a second axis.

5. The method of claim 3 further comprising offsetting a lattice of the substrate relative to the beam by a constant angle.

6. The method of claim 5 wherein the offsetting occurs around an axis different from the first axis.

7. The method of claim 5 wherein the lattice is offset by a miscut.

8. The method of claim 5 wherein the lattice is offset by inclining the surface region relative to the beam.

9. The method of claim 1 wherein the accelerated particles comprise hydrogen species, helium species, or a combination of hydrogen and helium species.

10. The method of claim 1 wherein the thickness of material to be detached is between about 10-200 um.

11. A method for manufacturing a free-standing film from a bulk substrate, the method comprising:
providing a pedestal bonded to a bottom surface of a bulk substrate having an exposed top surface;
providing a platen moveably disposed relative to a mechanical element;
clamping the pedestal to the platen with a clamp device;
causing a particle accelerator to introduce a particle beam into the exposed top surface to form a cleave region; and performing a controlled cleaving process along the cleave region to separate a film of material from the bulk substrate.

12. The method of claim 11 wherein the pedestal is clamped to the platen utilizing a magnetic clamp device.

13. The method of claim 11 further comprising, during the introduction of the particle beam into the surface of the bulk substrate, causing the mechanical element to impart a dithering motion to the platen.

14. The method of claim 11 wherein the mechanical element is configured to provide a relative incident angle between the particle beam and the top surface to reduce ion channeling effects.

15. The method of claim 11 wherein the particle beam has an energy level ranging from about 0.5 MeV to 5 MeV.

16. The method of claim 11 wherein the particle beam comprises hydrogen species, or deuterium species, or helium species.

17. The method of claim 11 wherein the platen is provided with an upper surface inclined at an angle relative to the particle beam, the method further comprising causing the platen to engage with the pedestal such that the top surface of the bulk substrate is also inclined at the angle.

18. The method of claim 17 wherein the platen engages with the pedestal in a kinematic manner.

19. The method of claim 11 further seating the pedestal within an open frame pallet prior to engagement of the pedestal and the plate.

20. A method of fabricating a photovoltaic cell, the method comprising:
providing a plurality of semiconductor substrates, each semiconductor substrate including an exposed surface and a lattice comprising a plurality of primary crystal planes;
scanning a beam of accelerated particles in a fan shape over the plurality of substrates at a range of angles relative to the exposed surfaces, such that at points of impingement of the beam on the exposed surfaces, the plurality of primary crystal planes are misaligned with the beam;
forming a thickness of semiconductor material by cleaving the semiconductor substrate along a cleave region resulting from implantation of the accelerated particles; and
incorporating the thickness of material into a photovoltaic cell.

21. The method of claim 20 wherein:
at the points of impingement, the exposed surfaces are oriented substantially perpendicular to the beam; and
the exposed surfaces are miscut relative to the primary crystal planes.

22. The method of claim 21 further comprising subjecting the plurality of substrates to a dithering motion during the scanning of the beam.

23. The method of claim 20 wherein:
at the points of impingement, the plurality of primary crystal planes are misaligned with the beam due at least in part to an inclination of the exposed surfaces relative to the beam.

24. The method of claim 23 wherein the inclination of the exposed surface results from a fixed tilting of the plurality of substrates.

25. The method of claim 24 wherein the inclination of the exposed surface also results from a dithering motion during the scanning of the beam.

26. The method of claim 23 wherein the inclination of the exposed surface results from a dithering motion of the plurality of substrates during the scanning of the beam.

27. The method of claim 26 wherein a timing of the dithering motion is coordinated with a timing of the scanning to misalign the plurality of primary crystal planes from the beam.

* * * * *